(12) United States Patent
Nakagawa et al.

(10) Patent No.: US 10,262,740 B2
(45) Date of Patent: Apr. 16, 2019

(54) SEMICONDUCTOR MEMORY DEVICE

(71) Applicant: Toshiba Memory Corporation, Tokyo (JP)

(72) Inventors: Tomoki Nakagawa, Yokohama Kanagawa (JP); Koji Hosono, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/889,119

(22) Filed: Feb. 5, 2018

(65) Prior Publication Data
US 2018/0277220 A1 Sep. 27, 2018

(30) Foreign Application Priority Data

Mar. 22, 2017 (JP) ................. 2017-056009

(51) Int. Cl.
*G11C 16/10* (2006.01)
*G11C 16/04* (2006.01)
*G11C 16/24* (2006.01)
*G11C 16/34* (2006.01)
*G11C 16/28* (2006.01)

(52) U.S. Cl.
CPC .......... *G11C 16/10* (2013.01); *G11C 16/0483* (2013.01); *G11C 16/24* (2013.01); *G11C 16/3459* (2013.01); *G11C 16/28* (2013.01)

(58) Field of Classification Search
CPC ............ G11C 16/0483; G11C 16/3459; G11C 11/5628; G11C 16/08; G11C 16/26; G11C 16/16; G11C 16/14; G11C 16/24
See application file for complete search history.

(56) References Cited

U.S. PATENT DOCUMENTS

| 8,570,802 | B2 | 10/2013 | Shirakawa | |
|---|---|---|---|---|
| 2005/0169057 | A1* | 8/2005 | Shibata | G11C 11/5628 365/185.28 |
| 2006/0114720 | A1* | 6/2006 | Shibata | G11C 11/5628 365/185.17 |

(Continued)

OTHER PUBLICATIONS

Office Action dated Apr. 16, 2018 in corresponding Taiwanese Patent Application No. 106123914 with English translation, 11 pages.

*Primary Examiner* — Hien Nguyen
(74) *Attorney, Agent, or Firm* — Kim & Stewart LLP

(57) ABSTRACT

A semiconductor memory device includes memory cell transistors, a word line connected to the plurality of memory cell transistors, bit lines that are respectively connected to the memory cell transistors, and a control circuit. The control circuit carries out a write operation on the memory cell transistors connected to the word line by performing, in sequence, a first loop of operations, including a first program operation followed by at least one verification operation, that are carried out until all memory cell transistors targeted by the first program operation have passed the at least one verification operation, a second loop of operations, including a second program operation and no verification operation, that are carried out for a fixed number of loops and a third loop of operations, including a third program operation and no verification operation, that are carried out for a fixed number of loops.

20 Claims, 74 Drawing Sheets

(56) References Cited

U.S. PATENT DOCUMENTS

| | | | |
|---|---|---|---|
| 2012/0297273 A1* | 11/2012 | Sakaue | G06F 11/1048 |
| | | | 714/773 |
| 2014/0254242 A1* | 9/2014 | Siau | G11C 13/0026 |
| | | | 365/148 |
| 2015/0078093 A1 | 3/2015 | Hahn et al. | |
| 2016/0260484 A1 | 9/2016 | Lim et al. | |
| 2016/0343444 A1* | 11/2016 | Park | G11C 16/14 |
| 2017/0178739 A1* | 6/2017 | Maejima | G11C 11/5628 |
| 2018/0090220 A1* | 3/2018 | Minagawa | G11C 16/08 |
| 2018/0240515 A1* | 8/2018 | Shibata | G06F 13/16 |

\* cited by examiner

FIG. 22

| INVA | INVB | GROUP |
|---|---|---|
| H | H | FIRST GROUP (REGION 1) |
| L | H | SECOND GROUP (REGION 2) |
| L | L | THIRD GROUP (REGION 3) |

SEMICONDUCTOR MEMORY DEVICE

CROSS-REFERENCE TO RELATED APPLICATION

This application is based upon and claims the benefit of priority from Japanese Patent Application No. 2017-056009, filed Mar. 22, 2017, the entire contents of which are incorporated herein by reference.

FIELD

Embodiments described herein relate generally to a semiconductor memory device.

BACKGROUND

There is a NAND type flash memory in which memory cells are arranged in a three-dimensional manner.

DESCRIPTION OF THE DRAWINGS

FIG. 22 is a diagram illustrating a method of determining a group of the semiconductor memory device according to a modification example of the first embodiment.

DETAILED DESCRIPTION

Figure 1:
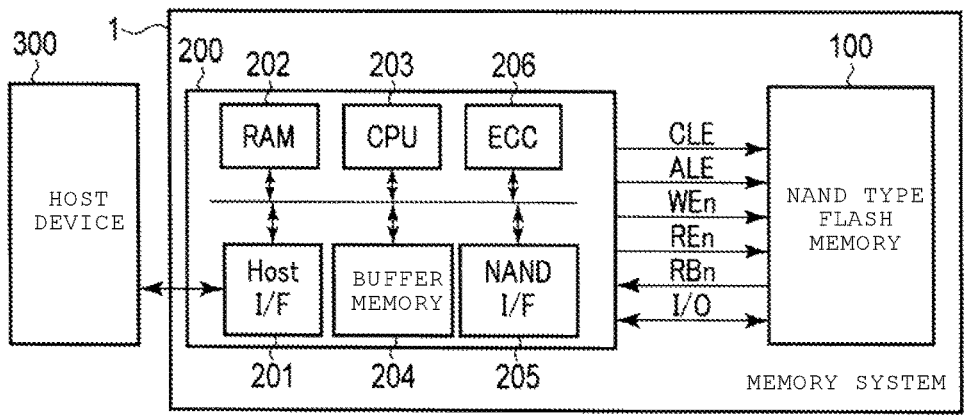
FIG. 1 is a block diagram of a memory system.

In general, according to one embodiment, there is provided a semiconductor memory device including a plurality of memory cell transistors, a word line that is connected to the plurality of memory cell transistors, a plurality of bit lines that are respectively connected to the plurality of memory cell transistors, and a control circuit. The control circuit carries out a write operation on the memory cell transistors connected to the word line by performing, in sequence, a first loop of operations, including a first program operation followed by at least one verification operation, that are carried out until all memory cell transistors targeted by the first program operation have passed the at least one verification operation, a second loop of operations, including a second program operation and no verification operation, that are carried out for a fixed number of loops and a third loop of operations, including a third program operation and no verification operation, that are carried out for a fixed number of loops.

Hereinafter, embodiments will be described with reference to the drawings. In the description, similar reference numerals are given to similar elements throughout all the drawings. Hereinafter, a three-dimensional stacked NAND type flash memory in which a plurality of memory cell transistors are stacked over a semiconductor substrate will be described as an example of the semiconductor memory device.

1. First Embodiment

A description will be made of a semiconductor memory device according to a first embodiment.

1-1. Configuration

1-1-1. Memory System

First, with reference to FIG. 1, a description will be made of a configuration of a memory system including the semiconductor memory device according to the first embodiment.

As illustrated in FIG. 1, a memory system 1 includes a NAND type flash memory (semiconductor memory device) 100 and a memory controller 200. A combination of the memory controller 200 and the NAND type flash memory 100 may form a single semiconductor device, for example, a memory card such as an SD™ card, or a solid state drive (SSD). The memory system 1 may further include a host device 300.

The NAND type flash memory 100 includes a plurality of memory cell transistors, and stores data in a nonvolatile manner. Details of a configuration of the NAND type flash memory 100 will be described later.

In response to commands from the host device 300, the memory controller 200 gives commands for reading, writing, erasing, or the like to the NAND type flash memory 100.

The memory controller 200 includes a host interface circuit (host I/F) 201, an internal memory (random access memory (RAM)) 202, a processor (central processing unit (CPU)) 203, a buffer memory 204, a NAND interface circuit (NAND I/F) 205, an error correction circuit (ECC circuit or ECC) 206.

The host interface circuit 201 is connected to the host device 300 via a controller bus, and relays communication between the memory controller 200 and the host device 300. The host interface circuit 201 transmits a command and data which are received from the host device 300, to the CPU 203 and the buffer memory 204, respectively. The host interface circuit 201 transmits the data in the buffer memory 204 to the host device 300 in response to a command from the CPU 203.

The NAND interface circuit 205 is connected to the NAND type flash memory 100 via a NAND bus. The NAND interface circuit 205 enables communication between the NAND type flash memory 100 and the memory controller 200. The NAND interface circuit 205 transmits a command received from the CPU 203, to the NAND type flash memory 100. The NAND interface circuit 205 transmits write data in the buffer memory 204 to the NAND type flash memory 100 during writing of data. The NAND interface circuit 205 transmits data read from the NAND type flash memory 100 to the buffer memory 204 during reading of data.

The NAND bus is used to transmit and receive signals conforming to a NAND interface standard. Specific examples of the signals are a command latch enable signal CLE, an address latch enable signal ALE, a write enable signal WEn, a read enable signal REn, a ready/busy signal RBn, and an input/output signal I/O.

The signals CLE and ALE are signals for notifying the NAND type flash memory 100 that input signals I/O to the NAND type flash memory 100 are respectively a command and an address. The signal WEn is asserted at a "low (L)" level, and enables the signal I/O to be input into the NAND type flash memory 100. The term "assert" indicates that a signal (or logic) is in a valid (active) state. In contrast, the term "negate" indicates that a signal (or logic) is in an invalid (inactive) state. The signal REn is also asserted at an "L" level, and enables the signal I/O to be output from the NAND type flash memory 100. The ready/busy signal RBn indicates whether the NAND type flash memory 100 is in a ready state (a state of being capable of receiving a command from the memory controller 200) or a busy state (a state of being incapable of receiving a command from the memory controller 200), and an "L" level thereof indicates a busy state. The input/output signal I/O is, for example, an 8-bit signal. The input/output signal I/O contains data which is transmitted and received between the NAND type flash memory 100 and the memory controller 200, such as a command, an address, write data, and read data.

The CPU 203 controls the entire operation of the memory controller 200. For example, if a writing command is received from the host device 300, the CPU 203 issues a writing command based on the NAND interface circuit 205. This is also the same for reading and erasing. The CPU 203 performs various processes for managing the NAND type flash memory 100, such as wear leveling. The CPU 203 performs various calculations such as a data encryption process or randomizing process. As described above, also in a case where the host device 300 is provided in the memory system 1, the CPU 203 controls an operation of the entire memory system 1.

The ECC circuit 206 performs data error checking and correcting (ECC) processes. For example, the ECC circuit 206 generates parity on the basis of write data during writing of data. The ECC circuit 206 generates syndrome from the parity during reading of data, so as to detect an error, and corrects the error. The CPU 203 may perform the function of the ECC circuit 206.

The internal memory 202 is a semiconductor memory such as a DRAM, and is used as a work area of the CPU 203. The internal memory 202 stores, for example, firmware for managing the NAND type flash memory 100 or various management tables.

1-1-2. NAND Type Flash Memory

Next, with reference to FIG. 2, a description will be made of a configuration of the NAND type flash memory 100.

Figure 2:
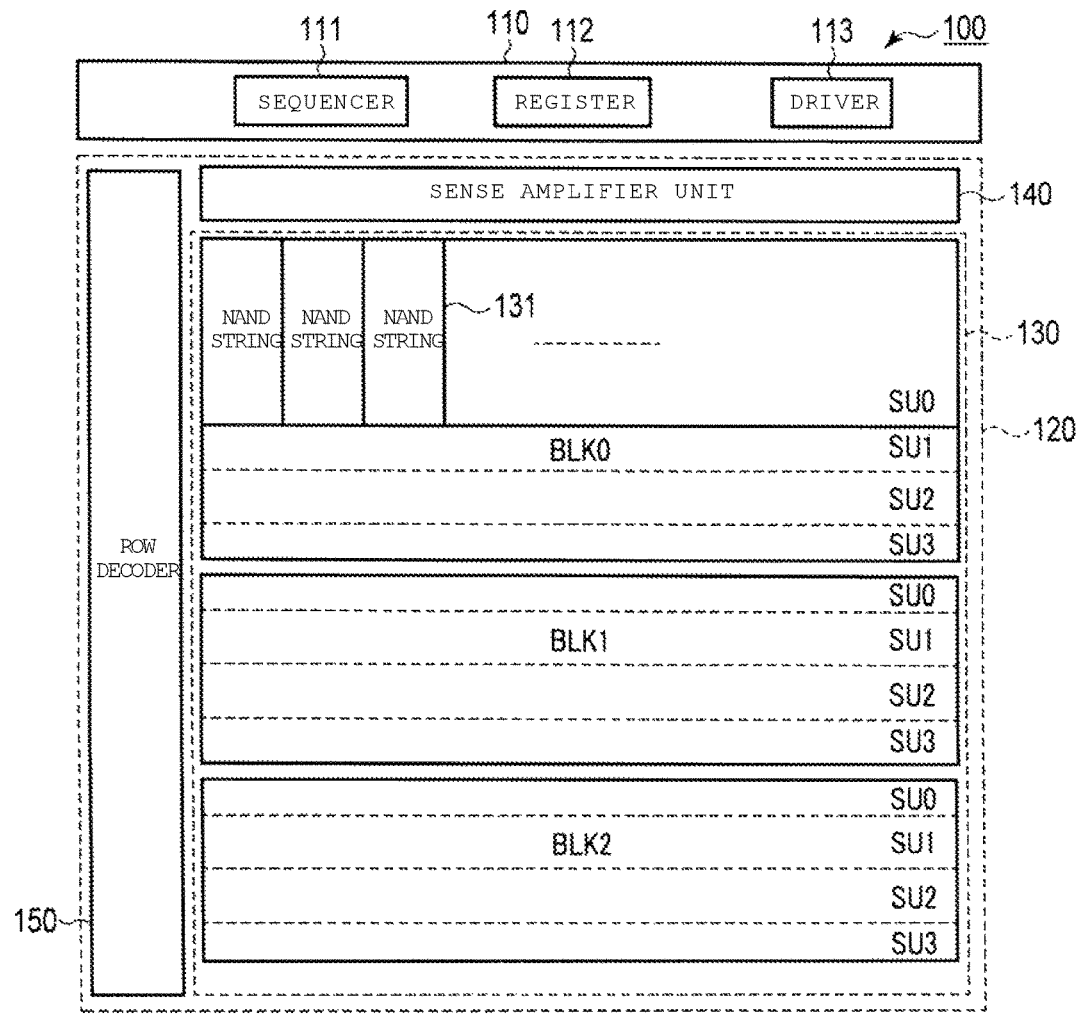
FIG. 2 is a block diagram of a NAND type flash memory.

As illustrated in FIG. 2, the NAND type flash memory 100 includes peripheral circuits 110 and a core circuit 120.

The core circuit 120 includes a memory cell array 130, a sense amplifier unit 140, and a row decoder 150.

The memory cell array 130 includes a plurality of nonvolatile memory cell transistors (also simply referred to as memory cells), and each of the plurality of nonvolatile memory cell transistors is associated with a word line and a bit line. The memory cell array 130 includes a plurality of (in the example of FIG. 2, three) blocks BLK (BLK0, BLK1, and BLK2), and each block includes a plurality of nonvolatile memory cell transistors.

Erasing of data may be performed in a unit of the block BLK or a unit smaller than the block BLK, such as disclosed in, for example, U.S. patent application Ser. No. 13/235,389, filed on Sep. 18, 2011, entitled "NONVOLATILE SEMICONDUCTOR MEMORY DEVICE," U.S. patent application Ser. No. 12/694,690, filed on Jan. 27, 2010, entitled "NON-VOLATILE SEMICONDUCTOR STORAGE DEVICE," and U.S. patent application Ser. No. 13/483,610, filed on May 30, 2012, entitled "NONVOLATILE SEMICONDUCTOR MEMORY DEVICE AND DATA ERASE METHOD THEREOF." The entire contents of these patent applications are incorporated by reference in the present application.

Each block BLK includes a plurality of (in the example illustrated in FIG. 2, four) string units SU (SU0, SU1, SU2, and SU3) which are sets of NAND strings 131 in which the memory cell transistors are connected in series to each other. Of course, the number of blocks in the memory cell array 130 or the number of string units in a single block BLK is arbitrary. A physical position of a block in the memory cell array 130 is indicated by a block address.

The row decoder 150 causes a block corresponding to a block address to go into a selected state, and causes a word line of the selected block to go into a desired voltage state.

The sense amplifier unit 140 senses data which is read from a memory cell transistor to a bit line during reading of data.

The peripheral circuits 110 include a control circuit (referred to herein as a sequencer 111), a register 112, and a driver 113.

The sequencer 111 controls the entire operation of the NAND type flash memory 100.

The register 112 stores various signals. For example, the register 112 stores a status of a data writing or erasing operation, and thus notifies the controller whether or not the operation is normally completed. The register 112 may store various tables.

The driver 113 supplies voltages required to write, read, and erase data, to the row decoder 150, the sense amplifier unit 140, and a source line driver (not illustrated).

1-1-3. Memory Cell Array

Figure 3:
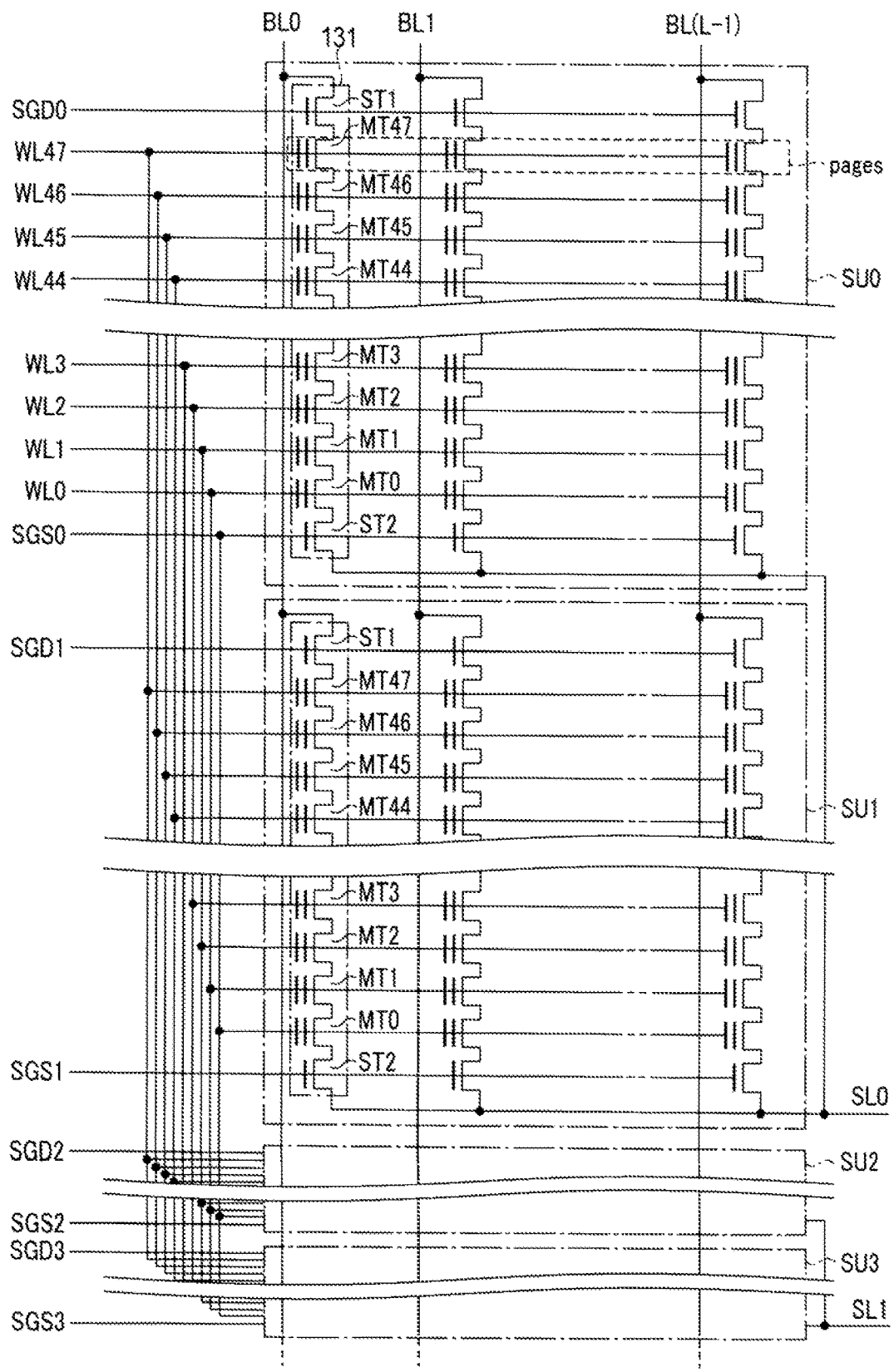
FIG. 3 is a circuit diagram of a memory cell array.

With reference to FIG. 3, a configuration of the memory cell array will be described in detail. FIG. 3 illustrates a block BLK. As illustrated in FIG. 3, a block BLK of a first embodiment includes, for example, four string units SU (SU0 to SU3). Each of the string units SU includes a plurality of NAND strings 131.

Each of the NAND strings 131 includes select transistors ST1 and ST2 and a plurality of (in FIG. 3, as an example, 48) memory cell transistors MT (MT0 to MT47). Each of the memory cell transistors MT is provided with a stacked gate including a control gate and a charge storage layer, and retains data in a nonvolatile manner. The plurality of memory cell transistors MT (memory cell transistor group) are connected in series to each other between a source of the select transistor ST1 and a drain of the select transistor ST2. The number of memory cell transistors MT is arbitrary.

Gates of the select transistors ST1 of the string units SU0 to SU3 are respectively connected to select gate lines SGD0 to SGD3. Gates of the select transistors ST2 of the string units SU0 to SU3 are respectively connected to select gate lines SGS0 to SGS3. The gates of the select transistors ST2 of the string units SU0 to SU3 may be connected to a single select gate line SGS. Control gates of the memory cell transistors MT (MT0 to MT47) in the same block BLK are respectively connected to word lines WL (WL0 to WL47).

The drains of the select transistors ST1 of the NAND strings 131 in the same column in the memory cell array 130 are connected to bit lines BL (BL0 to BL(L−1) (where L is a natural number of 2 or more)). In other words, the bit line BL is connected to the NAND strings 131 of a plurality of blocks BLK. The sources of a plurality of select transistors ST2 are connected to source lines SL.

As a configuration of the memory cell array 130, other configurations may be used, such as the configuration of the memory cell array disclosed in, for example, U.S. patent application Ser. No. 12/407,403, filed on Mar. 19, 2009, entitled "three-dimensional stacked nonvolatile semiconductor memory," U.S. patent application Ser. No. 12/406,524, filed on Mar. 18, 2009, entitled "three-dimensional stacked nonvolatile semiconductor memory," U.S. patent application Ser. No. 12/679,991, filed on Mar. 25, 2010, entitled "nonvolatile semiconductor memory device and manufacturing method thereof," and U.S. patent application Ser. No. 12/532,030, filed on Mar. 23, 2009, entitled "semiconductor memory and manufacturing method thereof." The entire contents of these patent applications are incorporated by reference in the present application.

1-1-4. Sense Amplifier Unit 1-1-4-1. Summary of Sense Amplifier Unit

Next, a description will be made of the sense amplifier unit 140. Hereinafter, a description will be made of an example of a sense amplifier unit 140 where data is determined by sensing a voltage of a bit line (voltage sense method).

The sense amplifier unit 140 includes a plurality of sense modules 141. Each of the sense modules 141 includes a sense amplifier 146 and a hookup portion 142.

In the voltage sense method, the sense amplifier unit 140 detects a change in the voltage of a bit line during reading of data. A change in the voltage of the bit line is caused by capacitive coupling between bit lines, and this influences voltages of bit lines which are adjacent to each other. As a result, an error in data reading may occur. Therefore, data is read every even-numbered bit line or odd-numbered bit line in the voltage sense method.

Figure 4:
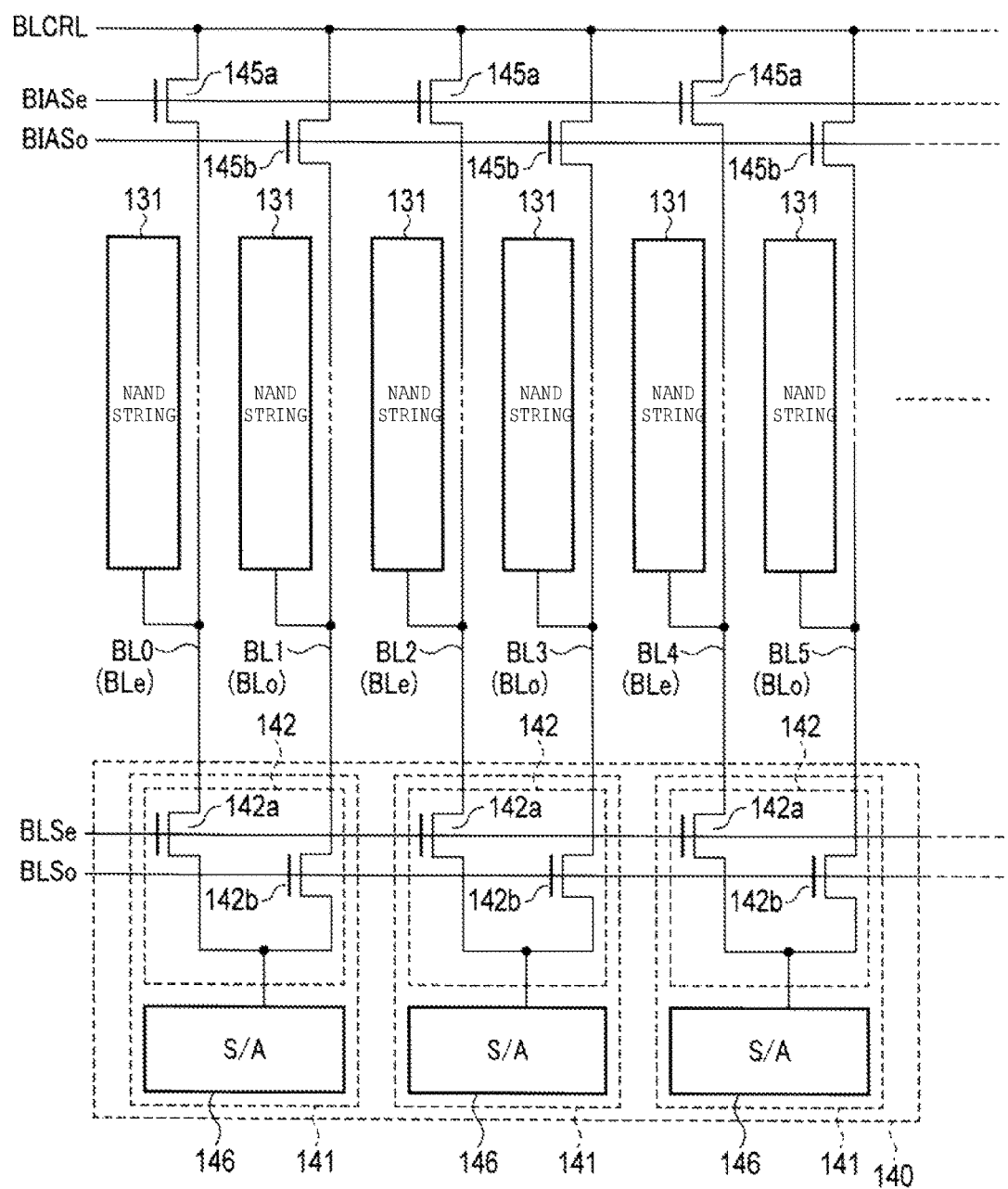
FIG. 4 is a circuit diagram illustrating a sense amplifier unit and a peripheral circuit thereof of a semiconductor memory device according to a first embodiment.

As illustrated in FIG. 4, the sense amplifier unit 140 performs sensing based on the voltage sense method. When the sense amplifier unit 140 performs sensing on a certain bit line, the sensing is performed by shielding adjacent bit lines. In other words, a voltage change of a bit line is sensed in the voltage sense method. As mentioned above, data is read every even-numbered bit line or every odd-numbered bit line in the voltage sense method. For example, when data is read from an even-numbered bit line, an odd-numbered bit line is fixed to a constant voltage (shielded), and, when data is read from an odd-numbered bit line, an even-numbered bit line is fixed to a constant voltage.

In the first embodiment, two bit lines which are adjacent to each other are classified into an even-numbered bit line BLe and an odd-numbered bit line BLo. The even-numbered bit line BLe and the odd-numbered bit line BLo adjacent to each other share a single sense module 141.

In the first embodiment, for example, data of the even-numbered bit line BLe is read, the sequencer 111 turns on a transistor 142a for the even-numbered bit line BLe so that the even-numbered bit line BLe is connected to the sense amplifier 146. At this time, the sequencer 111 causes a signal BIASo to transition to an "H" level, so as to turn on a ground transistor 145b. Consequently, the odd-numbered bit line BLo is connected to the ground BLCRL so as to have a predetermined voltage (a ground voltage in the first embodiment).

The sense module 141 precharges the even-numbered bit line BLe in a state in which the odd-numbered bit line BLo has the ground voltage. In this case, a voltage of the odd-numbered bit line BLo is retained at a predetermined voltage. Thus, the even-numbered bit line BLe is appropriately precharged without disturbance caused by a change in a voltage of the odd-numbered bit line BLo.

On the other hand, in a case where data is read from an odd-numbered bit line, the sequencer 111 turns on a transistor 142b for the odd-numbered bit line BLo, and thus the odd-numbered bit line BLo is connected to the sense module 141. At this time, the sequencer 111 causes a signal BIASe to transition to an "H" level, so as to turn on the ground transistor 145a. Consequently, the even-numbered bit line BLe is connected to the ground BLCRL, and thus the even-numbered bit line BLe has a predetermined voltage (a ground voltage in the first embodiment).

The sense module 141 precharges the odd-numbered bit line BLo in a state in which the even-numbered bit line BLe has the ground voltage. In this case, as described above, the odd-numbered bit line BLo is appropriately precharged.

As mentioned above, since a non-selected bit line is in a ground state during a read operation, it is possible to perform an accurate read operation without being influenced by a signal of the non-selected bit line.

1-1-4-2. Sense Module

Figure 5:
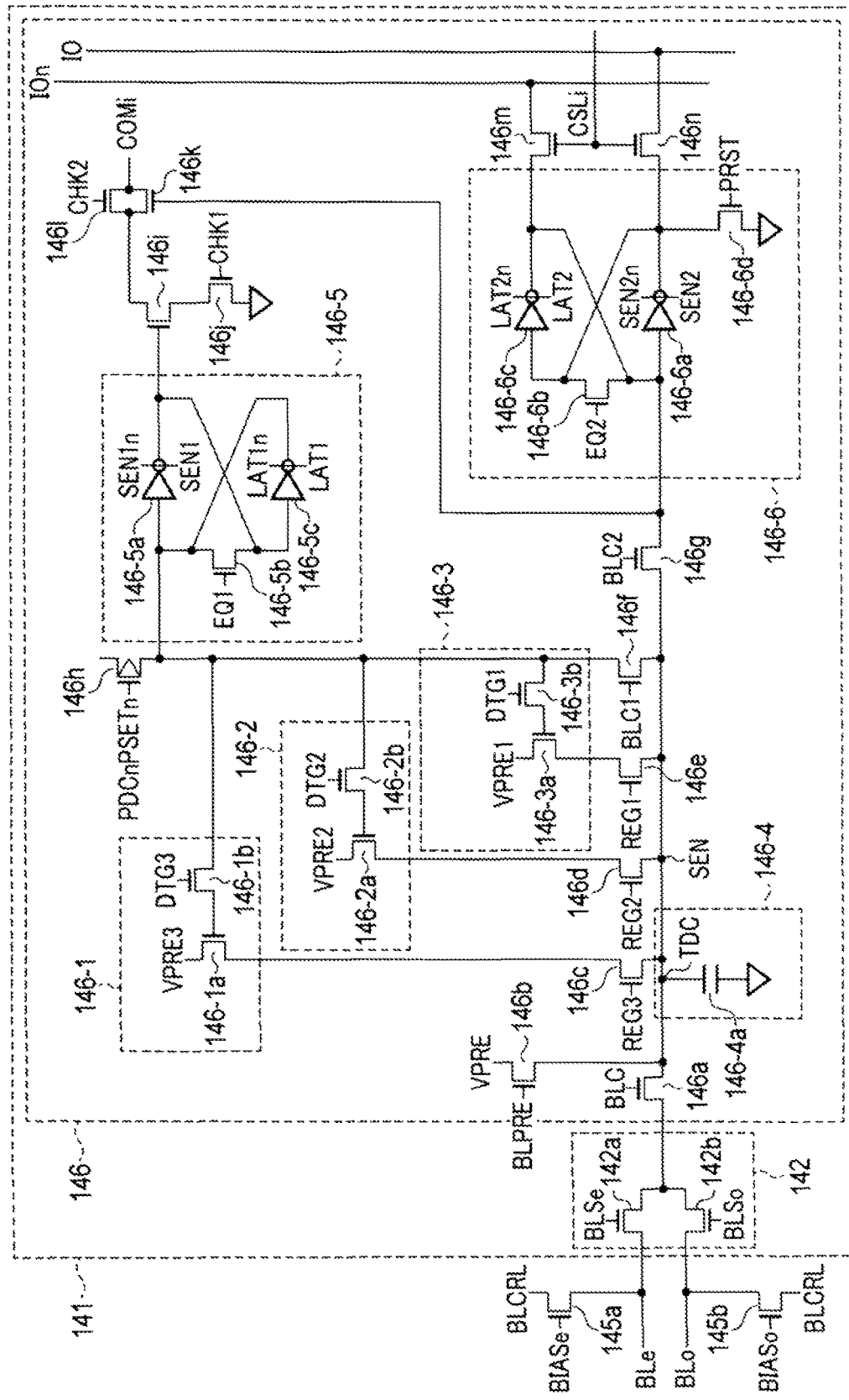
FIG. 5 is a circuit diagram of a sense module of the semiconductor memory device according to the first embodiment.

With reference to FIG. 5, a description will be made of the sense module 141 of the semiconductor memory device 100 according to the first embodiment. The sense module 141 includes the hookup portion 142 and the sense amplifier 146.

As illustrated in FIG. 5, the sense module 141 includes three dynamic data caches 146-1 to 146-3, a temporary data cache 146-4, a first data cache 146-5, and a second data cache 146-6. The dynamic data caches 146-1 to 146-3 and the temporary data cache 146-4 may be provided as necessary.

The first data cache 146-5 has clocked inverters 146-5a and 146-5c, and an N channel MOS transistor 146-5b.

The second data cache 146-6 has clocked inverters 146-6a and 146-6c, and N channel MOS transistors 146-6b and 146-6d. The first dynamic data cache 146-1 has N channel MOS transistors 146-1a and 146-1b. The second dynamic data cache 146-2 has N channel MOS transistors 146-2a and 146-2b. The third dynamic data cache 146-3 has N channel MOS transistors 146-3a and 146-3b. The temporary data cache 146-4 has a capacitor 146-4a. Data is temporarily stored at a node TDC of the temporary data cache 146-4. Circuit configurations of the first dynamic data cache 146-1, the second dynamic data cache 146-2, the third dynamic data cache 146-3, the temporary data cache 146-4, the first data cache 146-5, and the second data cache 146-6 are not limited to the configurations illustrated in FIG. 5, and may employ other circuit configurations.

The sense amplifiers 146 are respectively connected to the corresponding even-numbered bit line BLe and odd-numbered bit line BLo via the hookup portions 142. Signals BLSe and BLSo are respectively input to gates of the transistors 142a and 142b. The even-numbered bit line BLe and the odd-numbered bit line BLo are respectively connected to sources of the N channel MOS transistors 145a and 145b. The signals BIASe and BIASo are input to gates of the transistors 145a and 145b, and a signal BLCRL is input to drains thereof.

The sense module 141 is a sense module for the voltage sense method.

A configuration of the sense module 141 may employ various configurations, such as disclosed in, for example, U.S. patent application Ser. No. 15/185,671, filed on Jun. 17, 2016, entitled "SEMICONDUCTOR MEMORY DEVICE". The entire contents of this Patent Applications are incorporated by reference in the present application.

1-1-5. Relationship Between Threshold Voltage Distribution Memory Cell Transistor and Data With reference to FIG. 6, a description will be made of a relationship between threshold voltage distributions of the memory cell transistor MT and data.

Figure 6:
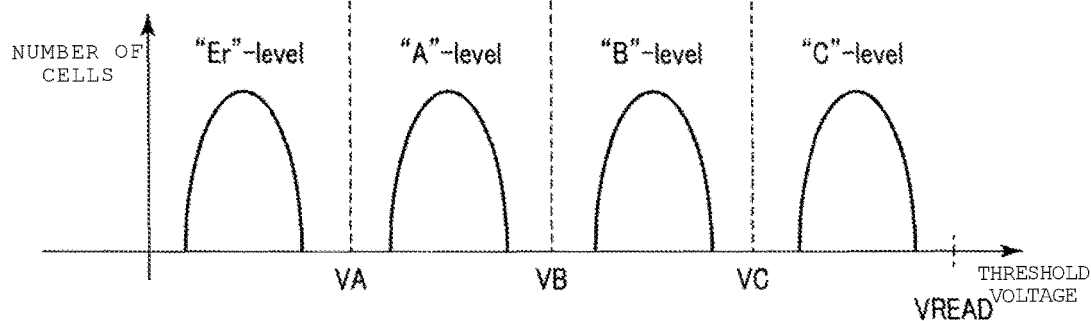
FIG. 6 is a diagram illustrating a relationship between threshold voltage distributions and data of a memory cell transistor of the semiconductor memory device according to the first embodiment.

As illustrated in FIG. 6, each of the memory cell transistors MT can retain 2-bit data depending on a threshold voltage thereof. For example, the 2-bit data may be "11", "01", "00", and "10" in ascending order of threshold voltages.

A threshold voltage of the memory cell transistor MT retaining data of "11" is within a predetermined distribution, and a threshold voltage distribution corresponding to the data of "11" is called an "Er" level. The Er level is a threshold voltage distribution in a state in which electric charge in the charge storage layer is removed, and thus data is erased, and has a positive or negative voltages (for example, below voltage VA).

"01", "00", and "10" are threshold voltage distributions in a state in which electric charge is injected into the charge storage layer, and thus data is written.

A threshold voltage of the memory cell transistor MT retaining data of "01" is within an "A" level distribution, and is greater than a threshold voltage in the "Er" level (for example, equal to voltage VA (or more) and a voltage VB (or less) where VA<VB).

A threshold voltage of the memory cell transistor MT retaining data of "00" is within a "B" level distribution, and is greater than a threshold voltage in the "A" level (for example, equal to the voltage VB (or more) and a voltage VC (or more) where VB<VC).

A threshold voltage of the memory cell transistor MT retaining data of "10" is within a "C" level distribution, and is greater than a threshold voltage in the "B" level (for example, equal to the voltage VC or more).

A relationship between 2-bit data and a threshold voltage is not limited as described above. For example, the data of "11" may correspond to the "C" level, and a relationship between both of the two may be selected as appropriate.

1-2. Operation 1-2-1. Summary of Write Operation

Figure 7:
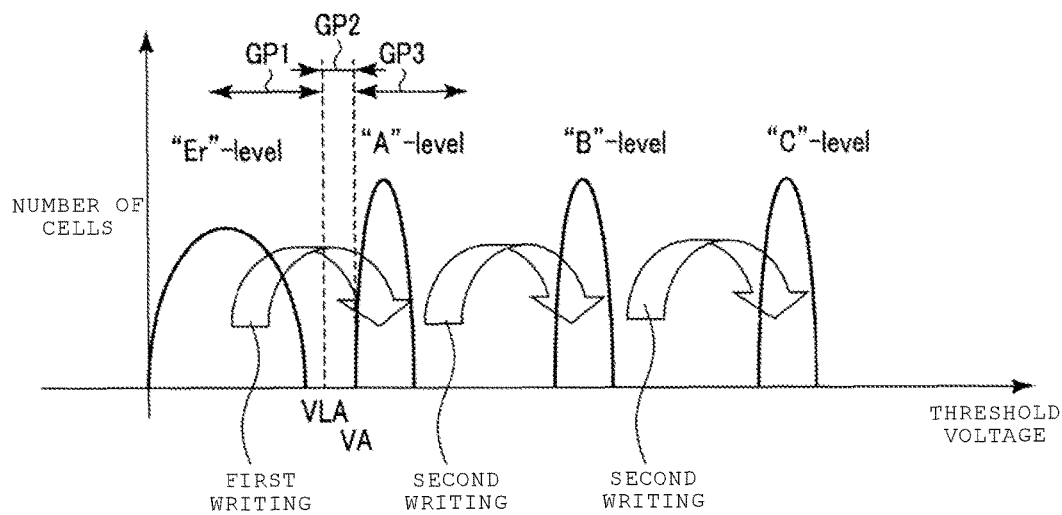
FIG. 7 is a diagram illustrating a write operation of the semiconductor memory device according to the first embodiment.

With reference to FIG. 7, a description will be made of a summary of a write operation of the semiconductor memory device 100 according to the first embodiment.

In the first embodiment, when the sequencer 111 performs a write operation on the memory cell array 130, roughly two types of write methods (first writing and second writing) are performed.

With reference to FIG. 7, the first writing will be described. Herein, as an example of a case where the first writing is applied from the Er level to the A level.

The first writing includes a program operation (also simply referred to as a program) and a program verification operation (also simply referred to as a program verification or a verification). The program operation is an operation in which an electron is injected into the charge storage layer of a selected memory cell transistor MT. The program verification operation is an operation of checking whether or not the program operation is completed.

In the first writing, in order to reduce a width of a threshold voltage distribution of the memory cell transistor MT, threshold voltages of the memory cell transistor MT (selected memory cell transistor MT) after operation are classified into three groups (first to third groups), and conditions for the program operation are changed according to this classification.

For example, The three groups include, as illustrated in FIG. 7, a first group GP1, a second group GP2, and a third group GP3. A threshold voltage of the selected memory cell transistor MT in the first group GP1 is less than a voltage VLA. A threshold voltage of the selected memory cell transistor MT in the second group GP2 is equal to voltage VLA or more, and less than a voltage VA (VLA<VA). A threshold voltage of the selected memory cell transistor MT in the third group GP3 is equal to the voltage VA or more.

The sequencer 111 performs a first program verification operation using the voltage VLA and a second program verification operation using the voltage VA so as to be able to determine in which group the memory cell transistor MT is included.

As mentioned above, the memory cell transistor MT in the first group is a write deficiency cell (also referred to as a first cell) in which a threshold voltage thereof is far away from the voltage VA which is a write target. The memory cell transistor MT in the second group is a write deficiency cell (also referred to as a second cell) in which a threshold voltage thereof is close to the voltage VA which is a write target. The memory cell transistor MT in the third group is a write completion cell (also referred to as a third cell).

Thus, during rewriting, with respect to the write deficiency cell classified as the first group, a bit line is set to a first voltage, and normal writing performed. With respect to the second cell classified as the second group, a bit line is set to a second voltage higher than the first voltage, and writing weaker than normal writing is performed (a threshold voltage change width is small).

With respect to the write completion cell classified as the third group, a bit line is set to a third voltage higher than the second voltage, and thus writing is inhibited.

In the write operation of the semiconductor memory device as illustrated in FIG. 7, two program verification operations are performed by using two voltages (VLA and VA) as selection read voltages applied to a selected word line during a program verification.

A non-selection read voltage VREAD higher than the selection read voltage is applied to a non-selected word line.

So far, one example has explained where the first writing is applied to writing of the A level from the Er level. However the invention is not limited to this example. For example, the first writing may be applied to writing of an X (where X is any level) level. In this case, the sequencer 111 performs a first program verification operation using the voltage VLX and a second program verification operation using the voltage VX (VLX<VX) so as to be able to determine in which group the memory cell transistor MT is included.

Next, the second writing will be described.

The second writing includes a program operation but does not include a program verification operation. In the second writing, the number of program operations (also referred to as a program number) is set in accordance with a target level. For example, in order to change a threshold voltage from the A level to the B level, the A level is written, and then a plurality of (for example, two) program operations are performed. In a case where a threshold voltage transitions from the A level to the C level, the A level is written, and then a plurality of (for example, four) program operations are performed. The number of program operations is stored in, for example, the register 112. The number of program operations may be stored in other storage regions.

In the second writing, since a program verification operation is not performed, time for a write operation can be shortened more than in the first writing.

As mentioned above, in the first embodiment, the first writing is applied to writing of the A level from the Er level. The second writing is applied to writing of the B level from the A level, and writing of the C level from the B level. However, a method of applying the first writing and the second writing is not limited to the above description.

1-2-2. Program Operation

Figure 8:
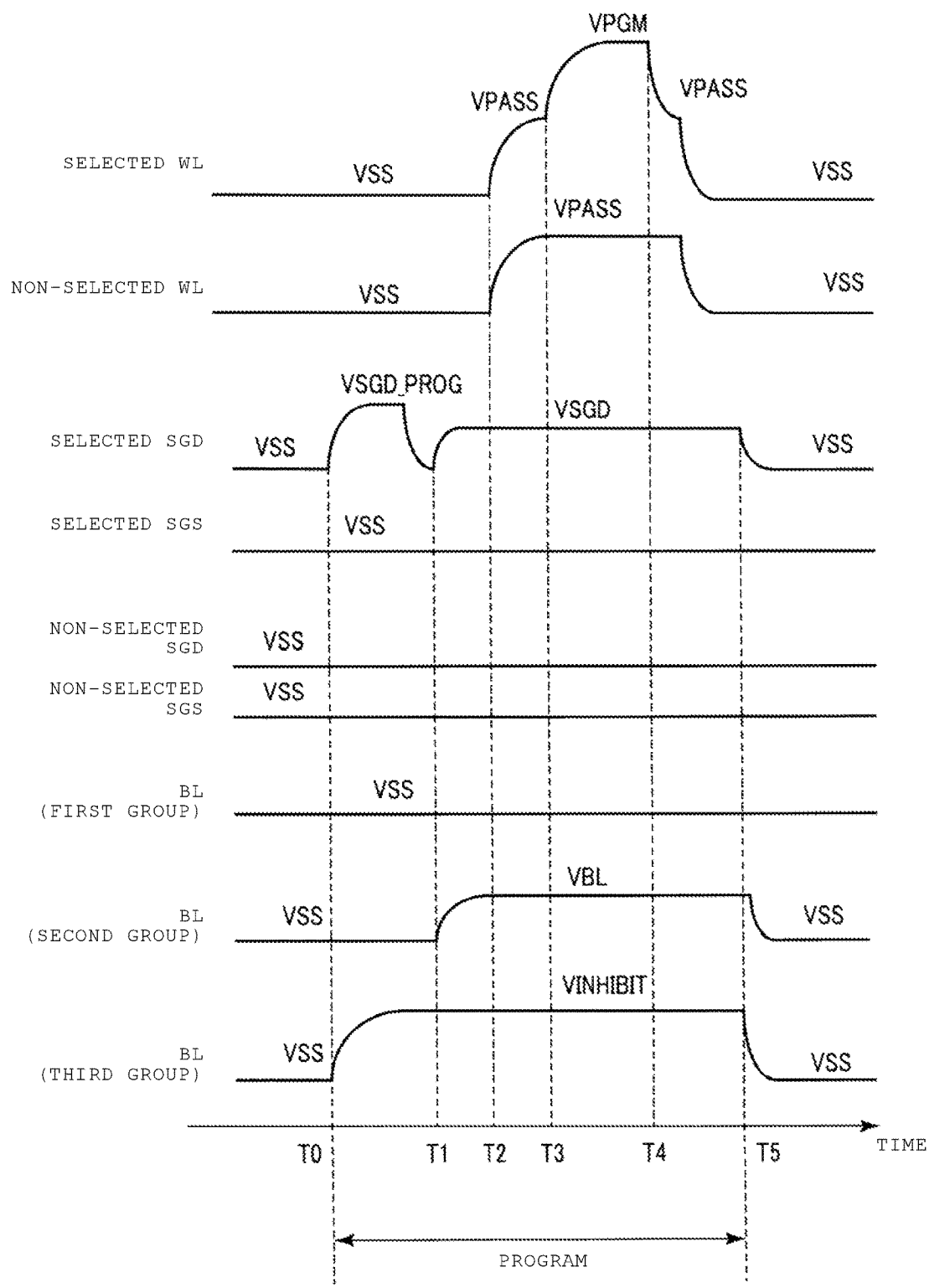
FIG. 8 is a waveform diagram illustrating a program operation of the semiconductor memory device according to the first embodiment.

With reference to FIG. 8, a description will be made of a fundamental operation waveform of a program operation included in the first writing and the second writing.

Time Point T0 to Time Point T1

At a time point T0, the row decoder 150 selects a block according to a row address RA sent from the register 112. The row decoder 150 applies a voltage VSGD_PROG (for example, VSS<VSGD_PROG) to a selected select gate line SGD, and applies a voltage VSS to a selected select gate line SGS and a non-selected select gate lines SGD and SGS. The voltage VSGD_PROG is a voltage causing the select transistor ST1 to go into an ON state.

At the time point T0, the sense amplifier unit 140 applies, for example, the voltage VSS to a write bit line BL for injecting an electron into the charge storage layer of the memory cell transistor MT, and applies a constant voltage VINHIBIT (VSS<VINHIBIT) to a non-write bit line BL for inhibiting an electron from being injected into the charge storage layer of the memory cell transistor MT. The write bit lines BL are bit lines connected to the memory cell transistors MT included in the first group and the second group, and, on the other hand, the non-write bit line BL is a bit line connected to the memory cell transistor MT included in the third group.

Hereinafter, for simplification, bit lines connected to the memory cell transistors MT included in the first group to the third group will be respectively referred to as bit lines included in the first group to the third group.

Time Point T1 to Time Point T2

Next, at the time point T1, the row decoder 150 applies a voltage VSGD to the selected select gate line SGD (for example, VSS<VSGD<VSGD_PROG).

The sense amplifier unit 140 applies a voltage VBL to the write bit line BL included in the second group.

The voltage VSGD enables the voltage VSS to be transmitted to the select transistor ST1, but disables the voltage VDD to be transmitted thereto. Therefore, the select transistor ST1 corresponding to the non-write bit line BL (third group) goes into a cut-off state.

Time Point T2 to Time Point T3

Next, at the time point T2, the row decoder 150 applies a voltage VPASS to word lines WL (selected and non-selected).

Time Point T3 to Time Point T4

Next, the row decoder 150 increases a voltage to be applied to a plurality of selected word lines WL from the voltage VPASS to a voltage VPGM. Consequently, electrons are injected into the selected memory cell transistors MT connected to the selected word lines WL. The voltage VPGM is changed as appropriate depending on a write level or the number of program operations. A specific method of changing the voltage VPGM will be described later. Normal writing is performed on the memory cell transistors MT classified as the first group, and writing weaker than the normal writing is performed on the memory cell transistors MT classified as the second group.

The voltage VINHIBIT is applied to the memory cell transistor MT classified as the third group, and thus the select transistor ST1 connected to the memory cell transistor MT is cutoff. Consequently, a channel of the memory cell transistor MT goes into a floating state so as to be boosted. Thus, even if a program voltage is applied to the word line WL, a program operation is not performed on the memory cell transistor MT which is not a write target. This operation will be also referred to as a lockout operation.

Time Point T4 to Time Point T5

After the program operation is performed in the period between the time point T3 and the time point T4, in a period between the time point T4 and a time point T5, the row decoder 150 applies the voltage VSS to the word line WL and the selected select gate line SGD, and the sense amplifier unit 140 applies the voltage VSS to the non-write bit line BL. Consequently, the program operation is finished.

In the following, a program operation is performed as described above. As mentioned above, the operation illustrated in FIG. 8 corresponds to a single program operation. In a case where a plurality of program operations are performed, the operation illustrated in FIG. 8 is repeatedly performed a plurality of times.

1-2-3. Program Verification Operation

Figure 9:
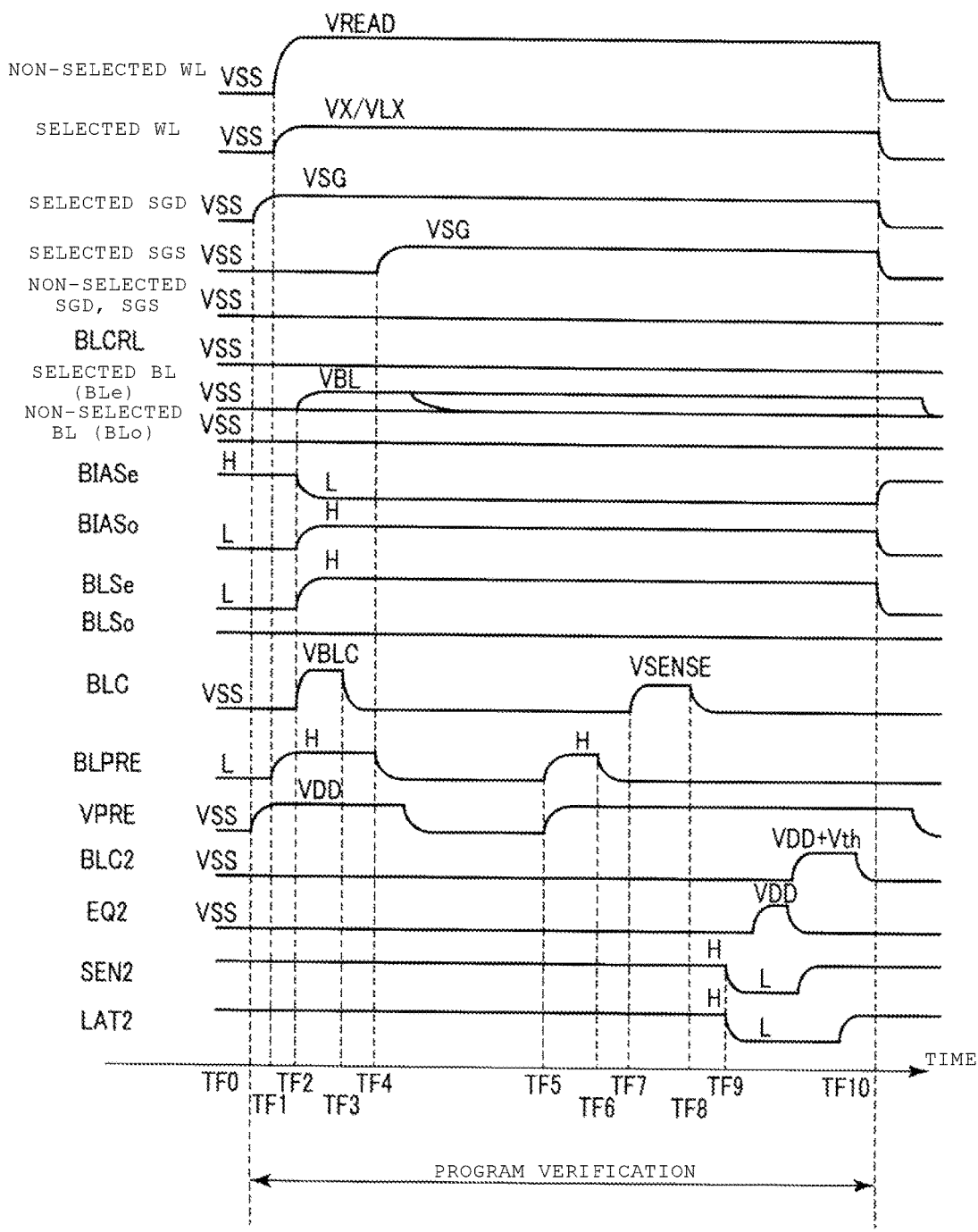
FIG. 9 is a waveform diagram illustrating a program verification operation of the semiconductor memory device according to the first embodiment.

With reference to FIG. 9, a fundamental operation waveform of a program verification operation will be described.

Time Point TF0 to Time Point TF1

At a time point TF0, the row decoder 150 applies a voltage VSG to a selected select gate line SGD, and applies 0 V or a non-selection voltage VBB (for example, a negative voltage) to a non-selected select gate line SGD. A precharge power source voltage VPRE of the sense amplifier unit 140 is set to VDD.

Time Point TF1 to Time Point TF2

Next, at the time point TF1, the row decoder 150 applies a verification voltage VX (where X is any level) or VLX (where VLX<VX) to a selected word line WL, and applies a voltage VREAD to a non-selected word line WL.

The sense amplifier unit 140 precharges a read target bit line (the even-numbered bit line BLe in the example illustrated in FIG. 9) in advance. Specifically, a signal BLPRE is set to a "high (H)" level ("L" level<"H" level) so as to turn on the N channel MOS transistor 146b, and thus the node TDC of the temporary data cache 146-4 is precharged with a voltage VDD.

Time Point TF2 to Time Point TF3

Next, in a period between a time point TF2 and a time point TF3, bit line selection signals BLSe and BLSo, and bias selection signals BIASe and BIASo are set. In the example illustrated in FIG. 9, since the even-numbered bit line BLe is selected, the even-numbered bit line selection signal BLSe transitions to an "H" level, the odd-numbered bit line BLo is fixed to BLCRL (=voltage VSS), and thus the signal BIASo transitions to an "H" level.

A clamp voltage VBLC for bit line precharge is set for a signal BLC, and thus the even-numbered bit line BLe is precharged with, for example, a voltage VBL.

Thus, the even-numbered bit line BLe is charged with the voltage VBL, and the odd-numbered bit line BLo is fixed to the voltage VSS.

Time Point TF3 to Time Point TF4

Next, at the time point TF3, the signal BLC is set to the voltage VSS, and the bit line BLe goes into an electrically floating state.

Time Point TF4 to Time Point TF5

Next, at the time point TF4, the voltage VSG is applied to a source side select gate line SGS of a selected string unit. The voltage VSS or the non-selection voltage VBB is applied to remaining non-selected select gate lines SGS. Consequently, if a threshold voltage of the memory cell transistor MT is more than a verification voltage, a bit line is not discharged, and if the threshold voltage is less than the verification voltage, a read current flows, and the bit line is discharged.

Time Point TF5 to Time Point TF6

Next, in a period between a time point TF5 and a time point TF6, the signal BLPRE is set to the voltage VSG in a state in which the signal VPRE is set to the voltage VDD, and thus the node TDC of the temporary data cache 146-4 is precharged with the voltage VDD.

Time Point TF7 to Time Point TF8

Next, in a period between a time point TF7 and a time point TF8, a sense voltage VSENSE is set for the signal BLC. At this time, if a voltage of the selected bit line BLe is higher than VSENSE-Vth, the transistor 146a (a transistor to which the signal BLC is applied) is maintained to be cut off, and thus the voltage VDD is retained at the node TDC of the temporary data cache 146-4. Vth indicates a threshold voltage of the memory cell transistor MT. On the other hand, if a voltage of the selected bit line BLe is lower than VSENSE-Vth, the transistor 146a is turned on, and thus the node TDC of the temporary data cache 146-4 is discharged so as to have the substantially same voltage as a voltage (for example, 0.4 V) of the bit line BLe.

Time Point TF9 to Time Point TF10

Next, in a period between a time point TF9 and a time point TF10, sensed data is incorporated into the second data cache 146-6. Specifically, first, signals SEN2 and LAT2 go into an OFF state, and a signal EQ2 is set to the voltage VDD, and thus a node SEN1 and a node N2 are set to the same voltage. Thereafter, a voltage of a signal BLC2 is set to be a voltage VDD+Vth, and thus the data at the node TDC of the temporary data cache 146-4 is transmitted to the second data cache 146-6. As a result, in a case where the node TDC of the temporary data cache 146-4 is initially at an "H" level, data of the second data cache 146-6 becomes "1". In a case where the node TDC of the temporary data cache 146-4 is at an "L" (for example, 0.4 V) level, data of the second data cache 146-6 becomes "0".

As mentioned above, data is read from the even-numbered bit line BLe. Thereafter, each node and each signal are reset through a recovery operation.

Reading for the odd-numbered bit line BLo is also performed in the same manner as described above. In this case, conversely to the example illustrated in FIG. 9, the signal BLSo is set to an "H" level, and the signal BLSe is set to an "L" level. The signal BIASe is set to an "H" level, and the signal BIASo is set to an "L" level.

In the following description, a program verification operation based on the voltage sense method is performed by referring to the above-described program verification operation. As mentioned above, the operation illustrated in FIG. 9 corresponds to a single program verification operation. In a case where a plurality of program verification operations are performed, the operation illustrated in FIG. 9 is repeatedly performed a plurality of times.

1-2-4. Operation Flow of Write Operation

Next, with reference to FIGS. 10 to 12, a description will be made of an operation flow of a write operation of the semiconductor memory device 100 according to the first embodiment, and an operation flow based on the operation described with reference to FIG. 7.

Figure 10:
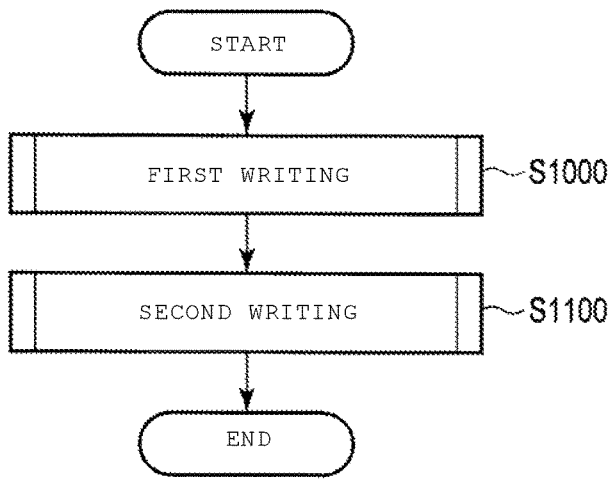
FIG. 10 is a flowchart illustrating a write operation of the semiconductor memory device according to the first embodiment.

As illustrated in FIG. 10, in the write operation of the first embodiment, the semiconductor memory device 100 performs the first writing (step S1000) and then performs the second writing (step S1100).

Figure 11:
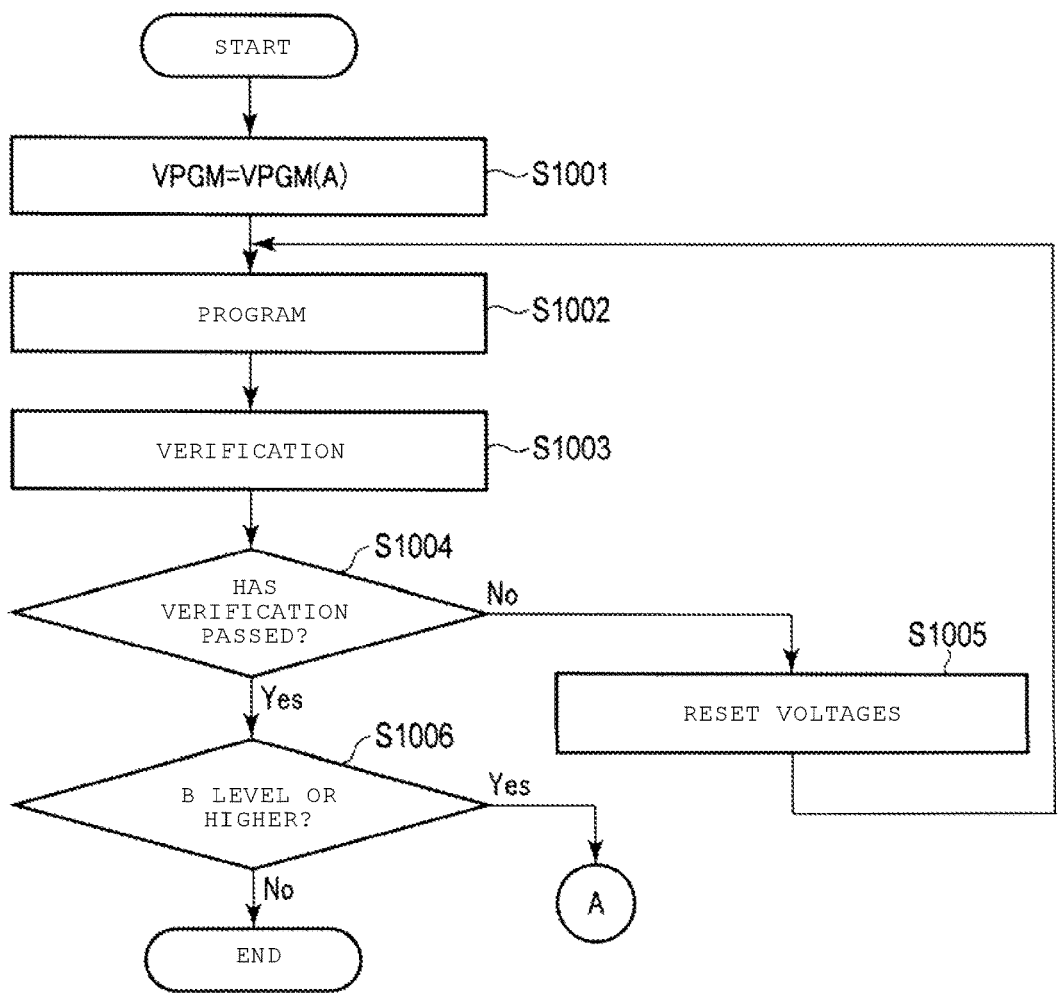
FIG. 11 is a flowchart illustrating a write operation of the semiconductor memory device according to the first embodiment.

With reference to FIG. 11, a description will be made of an operation flow of the first writing (step S1000). A program operation and a program verification operation have been described in detail, and will thus be described briefly.

Step S1001

First, the sequencer 111 performs an A level program operation on the memory cell transistor MT into which data of the A level or higher is to be written. Specifically, the sequencer 111 sets a program voltage VPGM to an A level program voltage VPGM (A). Hereinafter, each level program voltage will be referred to as a voltage VPGM(X) (where X is any level).

Step S1002

The sequencer 111 performs an A level program operation on a target memory cell transistor MT by using the program voltage (refer to FIG. 8). Hereinafter, for simplification, a program operation regarding an X level will be simply referred to as an X level program operation in some cases.

Step S1003

Next, the sequencer 111 performs a first program verification operation (also simply referred to as a first verification) in order to determine whether or not a write target memory cell transistor MT is included in the first group. In this case, the sequencer 111 performs a program verification operation by using the voltage VLA (refer to FIG. 9).

Next, the sequencer 111 performs a second program verification operation (also simply referred to as a second verification) in order to determine whether or not the write target memory cell transistor MT is included in the second group. In this case, the sequencer 111 performs a program verification operation by using the voltage VA (refer to FIG. 9).

Step S1004

The sequencer 111 determines whether or not all write target memory cell transistors MT have passed the second program verification operation.

Step S1005

If any memory cell transistors MT have not passed the first and second program verification operations (NO in step S1004) among the write target memory cell transistors MT, the sequencer 111 determines in which group of the first to third groups the write target memory cell transistor MT is included. The sequencer 111 resets various voltages on the basis of a determined group, and performs step S1002.

Specifically, the sequencer 111 increases the program voltage VPGM by dVPGM, sets a voltage of the bit line BL included in the first group to the voltage VSS, sets a voltage of the bit line BL included in the second group to the voltage VBL, and sets a voltage of the bit line BL included in the third group to the voltage VINHIBIT.

Step S1006

Once all of the write target memory cell transistors MT have passed the second program verification operation (YES in step S1004), the sequencer 111 determines whether or not there is a memory cell transistor MT into which data of the B level or higher is to be written.

Once no memory cell transistor MT into which data of the B level or higher is to be written (NO in step S1006) has been confirmed, the sequencer 111 finishes the write operation.

Figure 12:
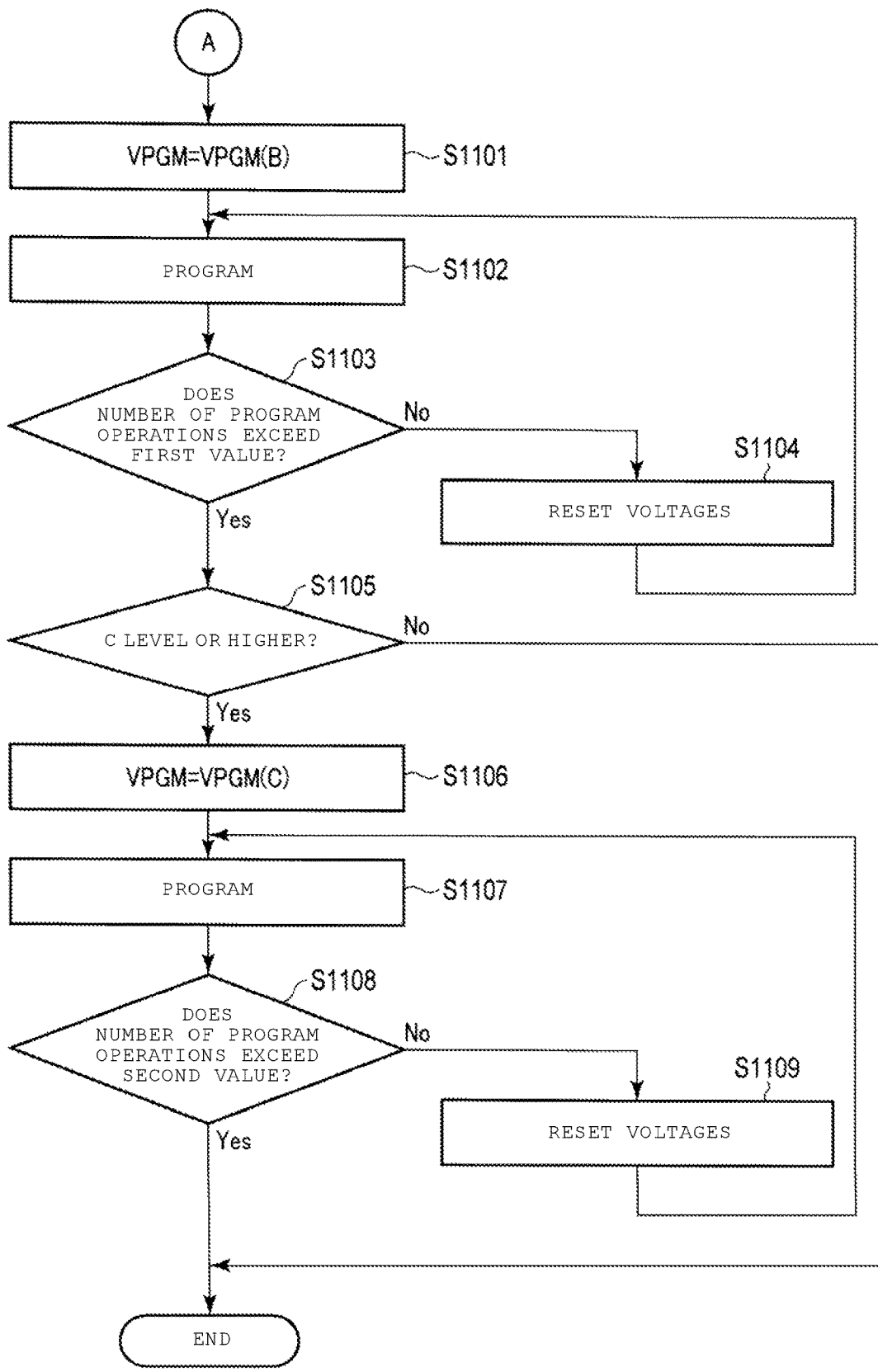
FIG. 12 is a flowchart illustrating a write operation of the semiconductor memory device according to the first embodiment.

With reference to FIG. 12, a description will be made of an operation flow of the second writing (step S1100).

Step S1101

In a case where the sequencer 111 determines that there is a memory cell transistor MT into which data of the B level or higher is to be written (YES in step S1006), the sequencer 111 sets the program voltage VPGM to a B level program voltage VPGM(B). The voltage VPGM(B) is higher than the previous voltage VPGM(A)+dVPGM*Y (where Y is any integer).

Step S1102

The sequencer 111 performs a B level program operation on a target memory cell transistor MT by using the program voltage.

Step S1103

As described above, in the second writing, the number of program operations is restricted. The sequencer 111 counts the number of times of execution (the number of program operations) of step S1102, and determines whether or not the number of times of execution exceeds a first value (the number of B level program operations) stored in the register 112.

Step S1104

When the number of times of step S1102 does not exceed the first value (NO in step S1103), the sequencer 111 resets various voltages so as to perform step S1102. Specifically, the sequencer 111 increases the program voltage VPGM by dVPGM.

Step S1105

When the number of times of step S1102 exceeds the first value (YES in step S1103), the sequencer 111 determines whether or not there is a memory cell transistor MT into which data of the C level or higher is to be written.

Once no memory cell transistor MT into which data of the C level or higher is to be written (NO in step S1105) has been confirmed, the sequencer 111 finishes the write operation.

Step S1106

In a case where the sequencer 111 determines that there is a memory cell transistor MT into which data of the C level or higher is to be written (YES in step S1105), the sequencer 111 sets the program voltage VPGM to a C level program voltage VPGM(C). The voltage VPGM(C) is higher than the previous voltage VPGM(B)+dVPGM*Y (where Y is any integer).

Step S1107

The sequencer 111 performs a C level program operation on a target memory cell transistor MT by using the program voltage.

Step S1108

The sequencer 111 counts the number of times of execution (the number of program operations) of step S1107, and determines whether or not the number of times of execution exceeds a second value (the number of C level program operations) stored in the register 112. The second value may be the number of program operations after completion of the A level program operation, and may be the number of program operations after completion of the B level program operation.

When the number of times of step S1107 exceeds the second value (YES in step S1108), the sequencer 111 finishes the write operation.

Step S1109

When the number of times of step S1107 does not exceed the second value (NO in step S1108), the sequencer 111 resets various voltages so as to perform step S1107. Specifically, the sequencer 111 increases the program voltage VPGM by dVPGM.

The operations illustrated in FIGS. 10 to 12 are based on the operation described with reference to FIG. 7. Thus, in a case where a method of applying the first writing and the second writing is changed, an operation flow of a write operation of the semiconductor memory device 100 is also changed according to the method of applying the first writing and the second writing.

1-2-5. Specific Example of Pulse

Figure 13:
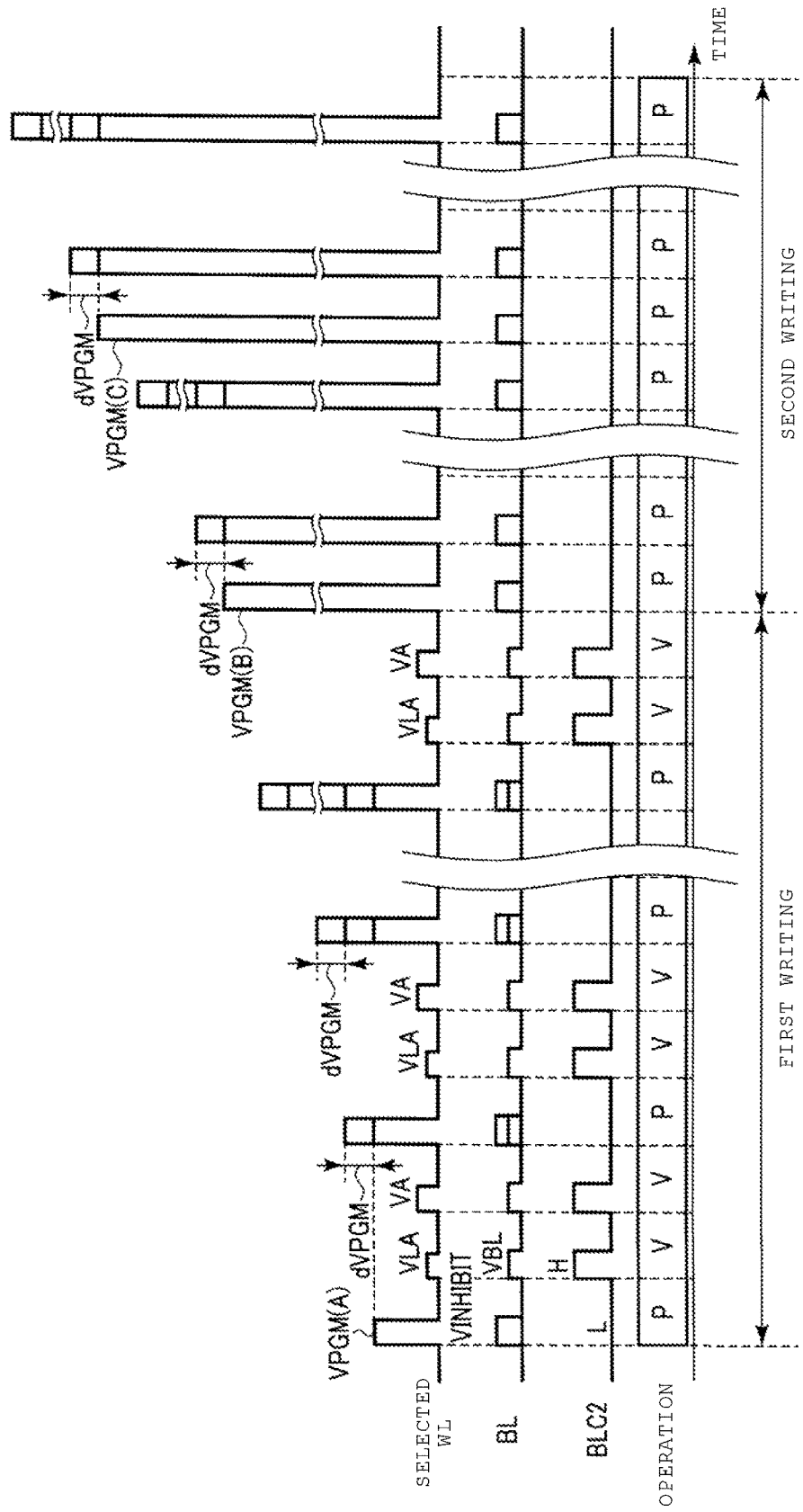
FIG. 13 is a diagram illustrating pulses during a write operation of the semiconductor memory device according to the first embodiment.

Next, with reference to FIG. 13, a description will be made of a specific pulse example in a case where the write operation of the first embodiment is applied to the above-described memory cell transistor MT. In FIG. 13, for simplification, only waveforms of a selected word line WL, and bit lines BL and BLC2 are illustrated.

For simplification, in FIG. 13, with respect to a program operation, the voltage VPGM applied to the selected word line WL between the time point T3 and the time point T4 in FIG. 8 is illustrated as pulses. With respect to a program verification operation, the voltages VA and VLA applied to the selected word line WL and the voltage VDD+Vth applied to the bit line BLC2 are illustrated as pulses between the time point TF1 and the time point TF10 in FIG. 9. In other words, the "pulse" in a program operation indicates the voltage VPGM applied to the selected word line WL between the time point T3 and the time point T4 in FIG. 8. Similarly, the "pulses" in a program verification operation indicate a voltage VX applied to the selected word line WL and the voltage VDD+Vth applied to the bit line BLC2 between the time point TF1 and the time point TF10 in FIG. 9.

A lower part in FIG. 13 illustrates operation states. In the figure, P indicates a program operation, and V indicates a program verification operation.

The sequencer 111 increases the voltage VPGM(X) by the voltage dVPGM every time a program operation is performed.

As illustrated in FIG. 13, first, the sequencer 111 performs the first writing. The sequencer 111 performs a program operation on a write target memory cell transistor MT by using the voltage VPGM(A). At this time, the sequencer 111 supplies the voltage VSS to the bit line BL related to the write target memory cell transistor MT. The voltage VINHIBIT is supplied to the bit line BL related to the memory cell transistor MT which is not a write target. Consequently, a channel of the write target memory cell transistor MT is set to the voltage VSS, and the program voltage VPGM(A) is applied to the word line WL, and thus the program operation is performed on the memory cell transistor MT. The voltage VINHIBIT is applied to the memory cell transistor MT which is not a write target, and thus the select transistor ST1 connected to the memory cell transistor MT is cut off. Consequently, a channel of the memory cell transistor MT goes into a floating state so as to be boosted. Thus, even if a program voltage is applied to the word line WL, a program operation is not performed on the memory cell transistor MT which is not a write target.

Next, the sequencer 111 performs a first program verification operation. More specifically, the sequencer 111 applies the verification voltage VLA to the word line WL, so as to perform a program verification operation on the memory cell transistor MT.

Next, the sequencer 111 performs a second program verification operation. More specifically, the sequencer 111 applies the verification voltage VA to the word line WL so as to perform a program verification operation on the memory cell transistor MT.

When a program operation is performed, the sequencer 111 applies the voltage VSS to the bit line BL related to the first group, applies the voltage VBL to the bit line BL related to the second group, and applies the voltage VINHIBIT to the bit line BL related to the third group, on the basis of a result of the program verification operation. A program operation is performed on the write target memory cell transistor MT by using the voltage VPGM(A)+dVPGM. Consequently, a program operation is performed on the memory cell transistors MT in the first and second groups.

The voltage VINHIBIT is applied to the memory cell transistor MT of the third group, and thus the select transistor ST1 connected to the memory cell transistor MT is cut off. Consequently, a channel of the memory cell transistor MT goes into a floating state so as to be boosted. Thus, even if a program voltage is applied to the word line WL, a program operation is not performed on the memory cell transistor MT in the third group.

A program operation and a program verification operation are repeated until the write target memory cell transistor MT passes the second program verification operation. If all of the write target memory cell transistors MT pass the second program verification operation (the first writing is completed), the sequencer 111 starts second writing regarding the B level and the C level.

The sequencer 111 performs a program operation on a write target memory cell transistor MT by using the voltage VPGM(B). The program operation is repeated until the number of program operations regarding the B level exceeds the first value after adding the voltage dVPGM to the voltage VPGM(B).

If the program operation regarding the B level is completed, the sequencer 111 performs a program operation on a write target memory cell transistor MT by using the voltage VPGM(C). The program operation is repeated until the number of program operations regarding the C level exceeds the first value after adding the voltage dVPGM to the voltage VPGM(C).

In the above-described way, the second writing is finished.

The operation in FIG. 13 is based on the operation described with reference to FIG. 7. Thus, in a case where a method of applying the first writing and the second writing is changed, pulses are also changed in a write operation of the semiconductor memory device 100 according to the first embodiment are also changed according to the method of applying the first writing and the second writing.

1-3. Effects

According to the above-described embodiment, a data write operation is performed by using the first writing to reduce a width of a threshold voltage distribution of the memory cell transistor MT that is being written and the second writing which does not include a program verification operation.

Consequently, it is possible to perform writing at a high speed while reducing a width of a threshold voltage distribution of the memory cell transistor MT that is being written.

Hereinafter, a description will be made of another comparative example to explain an effect of the first embodiment.

Figure 14:
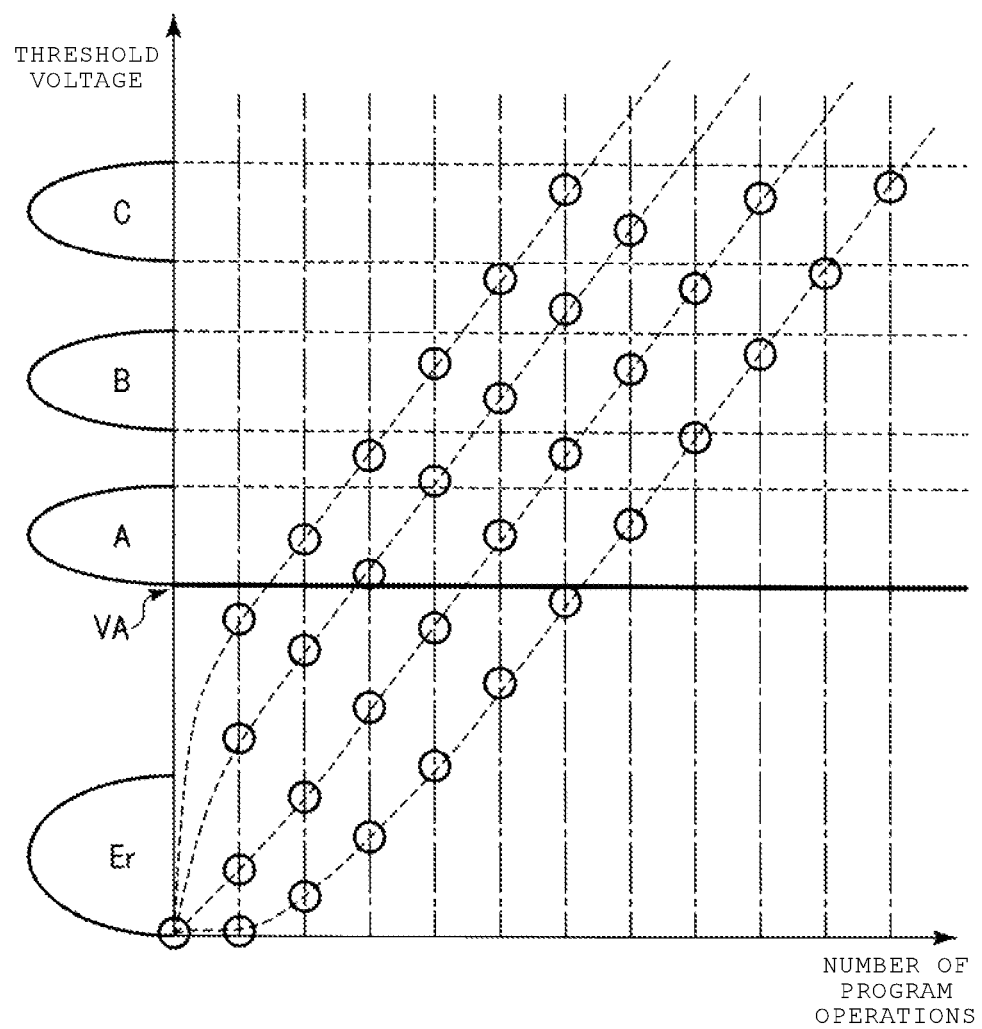
FIG. 14 is a diagram illustrating a relationship between the number of program operations of the semiconductor memory device and a change in a threshold voltage of a memory cell transistor related to a comparative example of the first embodiment.

FIG. 14 illustrates a relationship between the number of program operations and a change in a threshold voltage of the memory cell transistor MT. As illustrated in FIG. 14, write characteristics of the memory cell transistor MT may be different from each other.

As illustrated in FIG. 14, for example, characteristics of the memory cell transistor MT may be that, if two program operations are performed after the A level is exceeded, a threshold voltage transitions to a range of the B level, and, if four program operations are performed after the A level is exceeded, a threshold voltage transitions to a range of the C level.

Figure 15:
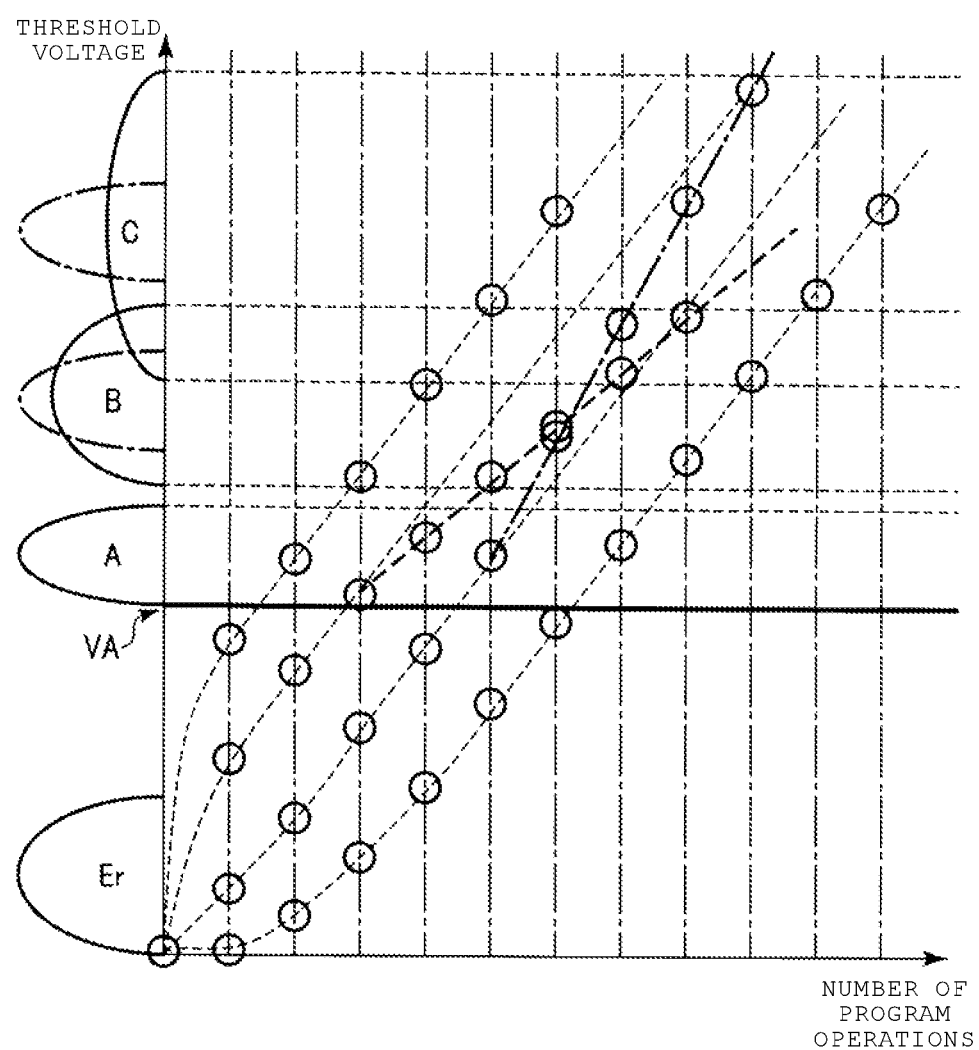
FIG. 15 is a diagram illustrating a relationship between the number of program operations of the semiconductor memory device and a change in a threshold voltage of the memory cell transistor related to a comparative example of the first embodiment.

However, as illustrated in FIG. 15, there is a probability that threshold voltage distributions may spread out so as to overlap each other.

Figure 16:
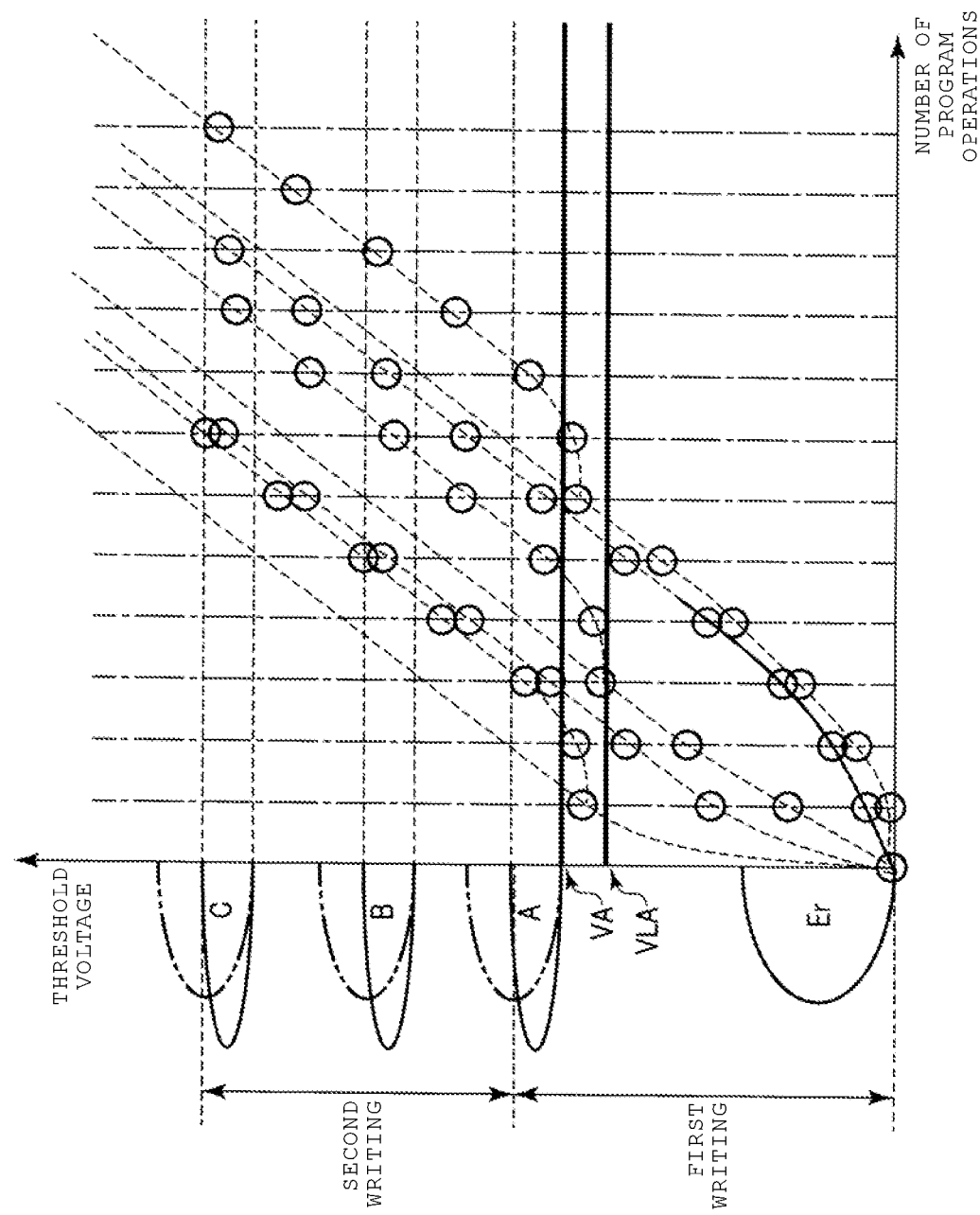
FIG. 16 is a diagram illustrating a relationship between the number of program operations of the semiconductor memory device and a change in a threshold voltage of the memory cell transistor according to the first embodiment.

Therefore, in the above-described embodiment, as illustrated in FIG. 16, the first write operation is performed in order to reduce a width of a threshold voltage distribution of the memory cell transistor MT with respect to writing of the A level. Since the second writing is performed after the width of the threshold voltage distribution at the A level has been reduced, threshold voltage distributions at the B level and the C level can be reduced.

Figure 17:
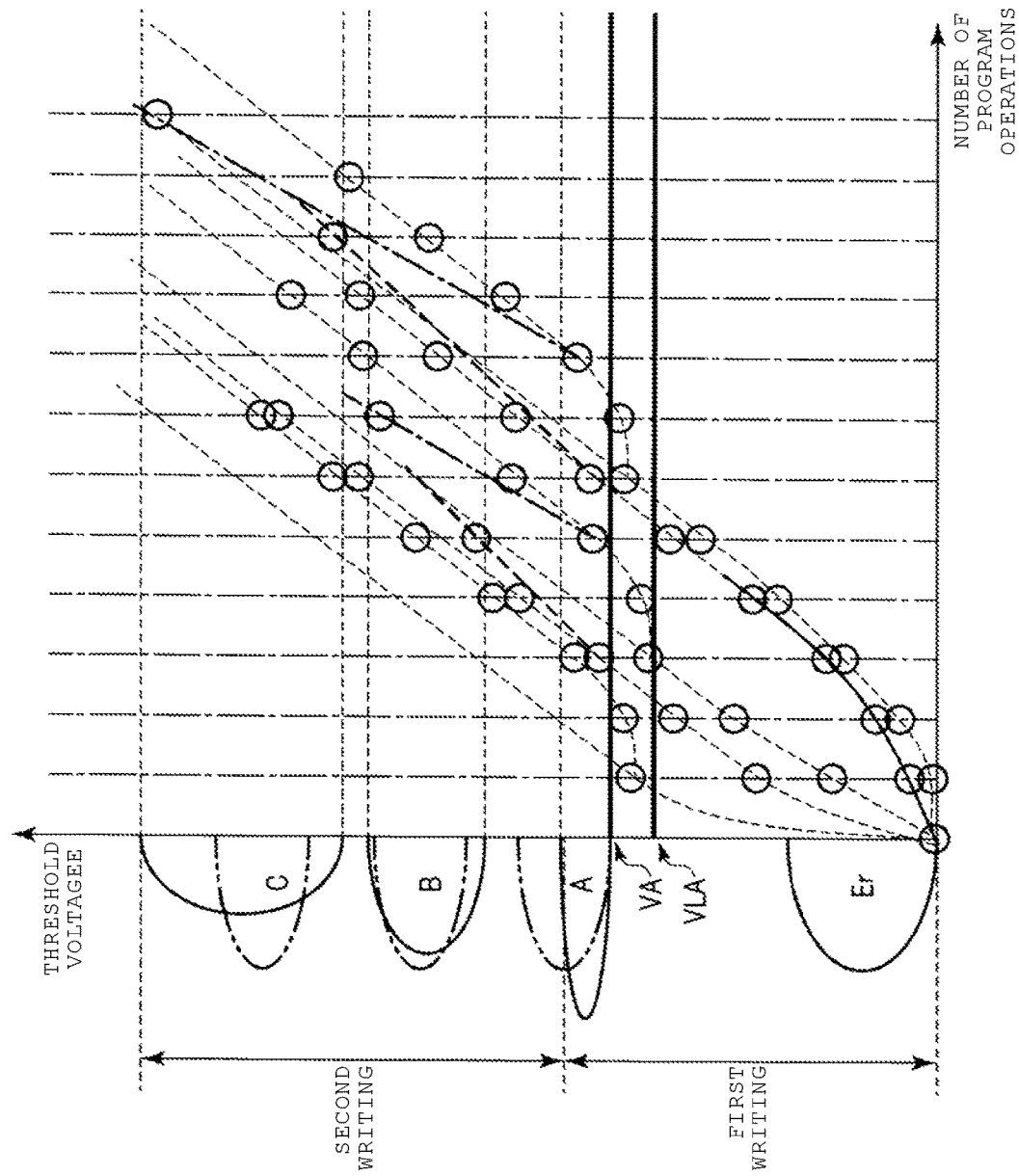
FIG. 17 is a diagram illustrating a relationship between the number of program operations of the semiconductor memory device and a change in a threshold voltage of the memory cell transistor according to the first embodiment.

For example, as described above, even in a case where characteristics (represented by the slope of the lines in the figure) of a plurality of memory cell transistors MT are not the same as each other, a width of a threshold voltage distribution of the A level is reduced, and, thus, as illustrated in FIG. 17, it is possible to prevent threshold voltage of the respective levels from overlapping with each other.

As mentioned above, according to the above-described embodiment, it is possible to eliminate program verification operations of the B level and the C level while preventing threshold voltage distributions from overlapping each other. Thus, the semiconductor memory device 100 according to the above-described embodiment can perform a write operation at a high speed and can also make threshold voltage distributions of the respective levels appropriate.

1-4. Modification Example of First Embodiment

A description will be made of a modification example of the first embodiment. In the modification, the write operation of the first embodiment is applied to a semiconductor memory device employing a sense module based on a current sense method as a sense module. The fundamental configuration and operation of the semiconductor memory device 100 according to the modification example of the first embodiment are the same as those of the semiconductor memory device 100 according to the above-described first embodiment. Therefore, the content described in the first embodiment and the content which can be easily analogized from the first embodiment will not be described.

1-4-1. Sense Amplifier Unit 1-4-1-1. Summary of Sense Amplifier Unit

Figure 18:
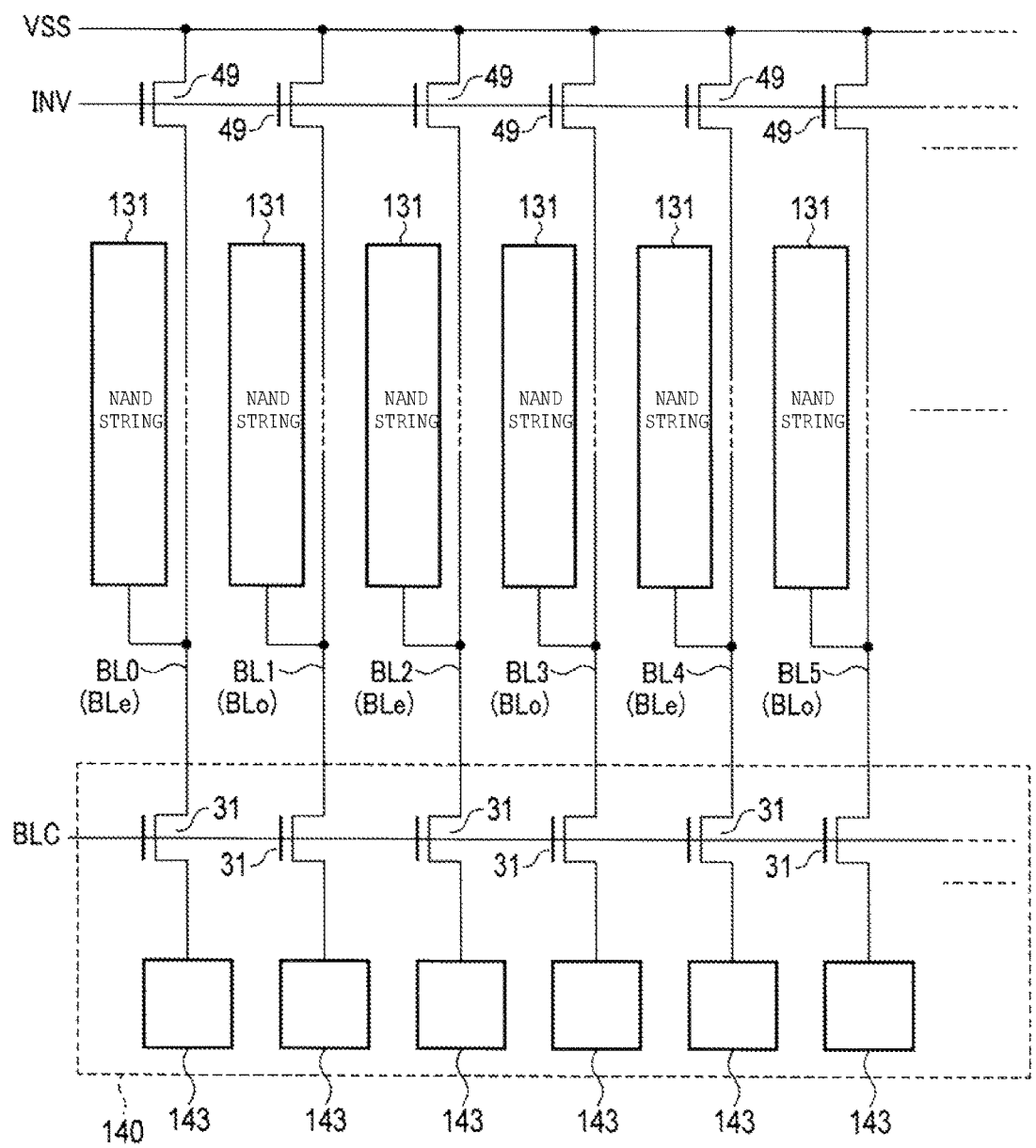
FIG. 18 is a circuit diagram illustrating a sense amplifier unit and a peripheral circuit thereof of a semiconductor memory device according to a modification example of the first embodiment.

Next, a description will be made of a summary of the sense amplifier unit 140 related to the modification example of the first embodiment with reference to FIG. 18. Regarding the sense amplifier unit 140 described in the modification, a description will be made of an example where data is determined by simultaneously driving all bit lines in the memory cell array 130 and by sensing a current for reading page data (where a page is formed of a plurality of memory cell transistors MT connected to the same word line).

The semiconductor memory device 100 according to the modification example of the first embodiment sets a selection read voltage applied to a selected word line to a constant value, and classifies a threshold voltage of a selected memory cell transistor MT on the basis of the magnitude of a cell current flowing through the selected memory cell transistor MT.

The sense amplifier unit 140 includes a plurality of sense modules 143. Each of the plurality of sense modules 143 is connected to the bit line BL via a transistor 31.

In the current sense method, regarding the sense amplifier unit 140, capacitive coupling between bit lines does not need to be taken into consideration unlike in the voltage sense method. Thus, in the voltage sense method, data is read every even-numbered bit line and every odd-numbered bit line, but, in the current sense method, all bit lines can be driven simultaneously.

1-4-1-2. Sense Module

Figure 19:
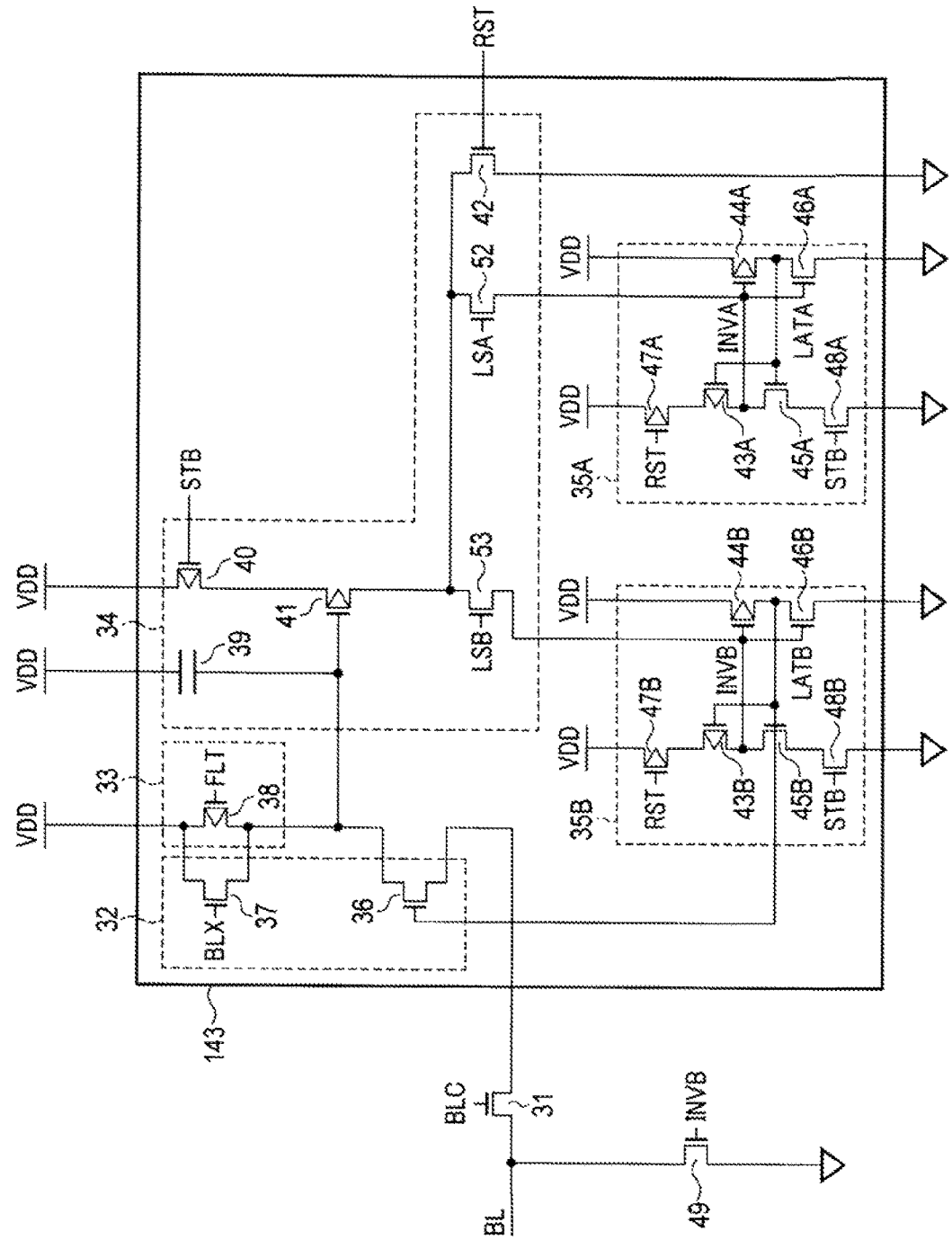
FIG. 19 is a circuit diagram of a sense module of the semiconductor memory device according to a modification example of the first embodiment.

As illustrated in FIG. 19, the sense module 143 includes a clamp circuit 32, a precharge circuit 33, a determination circuit 34, and latch circuits 35A and 35B.

The clamp circuit 32 is configured with N channel MOS transistors 36 and 37. The precharge circuit 33 is configured with a P channel MOS transistor 38. The determination circuit 34 is configured with P channel MOS transistors 40 and 41, N channel MOS transistors 42, 52 and 53, and a capacitor 39.

The latch circuit 35A includes two inverters which are connected to each other in a flip-flop manner, that is, P channel MOS transistors 43A and 44A, and N channel MOS transistors 45A and 46A. A P channel MOS transistor 47A and an N channel MOS transistor 48A are used to control activation and deactivation of the latch circuit 35A.

A voltage of a sense node SEN is latched in the latch circuit 35A via the N channel MOS transistor 52. The data latched in the latch circuit 35A is not used for a lockout operation in which the sense node SEN is forced to be disconnected from a bit line.

The latch circuit 35B includes two inverters which are connected to each other in a flip-flop manner, that is, P channel MOS transistors 43B and 44B, and N channel MOS transistors 45B and 46B. A P channel MOS transistor 47B and an N channel MOS transistor 48B are used to control activation and deactivation of the latch circuit 35B.

A voltage of the sense node SEN is latched in the latch circuit 35B via the N channel MOS transistor 53. The data latched in the latch circuit 35B is used for the lockout operation in which the sense node SEN is forced to be disconnected from a bit line.

The N channel MOS transistor 31 is connected between the sense module 143 and the bit line BL. A NAND cell unit 21 is connected to the bit line BL. The N channel MOS transistor 49 is used to release electric charge in the bit line BL. Turning-on and turning-off of an N channel MOS transistor 49 are determined on the basis of data latched in the latch circuit 35B.

A configuration of the sense module 143 may employ various configurations such as disclosed in, for example, U.S. patent application Ser. No. 12/563,296, filed on Sep. 21, 2009, entitled "NONVOLATILE SEMICONDUCTOR MEMORY." The entire contents of this patent application are incorporated by reference in the present application.

1-4-2. Operation 1-4-2-1. Principle of Program Verification Operation

Figure 20:
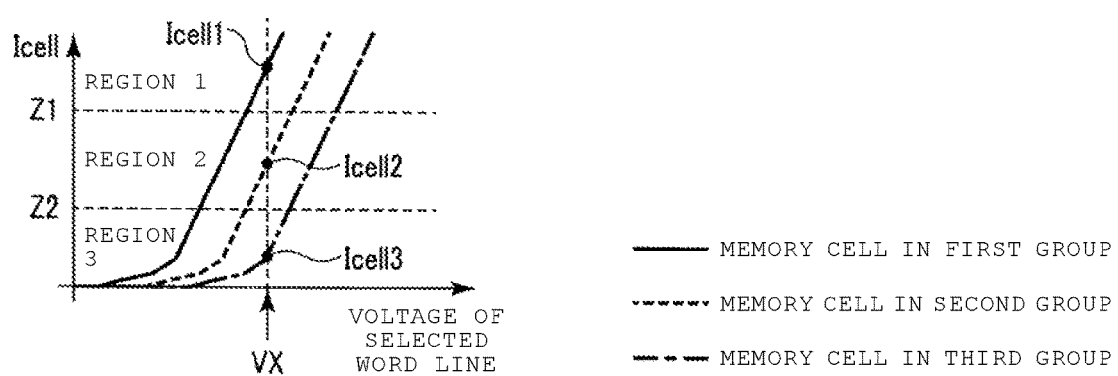
FIG. 20 is a diagram illustrating a principle of a program verification operation of the semiconductor memory device according to a modification example of the first embodiment.

FIG. 20 is a diagram illustrating a principle of a program verification operation of the semiconductor memory device 100 according to a modification example of the first embodiment.

As described with reference to FIG. 7, in the first embodiment, three threshold voltage states (first to third groups) of the selected memory cell transistor MT which is a write target are identified by performing two program verification operations. However, in the modification, three threshold voltage states (first to third groups) of the selected memory cell transistor MT which is a write target can be identified by performing a single program verification operation in the same manner as in FIG. 7.

Specifically, a selection read voltage applied to a selected word line is set to a constant voltage (for example, VX), and, in this case, it is determined in which region of three regions (a region 1, a region 2, and a region 3) classified by two values Z1 and Z2 a cell current Icell flowing through the selected memory cell transistor MT is included, and thus a threshold voltage of the selected memory cell transistor MT is classified as one of the first to third groups.

For example, if a selection read voltage is V1, a cell current flowing through the memory cell transistor MT (first cell) in the first group is Icell1, a cell current flowing through the memory cell transistor MT (second cell) in the second group is Icell2, and a cell current flowing through the memory cell transistor MT (third cell) in the third group is Icell3.

Here, a relationship of Icell1>Icell2>Icell3 is satisfied.

In the first writing in the above-described first embodiment, two values are used as a selection read voltage, and the presence or absence of a cell current flowing through the selected memory cell transistor MT is detected. In other words, in the first writing in the first embodiment, the detection of a cell current is made, and thus two program verification operations are necessary.

Therefore, in the modification, the magnitude of a cell current is determined instead of detecting the presence or absence of a cell current, a threshold voltage of the selected memory cell transistor MT is classified into three groups through a single program verification operation.

The determination of the magnitude of a cell current flowing through the selected memory cell transistor MT may be performed, for example, by precharging a sense node of the sense module, and by using a voltage of the sense node at a first time point at which a first period elapses from the discharge starting time of releasing electric charge of the sense node due to a cell current flowing through the selected memory cell transistor MT and a voltage of the sense node at a second time point at which a second period longer than the first period elapses from the discharge starting time.

According to the modification, since a threshold voltage of the selected memory cell transistor MT can be classified through a single program verification operation, a setup period for changing a voltage of a selected word line or a recovery period for a bit line after a lockout operation is not necessary compared with a case where a threshold voltage of the selected memory cell transistor MT is classified through two program verification operations.

Therefore, it is possible to perform a write operation at a high speed by reducing program verification operation time.

1-4-2-2. Program Verification Operation

Figure 21:
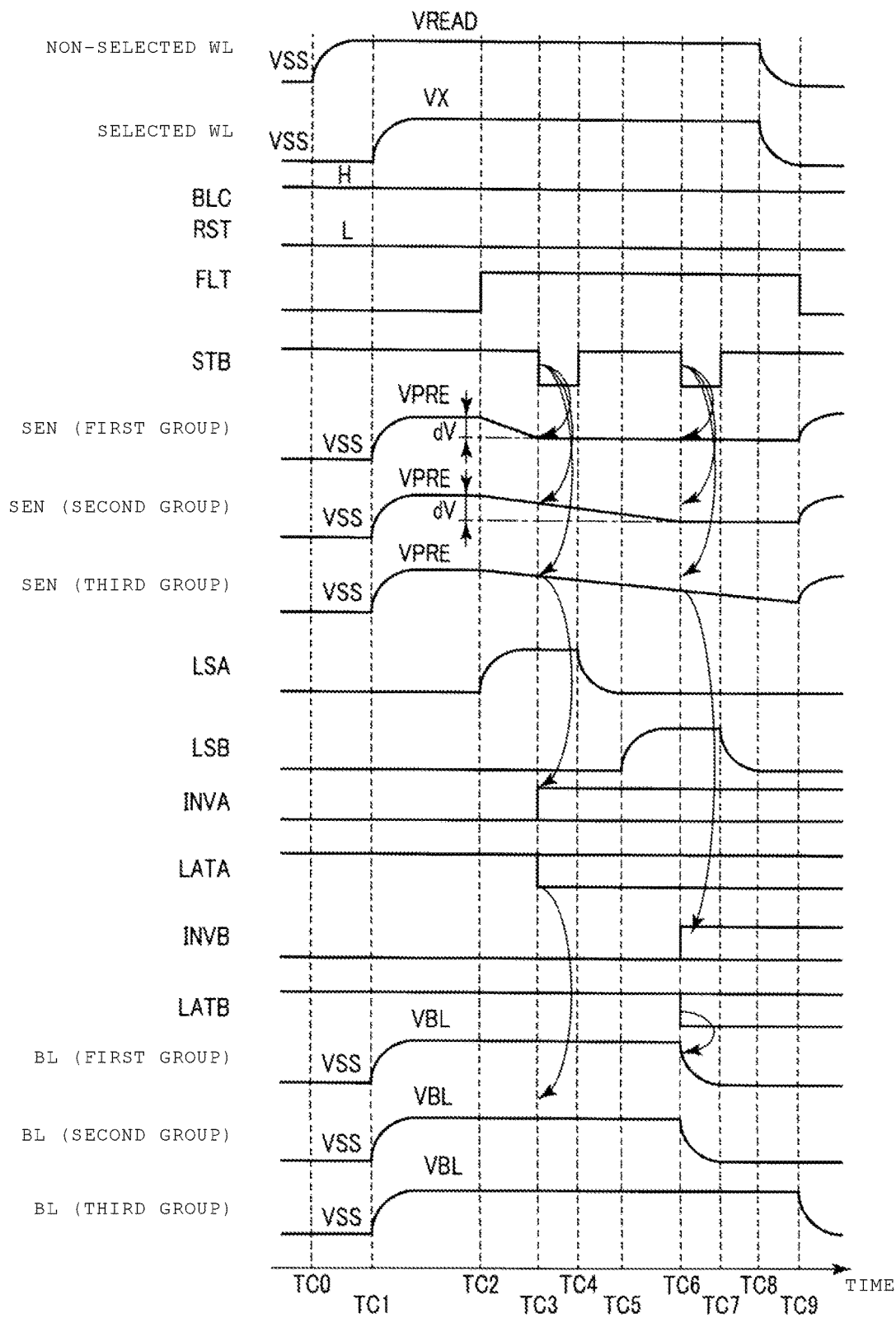
FIG. 21 is a waveform diagram illustrating the program verification operation of the semiconductor memory device according to the modification example of the first embodiment.

With reference to FIG. 21, a description will be made of a fundamental operation waveform of a program verification operation of the semiconductor memory device 100 according to the modification.

Time Point TC0 to Time Point TC1

At a time point TC0, the row decoder 150 applies a non-selection read voltage VREAD to a non-selected word line.

Time Point TC1 to Time Point TC2

At a time point TC1, the row decoder 150 applies a selection read voltage VX (where VX<VREAD) to a selected word line.

The sequencer 111 charges the sense node SEN with a precharge voltage VPRE, and causes a control signal FLT to transition to an "H" level in a state in which the bit line BL is fixed to a constant voltage (for example, VBL), and thus a voltage of the sense node SEN is obtained as follows according to a threshold voltage of the selected memory cell transistor MT.

If a threshold voltage of the selected memory cell transistor MT is less than the selection read voltage, a large cell current flows through the selected memory cell transistor MT, and thus a voltage of the sense node SEN is reduced fast. If a threshold voltage of the selected memory cell transistor MT is more than the selection read voltage, a small cell current flows through the selected memory cell transistor MT, or a cell current does not flow through the selected memory cell transistor MT, and a potential of the sense node SEN is reduced slowly.

Time Point TC2 to Time Point TC4

Therefore, the sequencer 111 causes a control signal LSA to transition to an "H" level, and turns on the N channel MOS transistor 52 in FIG. 19. If a control signal STB is caused to transition to an "L" level at a first time point TC3 at which a first period elapses from the discharge starting time TC2 of starting to release electric charge of the sense node SEN, that is, at a time point at which the first period elapses from the transition of the control signal FLT to an "H" level, a voltage of the sense node SEN is latched in the latch circuit 35A in FIG. 19.

For example, in a case where the selected memory cell transistor MT is included in the first group, a threshold voltage thereof is less than the selection read voltage, and a difference between both of the two values is great. Therefore, a large cell current flows through the selected memory cell transistor MT. Thus, a voltage of the sense node SEN is rapidly reduced, a voltage drop amount reaches dV before the time point TC3, and the sense node SEN transitions to an "L" level at the time point TC3.

Therefore, an input node INVA of the latch circuit 35A transitions to an "H" level, and an output node LATA of the latch circuit 35A transitions to an "L" level. However, at this time, a lockout operation, in which the sense node SEN is forced to be disconnected from the bit line BL so that the bit line BL is discharged, is not performed.

In a case where the selected memory cell transistor MT is included in the second group, a threshold voltage thereof is less than the selection read voltage, and a difference between both of the two values is small. Therefore, a small cell current flows through the selected memory cell transistor MT. Thus, a voltage of the sense node SEN is smoothly reduced, a voltage drop amount does not reach dV before the time point TC3, and the sense node SEN is still at an "H" level at the time point TC3.

Therefore, the input node INVA of the latch circuit 35A transitions to an "L" level, and the output node LATA of the latch circuit 35A transitions to an "H" level.

In a case where the selected memory cell transistor MT is included in the third group, a threshold voltage thereof is more than the selection read voltage, and thus a considerably small cell current flows through the selected memory cell transistor MT, or a cell current does not flow through the selected memory cell transistor MT. Thus, a voltage of the sense node SEN is considerably smoothly reduced, a voltage drop amount does not reach dV before the time point TC3, and the sense node SEN is still at an "H" level at the time point TC3.

Therefore, the input node INVA of the latch circuit 35A transitions to an "L" level, and the output node LATA of the latch circuit 35A transitions to an "H" level.

As mentioned above, first, a write deficiency cell of the first group is sorted.

Thereafter, a control signal LSA is caused to transition to an "L" level so that the N channel MOS transistor 52 is turned off in FIG. 19.

Time Point TC5 to Time Point TC7

Next, the sequencer 111 causes a control signal LSB to transition to an "H" level so that the N channel MOS transistor 53 is turned on in FIG. 19. If the control signal STB is caused to transition to an "L" level at a second time point TC6 at which a second period longer than the first period elapses from the discharge starting time TC2 of starting to release electric charge of the sense node SEN, that is, at a time point at which the second period elapses from the transition of the control signal FLT to an "H" level, a voltage of the sense node SEN is latched in the latch circuit 35B in FIG. 19.

For example, in a case where the selected memory cell transistor MT is included in the first group, a voltage of the sense node SEN is rapidly reduced, and a voltage drop amount already reaches dV before the time point TC3. Therefore, the sense node SEN is at an "L" level at the time point TC6.

Therefore, an input node INVB of the latch circuit 35B transitions to an "H" level, and an output node LATB of the latch circuit 35B transitions to an "L" level.

Thereafter, the N channel MOS transistor 36 is turned off, and thus the sense node SEN is disconnected from the bit line BL (lockout operation). The N channel MOS transistor 49 is turned on, and thus the bit line BL is discharged.

In a case where the selected memory cell transistor MT is included in the second group, a threshold voltage thereof is less than the selection read voltage, and a difference between both of the two values is small. Therefore, a small cell current flows through the selected memory cell transistor MT. Thus, a voltage of the sense node SEN is smoothly reduced, a voltage drop amount reaches dV before the time point TC6, and the sense node SEN transitions to an "L" level at the time point TC6.

Therefore, an input node INVB of the latch circuit 35B transitions to an "H" level, and an output node LATB of the latch circuit 35B transitions to an "L" level.

Thereafter, the N channel MOS transistor 36 is turned off, and thus the sense node SEN is disconnected from the bit line BL (lockout operation). The N channel MOS transistor 49 is turned on, and thus the bit line BL is discharged.

In a case where the selected memory cell transistor MT is included in the third group, a threshold voltage thereof is more than the selection read voltage, and thus a considerably small cell current flows through the selected memory cell transistor MT, or a cell current does not flow through the selected memory cell transistor MT. Thus, a voltage of the sense node SEN is considerably smoothly reduced, a voltage drop amount does not reach dV before the time point TC6, and the sense node SEN is still at an "H" level at the time point TC6.

Therefore, the input node INVB of the latch circuit 35B transitions to an "L" level, and the output node LATB of the latch circuit 35B transitions to an "H" level.

As mentioned above, the second cell of the second group and the third cell of third group are sorted.

FIG. 22 illustrates a relationship between data INVA and INVB latched in the two latch circuits and the three groups.

As illustrated in FIG. 22, in a case where both of INVA and INVB are at an "H" level, the selected memory cell transistor MT is determined as being included in the first group (the region 1 in FIG. 20), and is thus recognized as the first cell.

As illustrated in FIG. 22, in a case where both of INVA is at an "L" level, and the INVB is at an "H" level, the selected memory cell transistor MT is determined as being included in the second group (the region 2 in FIG. 20), and is thus recognized as the second cell.

As illustrated in FIG. 22, in a case where both of INVA and INVB are at an "L" level, the selected memory cell transistor MT is determined as being included in the third group (the region 3 in FIG. 20), and is thus recognized as the first cell.

As described above, according to the first embodiment, it is possible to classify a threshold voltage of the selected memory cell transistor MT into three groups through a single program verification operation by using a difference in the magnitude of a sense current flowing through the selected memory cell transistor MT.

In the following description, a program verification operation based on the current sense method is performed by referring to the above-described program verification operation.

1-4-2-3. Operation Flow of Write Operation

The above-described sense module and program verification operation are also applicable to the operation flow described with reference to FIGS. 10 to 12. For simplification, herein, a description will be made of the content of steps S1003 to S1005 in FIG. 11 which is different from the content described in the first embodiment.

Step S1003

The sequencer 111 performs a program verification operation in order to determine whether or not a write target memory cell transistor MT is included in the first to third groups. In this case, the sequencer 111 performs the program verification operation by using the voltage VA.

Step S1004

The sequencer 111 determines whether or not all write target memory cell transistors MT have passed the program verification operation.

Step S1005

If any memory cell transistors MT have not passed the program verification operation (NO in step S1004) among the write target memory cell transistors MT, the sequencer 111 determines in which group of the first to third groups the write target memory cell transistor MT is included. The sequencer 111 resets various voltages on the basis of a determined group, and performs step S1002.

The operations illustrated in FIGS. 10 to 12 are based on the operation described with reference to FIG. 7. Thus, in a case where a method of applying the first writing and the second writing is changed, an operation flow of a write operation of the semiconductor memory device 100 according to the modification example of the first embodiment is also changed according to the method of applying the first writing and the second writing.

1-4-2-4. Specific Example of Pulse

Figure 23:
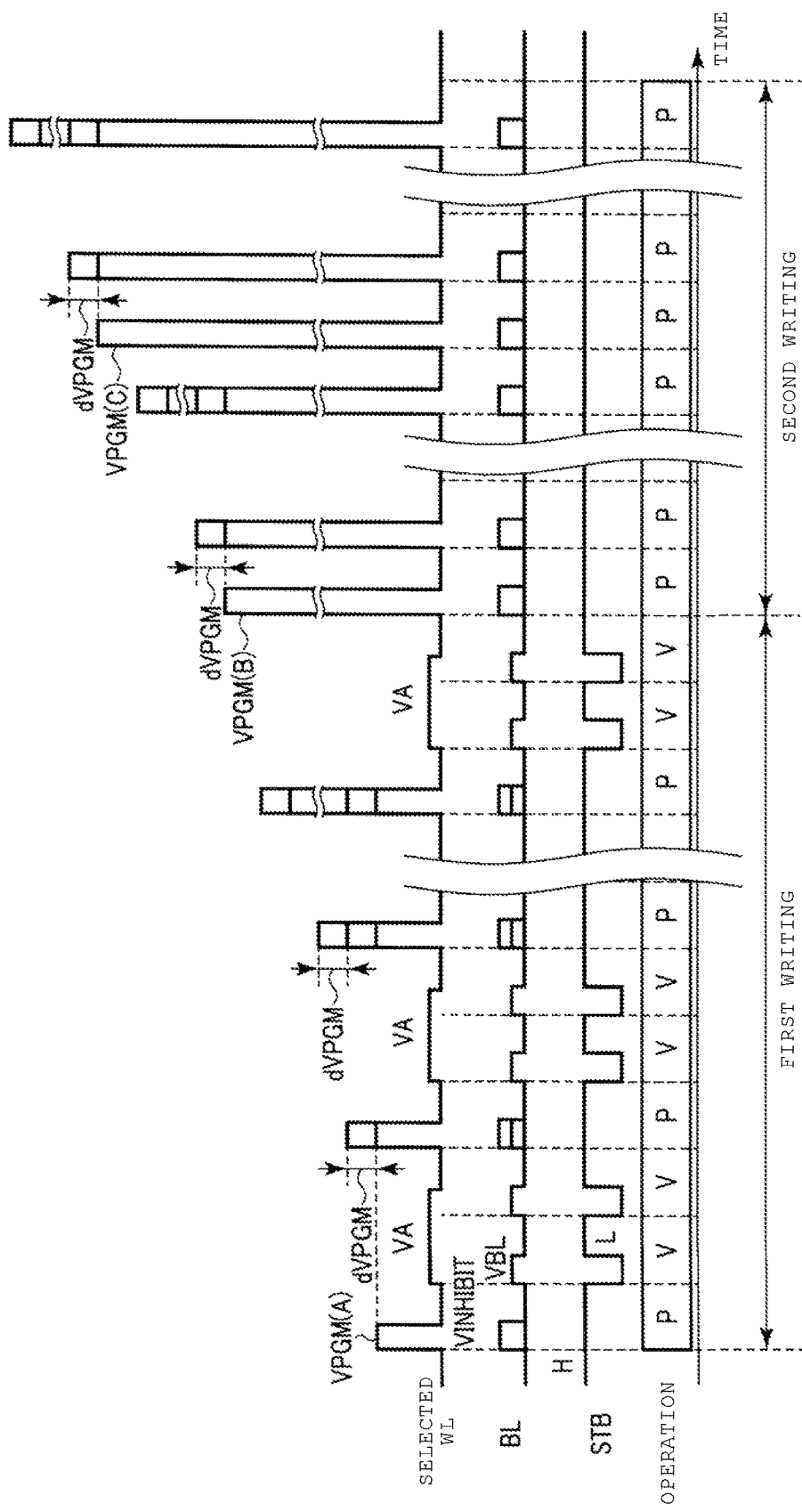
FIG. 23 is a diagram illustrating pulses during a write operation of the semiconductor memory device according to a modification example of the first embodiment.

Next, with reference to FIG. 23, a description will be made of a specific pulse example when the write operation of the first embodiment is applied to the sense module of the modification example of the first embodiment. In FIG. 23, for simplification, only waveforms of a selected word line WL, the bit line BL, and STB are illustrated.

For simplification, in FIG. 23, with respect to a program operation, the voltage VPGM applied to the selected word line WL between the time point T3 and the time point T4 in FIG. 8 is illustrated as pulses. With respect to a program verification operation, the voltages VA and the signal STB applied to the selected word line WL between the time point TC1 and the time point TC7 in FIG. 21 are illustrated as pulses. In other words, the "pulse" in a program operation indicates the voltage VPGM applied to the selected word line WL between the time point T3 and the time point T4 in FIG. 8. Similarly, the "pulses" in a program verification operation indicate "L" level periods of a voltage VX (where X is any level) and the signal STB applied to the selected word line WL between the time point TC1 and the time point TC7 in FIG. 21.

A lower part in FIG. 23 illustrates operation states. In the figure, P indicates a program operation, and V indicates a program verification operation.

The sequencer 111 increases the voltage VPGM(X) by the voltage dVPGM every time a program operation is performed.

A program operation is the same manner as in FIG. 13, and a description thereof will be omitted.

First, the sequencer 111 performs the first writing. The sequencer 111 performs a program operation on the memory cell transistor MT and then performs a program verification operation. More specifically, the sequencer 111 applies the verification voltage VA to the word line WL, and causes the signal STB to fall twice so as to performs a program verification operation on the memory cell transistor MT.

When a program operation is performed, the sequencer 111 applies the voltage VSS to the bit line BL related to the first group, applies the voltage VBL to the bit line BL related to the second group, and applies the voltage VINHIBIT to the bit line BL related to the third group, on the basis of a result of the program verification operation. The sequencer 111 performs a write operation on a write target memory cell transistor MT according to the same method as the method described in FIG. 13.

The second writing is the same as the operation described in FIG. 13, and a description thereof will be omitted.

As mentioned above, in the first embodiment, the sequencer 111 changes a voltage applied to a selected word line whenever the first and second program verification operations are performed. However, in the modification example of the first embodiment, the signal STB falls twice during a single program verification operation without changing a voltage applied to a selected word line.

The operation in FIG. 23 is similar to the operation described with reference to FIG. 7. Thus, in a case where a method of applying the first writing and the second writing is changed, pulses in a write operation of the semiconductor memory device 100 according to the modification example of the first embodiment are also changed according to the method of applying the first writing and the second writing.

1-4-3. Effects

As mentioned above, the current sense method described in the modification example of the first embodiment is applicable to the write method described in the first embodiment. Consequently, the semiconductor memory device 100 employing the current sense method can also achieve the same effects as the effects described in the first embodiment.

2. Second Embodiment

A second embodiment will be described. In the second embodiment, a description will be made of a case where a memory cell transistor stores 8-level data, and the write operation of the first embodiment is applied to a semiconductor memory device employing a sense module (the sense module described in the first embodiment) based on the voltage sense method as a sense module. The fundamental configuration and operation of the semiconductor memory device 100 according to the second embodiment are the same as those of the semiconductor memory device 100 according to the above-described first embodiment. Therefore, the content described in the first embodiment and the content which can be easily analogized from the first embodiment will not be described.

2-1. Configuration 2-1-1. Summary of Sense Amplifier Unit

A configuration and an operation of the sense amplifier unit 140 according to the second embodiment are the same as those of the sense amplifier unit 140 described in the first embodiment.

2-1-2. Relationship Between Threshold Voltage Distribution Memory Cell Transistor and Data With reference to FIG. 24, a description will be made of a relationship between a threshold voltage distribution of the memory cell transistor MT and data.

Figure 24:
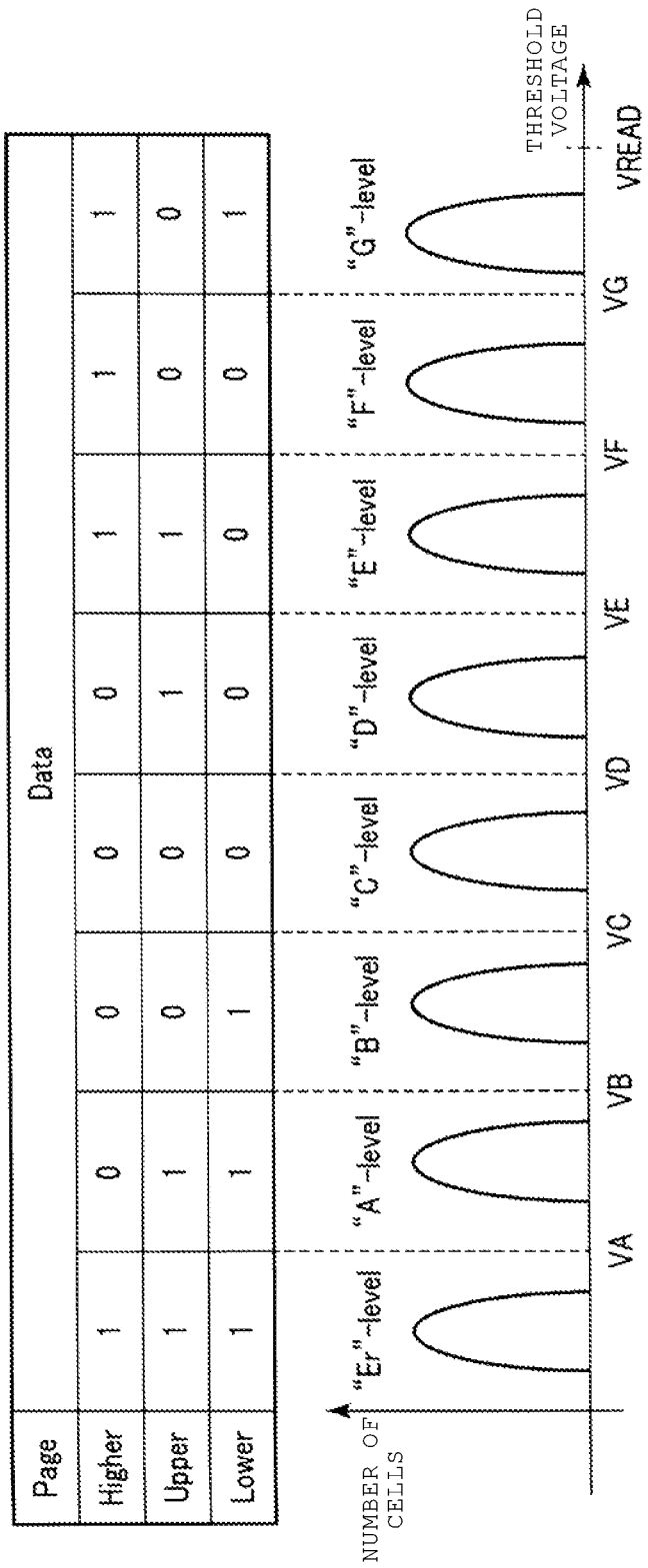
FIG. 24 is a diagram illustrating a relationship between a threshold voltage distributions and data of a memory cell transistor of a semiconductor memory device according to a second embodiment.

As illustrated in FIG. 24, each of the memory cell transistors MT can retain, for example, 3-bit data according to a threshold voltage thereof. The 3-bit data is, for example, "111", "011", "001", "000", "010", "110", "100", and "101" in ascending order of threshold voltages.

A threshold voltage of the memory cell transistor MT retaining data of "111" is within a predetermined distribution, and a threshold voltage distribution corresponding to the data of "111" will be referred to as an "Er" level. The Er level is a threshold voltage distribution in a state in which electric charge in the charge storage layer is removed, and thus data is erased, and has a positive or negative voltages (for example, below voltage VA).

"011", "001", "000", "010", "110", "100", and "101" are threshold voltage distributions in a state in which electric charge is injected into the charge storage layer, and thus data is written.

A threshold voltage of the memory cell transistor MT retaining data of "011" is within an "A" level distribution, and is greater than a threshold voltage in the "Er" level (for example, equal to or more than the voltage VA and less than a voltage VB where VA<VB).

A threshold voltage of the memory cell transistor MT retaining data of "001" is within an "B" level distribution, and is greater than a threshold voltage in the "A" level (for example, equal to or more than the voltage VB and less than a voltage VC where VB<VC).

A threshold voltage of the memory cell transistor MT retaining data of "000" is within a "C" level distribution, and is greater than a threshold voltage in the "B" level (for example, equal to or more than the voltage VC and less than a voltage VD where VC<VD).

A threshold voltage of the memory cell transistor MT retaining data of "010" is within a "D" level distribution, and is greater than a threshold voltage in the "C" level (for example, equal to or more than the voltage VD and less than a voltage VE where VD<VE).

A threshold voltage of the memory cell transistor MT retaining data of "110" is within an "E" level distribution, and is greater than a threshold voltage in the "D" level (for example, equal to or more than the voltage VE and less than a voltage VF where VE<VF).

A threshold voltage of the memory cell transistor MT retaining data of "100" is within an "F" level distribution, and is greater than a threshold voltage in the "E" level (for example, equal to or more than the voltage VF and less than a voltage VG where VF<VG).

A threshold voltage of the memory cell transistor MT retaining data of "101" is within a "G" level distribution, and is greater than a threshold voltage in the "F" level (for example, equal to or more than the voltage VG).

Of course, a relationship between 3-bit data and a threshold voltage is not limited to this relationship, and, for example, the data of "111" may correspond to the "G" level, and a relationship between both of the two may be selected as appropriate.

2-2. Operation 2-2-1. Summary of Write Operation

Figure 25:
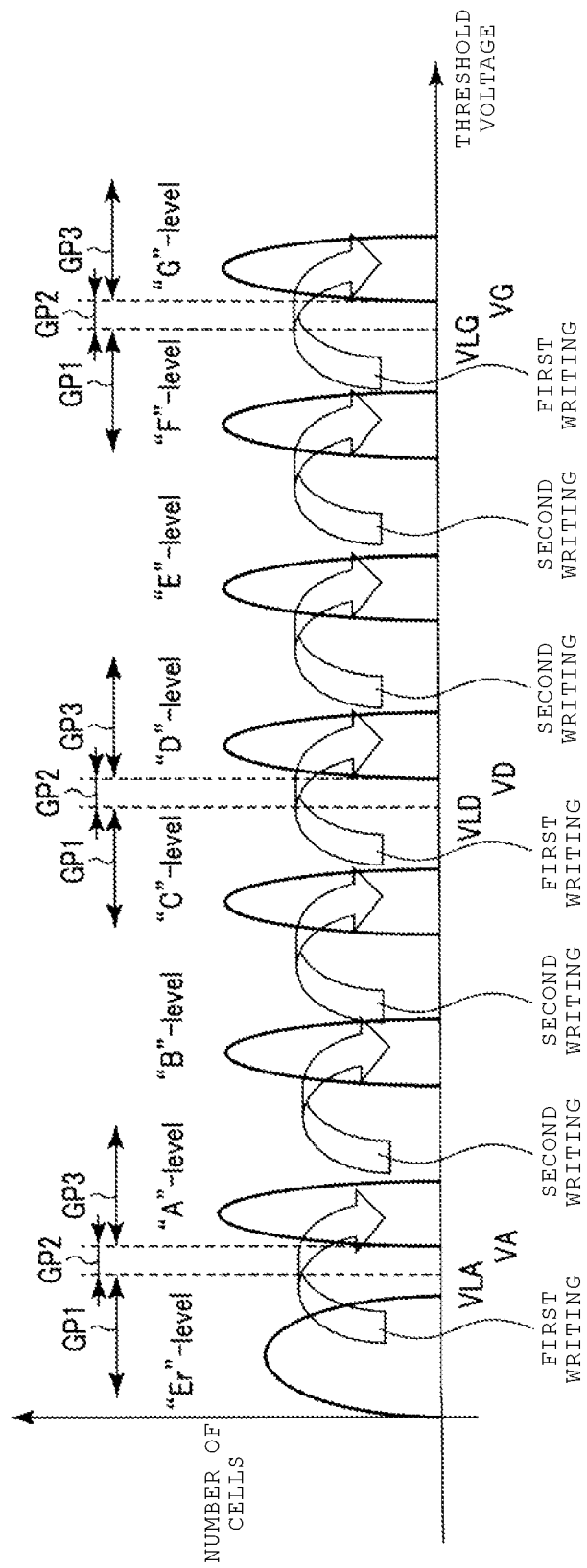
FIG. 25 is a diagram illustrating a write operation of the semiconductor memory device according to the second embodiment.

With reference to FIG. 25, a description will be made of a summary of a write operation of the semiconductor memory device according to the second embodiment.

In the second embodiment, when the sequencer 111 performs a write operation on the memory cell array 130, two types of write methods, first writing and second writing, are performed in the same manner as in the first embodiment.

In the second embodiment, a description will be made of a write method of causing a threshold voltage distribution to transition from the Er level to the A level, the B level, the C level, the D level, the E level, the F level, and the G level in this order.

As illustrated in FIG. 25, in the second embodiment, the first writing is applied to writing of the A level from the Er level, writing of the D level from the C level, and writing of the G level from the F level. The second writing is applied to writing of the B level from the A level, writing of the C level from the B level, writing of the E level from the D level, and writing of the F level from the E level. However, a method of applying the first writing and the second writing is not limited to the above description.

When the first writing is performed, the sequencer 111 determines in which group of the first to third groups the selected memory cell transistor MT is included.

2-2-2. Operation Flow of Write Operation

Next, with reference to FIGS. 26 to 31, a description will be made of an operation flow of a write operation of the semiconductor memory device 100 according to the second embodiment, and an operation flow based on the operation described in FIG. 25. The sense module based on the voltage sense method and the program verification operation described in the first embodiment are used for the second embodiment.

Figure 26:
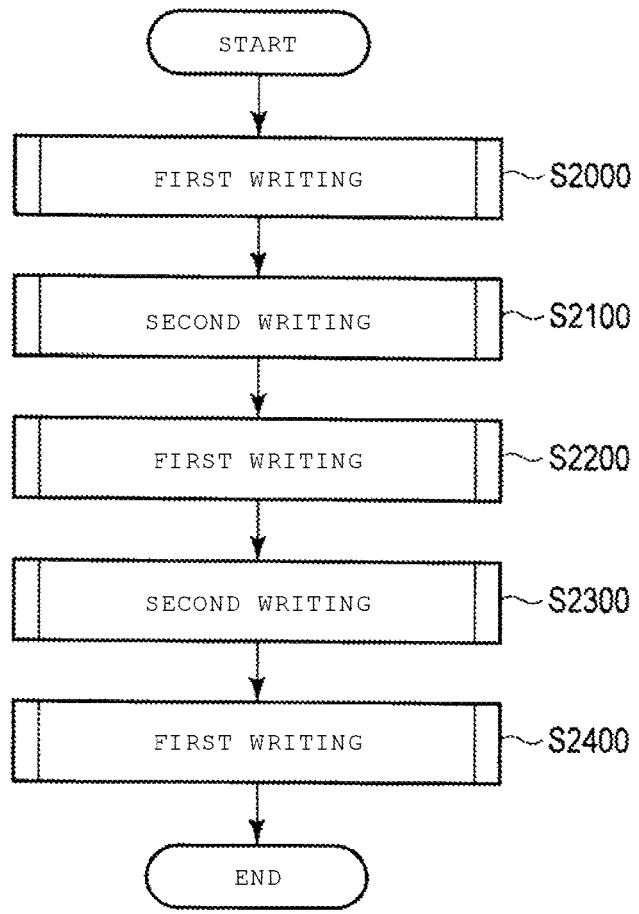
FIG. 26 is a flowchart illustrating a write operation of the semiconductor memory device according to the second embodiment.

As illustrated in FIG. 26, the semiconductor memory device 100 in a write operation of the second embodiment performs the first writing (step S2000) regarding writing of the A level from the Er level, and then performs the second writing (step S2100) regarding writing of the B level from the A level and writing of the C level from the B level. Next, the semiconductor memory device 100 performs the first writing (step S2200) regarding writing of the D level from the C level, and then performs the second writing (step S2300) regarding writing of the E level from the D level and writing of the F level from the E level. The semiconductor memory device 100 performs the first writing (step S2400) regarding writing of the G level from the F level, and then finishes the write operation.

Figure 27:
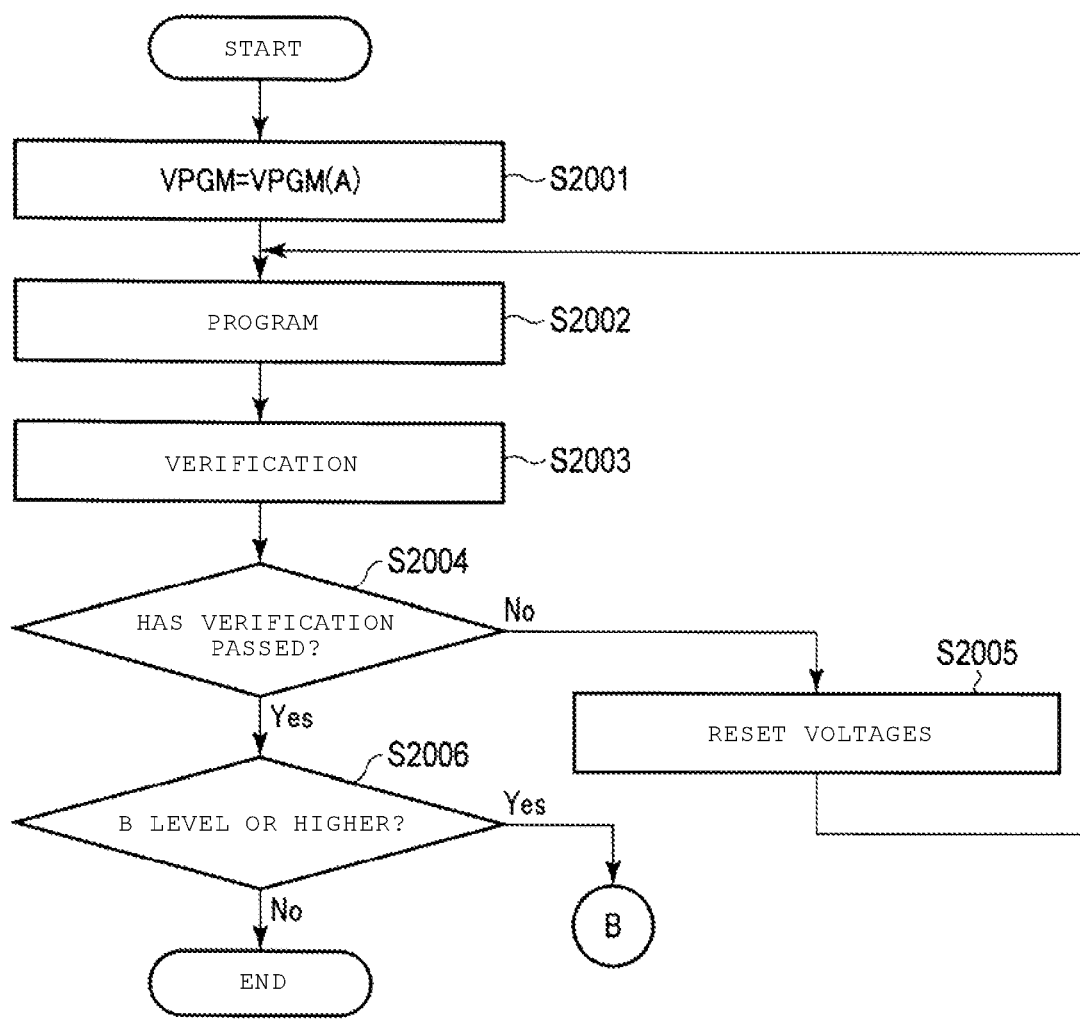
FIG. 27 is a flowchart illustrating a write operation of the semiconductor memory device according to the second embodiment.

With reference to FIG. 27, a description will be made of an operation flow of the first writing (step S2000) regarding writing of the A level from the Er level.

Step S2001 to step S2006

The semiconductor memory device 100 performs the same operations as those in steps S1001 to S1006.

Figure 28:
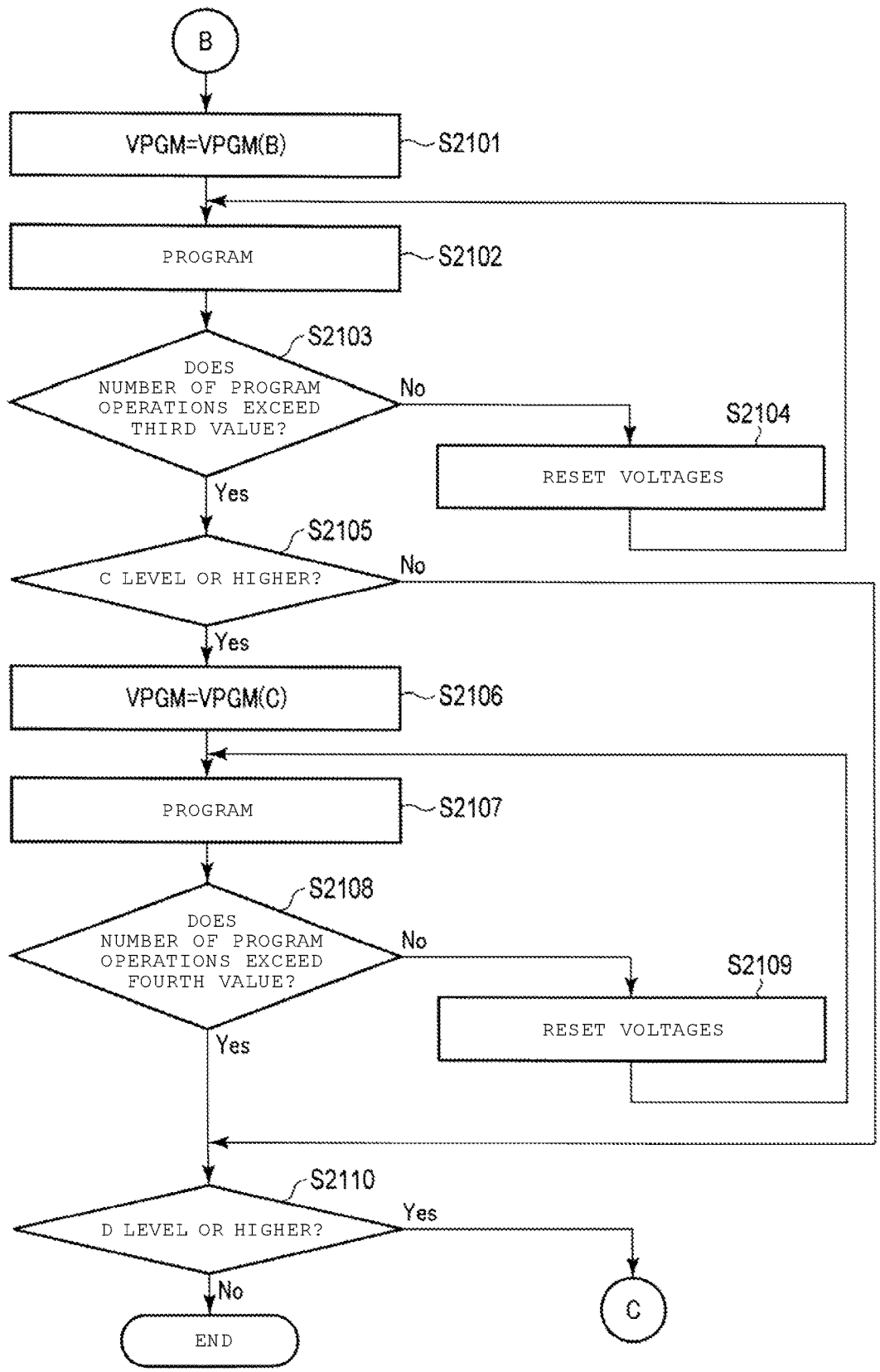
FIG. 28 is a flowchart illustrating a write operation of the semiconductor memory device according to the second embodiment.

With reference to FIG. 28, a description will be made of an operation flow of the second writing (step S2100) regarding writing of the B level from the A level and writing of the C level from the B level.

Step S2101 and Step S2102

The semiconductor memory device 100 performs the same operations as those in step S1101 and step S1102.

Step S2103

As described above, in the second writing, the number of program operations is restricted. The sequencer 111 counts the number of times of execution (the number of program operations) of step S2102, and determines whether or not the number of times of execution exceeds a third value (the number of B level program operations) stored in the register 112.

Step S2104

When the number of times of step S2102 does not exceed the third value (NO in step S2103), the sequencer 111 resets various voltages so as to perform step S2102. Specifically, the sequencer 111 increases the program voltage VPGM by dVPGM.

Step S2105

When the number of times of step S2102 exceeds the third value (YES in step S2103), the sequencer 111 determines whether or not there is a memory cell transistor MT into which data of the C level or higher is to be written.

Once no memory cell transistor MT into which data of the C level or higher is to be written (NO in step S2105) has been confirmed, the sequencer 111 finishes the write operation.

Step S2106 and step S2107

The semiconductor memory device 100 performs the same operations as those in step S1106 and step S1107.

Step S2108

The sequencer 111 counts the number of times of execution (the number of program operations) of step S2107, and determines whether or not the number of times of execution exceeds a fourth value (the number of C level program operations) stored in the register 112. The fourth value may be the number of program operations after the A level program operation is completed, and the number of program operations after the B level program operation is completed.

Step S2109

When the number of times of step S2107 does not exceed the fourth value (NO in step S2108), the sequencer 111 resets various voltages so as to perform step S2107. Specifically, the sequencer 111 increases the program voltage VPGM by dVPGM.

Step S2110

When the number of times of step S2107 exceeds the fourth value (YES in step S2108), the sequencer 111 determines whether or not there is a memory cell transistor MT into which data of the D level or higher is to be written.

Once no memory cell transistor MT into which data of the D level or higher is to be written (NO in step S2110) has been confirmed, the sequencer 111 finishes the write operation.

Figure 29:
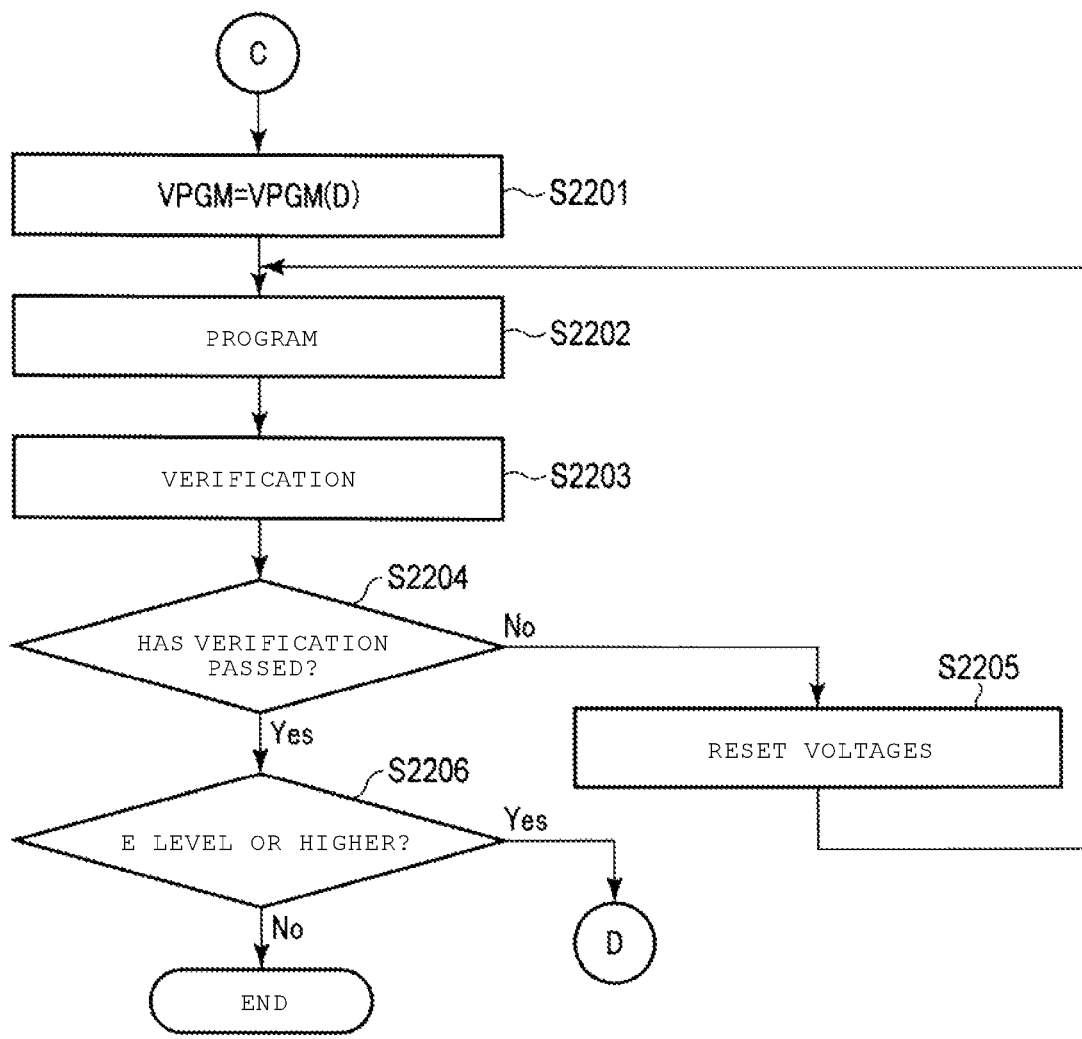
FIG. 29 is a flowchart illustrating a write operation of the semiconductor memory device according to the second embodiment.

With reference to FIG. 29, a description will be made of an operation flow of the first writing (step S2200) regarding writing of the D level from the C level.

Step S2201

The sequencer 111 sets a program voltage VPGM to a D level program voltage VPGM(D).

Step S2202

The sequencer 111 performs a D level program operation on a target memory cell transistor MT by using the program voltage.

Step S2203

Next, the sequencer 111 performs a first program verification operation in order to determine whether or not a write target memory cell transistor MT is included in the first group. In this case, the sequencer 111 performs a program verification operation by using the voltage VLD.

Next, the sequencer 111 performs a second program verification operation in order to determine whether or not the write target memory cell transistor MT is included in the second group. In this case, the sequencer 111 performs a program verification operation by using the voltage VD (where VLD<VD).

Step S2204

The sequencer 111 determines whether or not all write target memory cell transistors MT have passed the second program verification operation.

Step S2205

If any memory cell transistors MT have not passed the first and second program verification operations (NO in step S2204) among the write target memory cell transistors MT, the sequencer 111 determines in which group of the first to third groups the write target memory cell transistor MT is included. The sequencer 111 resets various voltages on the basis of a determined group, and performs step S2202.

Specifically, the sequencer 111 increases the program voltage VPGM by dVPGM, sets a voltage of the bit line BL included in the first group to the voltage VSS, sets a voltage of the bit line BL included in the second group to the voltage VBL, and sets a voltage of the bit line BL included in the third group to the voltage VINHIBIT.

Step S2206

Once all of the write target memory cell transistors MT have passed the second program verification operation (YES in step S2204), the sequencer 111 determines whether or not there is a memory cell transistor MT into which data of the E level or higher is to be written.

Once no memory cell transistor MT into which data of the E level or higher is to be written (NO in step S2206) has been confirmed, the sequencer 111 finishes the write operation.

Figure 30:
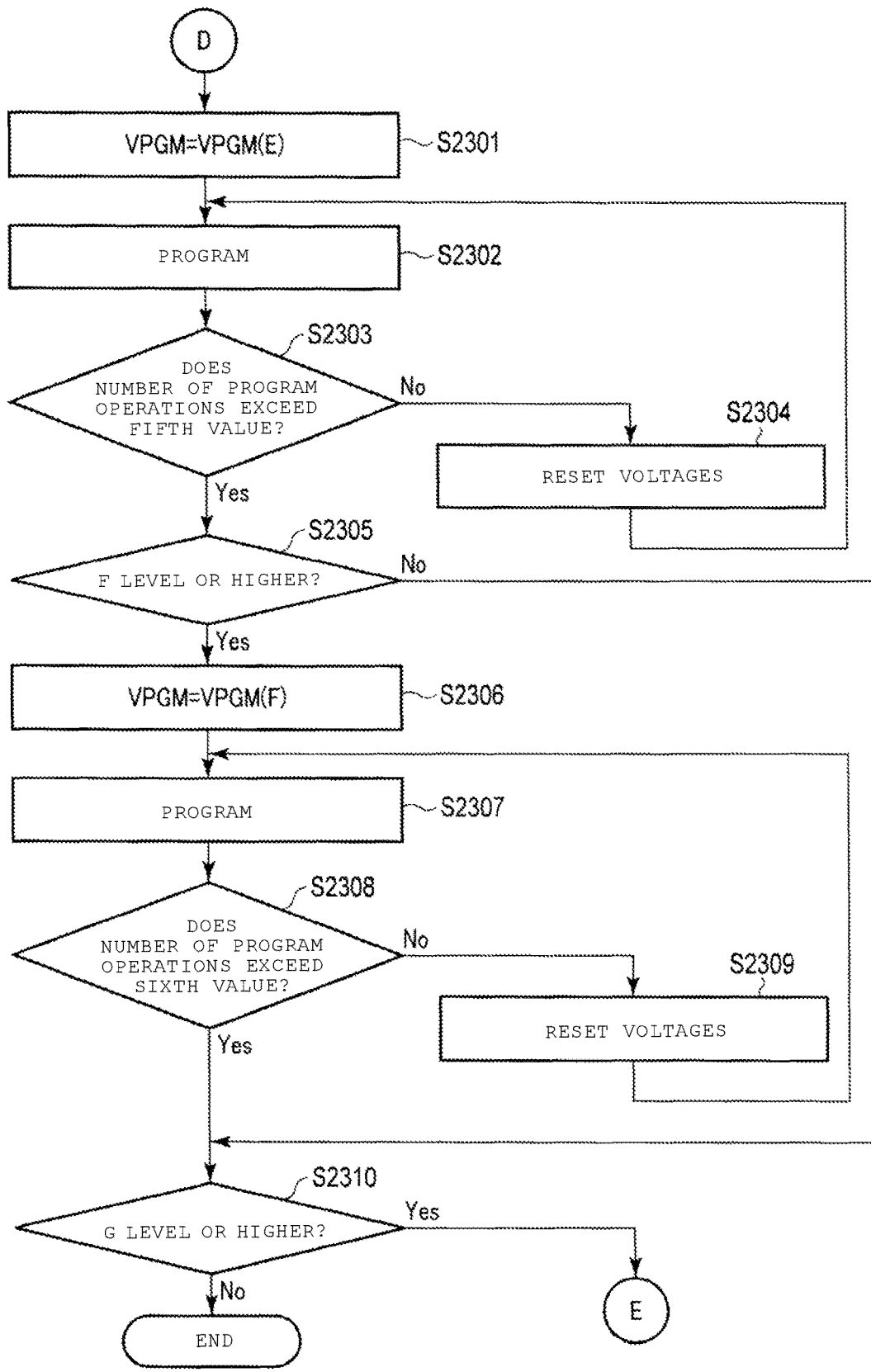
FIG. 30 is a flowchart illustrating a write operation of the semiconductor memory device according to the second embodiment.

With reference to FIG. 30, a description will be made of an operation flow of the second writing (step S2300) regarding writing of the E level from the D level and writing of the F level from the E level.

Step S2301

In a case where the sequencer 111 determines that there is a memory cell transistor MT into which data of the E level or higher is to be written (YES in step S2206), the sequencer 111 sets the program voltage VPGM to an E level program voltage VPGM(E). The voltage VPGM(E) is higher than the previous voltage VPGM(D)+dVPGM*Y (where Y is any integer).

Step S2302

The sequencer 111 performs an E level program operation on a target memory cell transistor MT by using the program voltage.

Step S2303

As described above, in the second writing, the number of program operations is restricted. The sequencer 111 counts the number of times of execution (the number of program operations) of step S2302, and determines whether or not the number of times of execution exceeds a fifth value (the number of E level program operations) stored in the register 112. The fifth value is the number of program operations after any level program operation is completed.

Step S2304

When the number of times of step S2302 does not exceed the fifth value (NO in step S2303), the sequencer 111 resets various voltages so as to perform step S2302. Specifically, the sequencer 111 increases the program voltage VPGM by dVPGM.

Step S2305

When the number of times of step S2302 exceeds the fifth value (YES in step S2303), the sequencer 111 determines whether or not there is a memory cell transistor MT into which data of the F level or higher is to be written.

Once no memory cell transistor MT into which data of the F level or higher is to be written (NO in step S2305) has been confirmed, the sequencer 111 finishes the write operation.

Step S2306

In a case where the sequencer 111 determines that there is a memory cell transistor MT into which data of the F level or higher is to be written (YES in step S2305), the sequencer 111 sets the program voltage VPGM to an F level program voltage VPGM(F). The voltage VPGM(F) is higher than the previous voltage VPGM(E)+dVPGM*Y (where Y is any integer).

Step S2307

The sequencer 111 performs an F level program operation on a target memory cell transistor MT by using the program voltage.

Step S2308

The sequencer 111 counts the number of times of execution (the number of program operations) of step S2307, and determines whether or not the number of times of execution exceeds a sixth value (the number of F level program operations) stored in the register 112. The sixth value is the number of program operations after any level program operation is completed.

Step S2309

When the number of times of step S2307 does not exceed the sixth value (NO in step S2308), the sequencer 111 resets various voltages so as to perform step S2307. Specifically, the sequencer 111 increases the program voltage VPGM by dVPGM.

Step S2310

When the number of times of step S2307 exceeds the sixth value (YES in step S2308), the sequencer 111 determines whether or not there is a memory cell transistor MT into which data of the G level or higher is to be written.

Once no memory cell transistor MT into which data of the G level or higher is to be written (NO in step S2310) has been confirmed, the sequencer 111 finishes the write operation.

Figure 31:
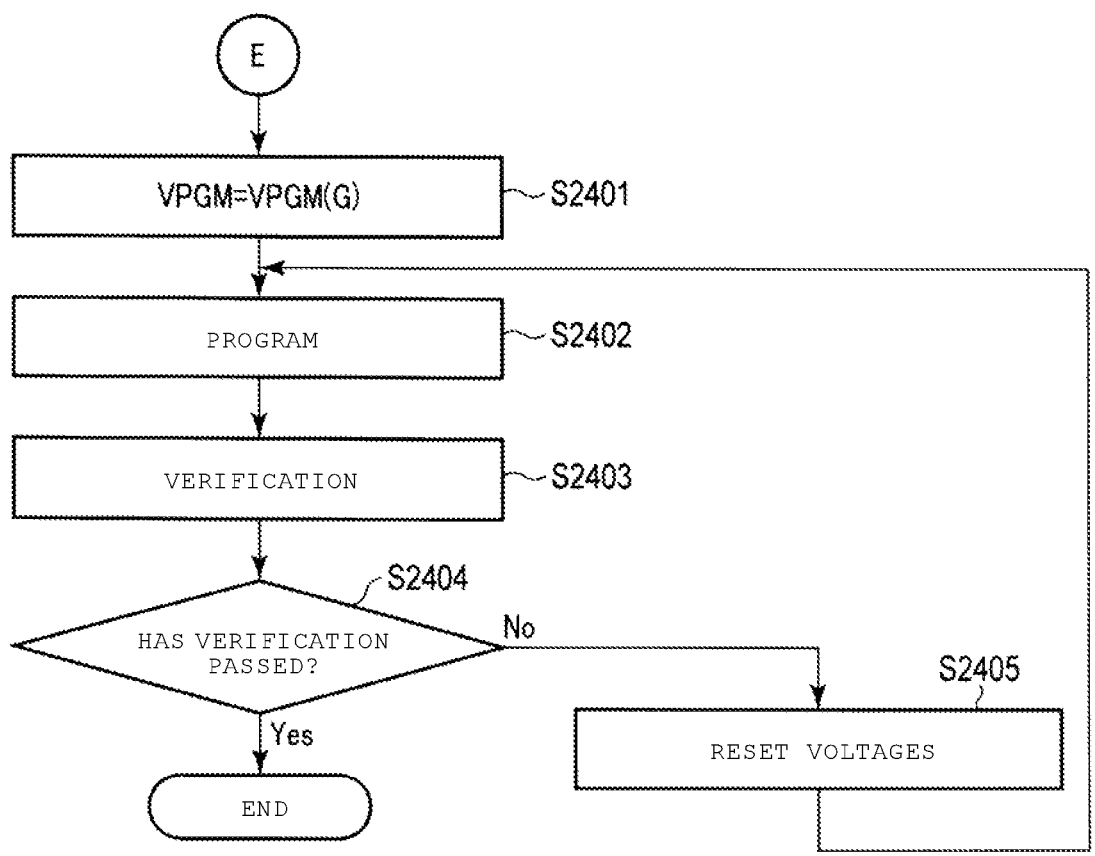
FIG. 31 is a flowchart illustrating a write operation of the semiconductor memory device according to the second embodiment.

With reference to FIG. 31, a description will be made of an operation flow of the first writing (step S2400) regarding writing of the G level from the F level.

Step S2401

The sequencer 111 sets a program voltage VPGM to a G level program voltage VPGM(G).

Step S2402

The sequencer 111 performs a G level program operation on a target memory cell transistor MT by using the program voltage.

Step S2403

Next, the sequencer 111 performs a first program verification operation in order to determine whether or not a write target memory cell transistor MT is included in the first group. In this case, the sequencer 111 performs a program verification operation by using the voltage VLG.

Next, the sequencer 111 performs a second program verification operation in order to determine whether or not the write target memory cell transistor MT is included in the second group. In this case, the sequencer 111 performs a program verification operation by using the voltage VG (where VLG<VG).

Step S2404

The sequencer 111 determines whether or not all write target memory cell transistors MT have passed the second program verification operation.

Once all of the write target memory cell transistors MT have passed the second program verification operation (YES in step S2404), the sequencer 111 finishes the write operation.

Step S2405

If any memory cell transistors MT have not passed the first and second program verification operations (NO in step S2404) among the write target memory cell transistors MT, the sequencer 111 determines in which group of the first to third groups the write target memory cell transistor MT is included. The sequencer 111 resets various voltages on the basis of a determined group, and performs step S2402.

Specifically, the sequencer 111 increases the program voltage VPGM by dVPGM, sets a voltage of the bit line BL included in the first group to the voltage VSS, sets a voltage of the bit line BL included in the second group to the voltage VBL, and sets a voltage of the bit line BL included in the third group to the voltage VINHIBIT.

The operations illustrated in FIGS. 26 to 31 are based on the operation described with reference to FIG. 25. Thus, in a case where a method of applying the first writing and the second writing is changed, an operation flow of a write operation of the semiconductor memory device 100 according to the second embodiment is also changed according to the method of applying the first writing and the second writing.

2-2-3. Specific Example of Pulse

Next, with reference to FIGS. 32 to 34, a description will be made of a specific pulse example in a case where the write operation of the second embodiment is applied to the above-described memory cell transistor MT. Illustration methods in FIGS. 32 to 34 are the same as that in FIG. 13.

Figure 32:
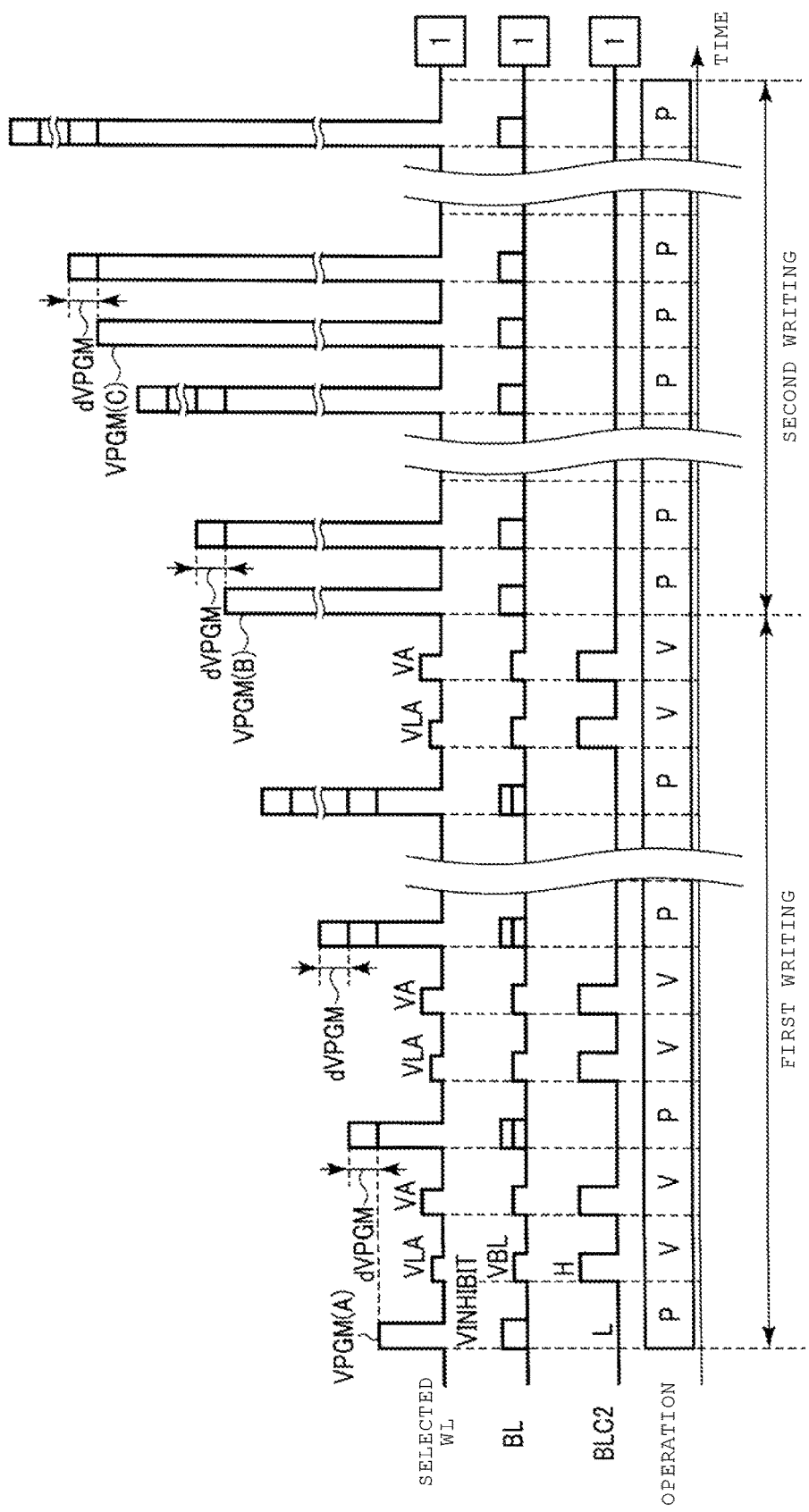
FIG. 32 is a diagram illustrating pulses during a write operation of the semiconductor memory device according to the second embodiment.

As illustrated in FIG. 32, first, the sequencer 111 performs the first writing regarding writing of the A level from the Er level. If the first writing regarding writing of the A level from the Er level is completed, the sequencer 111 performs the second writing regarding writing of the B level from the A level and writing of the C level from the B level.

Figure 33:
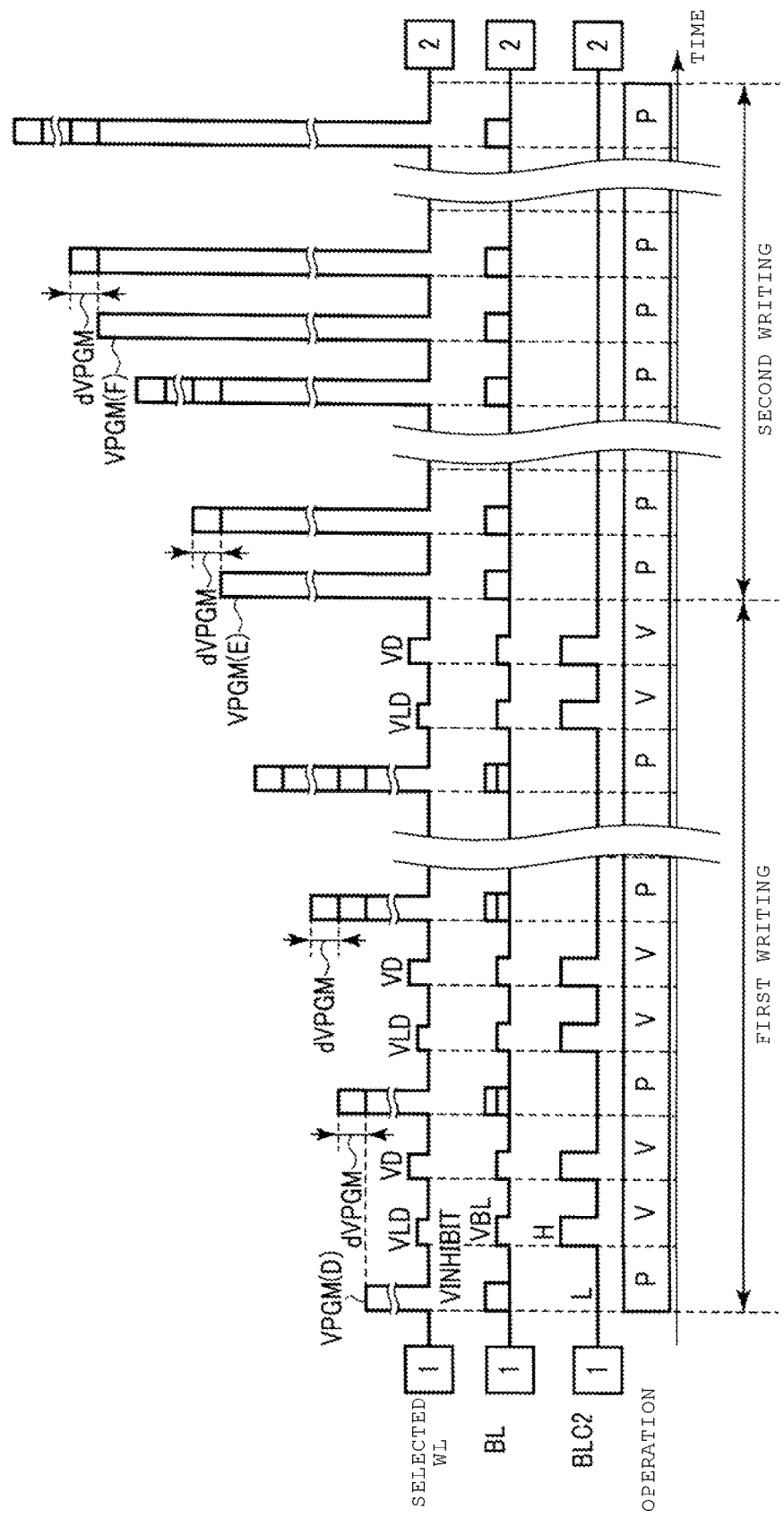
FIG. 33 is a diagram illustrating pulses during a write operation of the semiconductor memory device according to the second embodiment.

As illustrated in FIG. 33, if the second writing regarding writing of the B level from the A level and writing of the C level from the B level is completed, the sequencer 111 performs the first writing regarding writing of the D level from the C level. If the first writing regarding writing of the D level from the C level is completed, the sequencer 111 performs the second writing regarding writing of the E level from the D level and writing of the F level from the E level.

Figure 34:
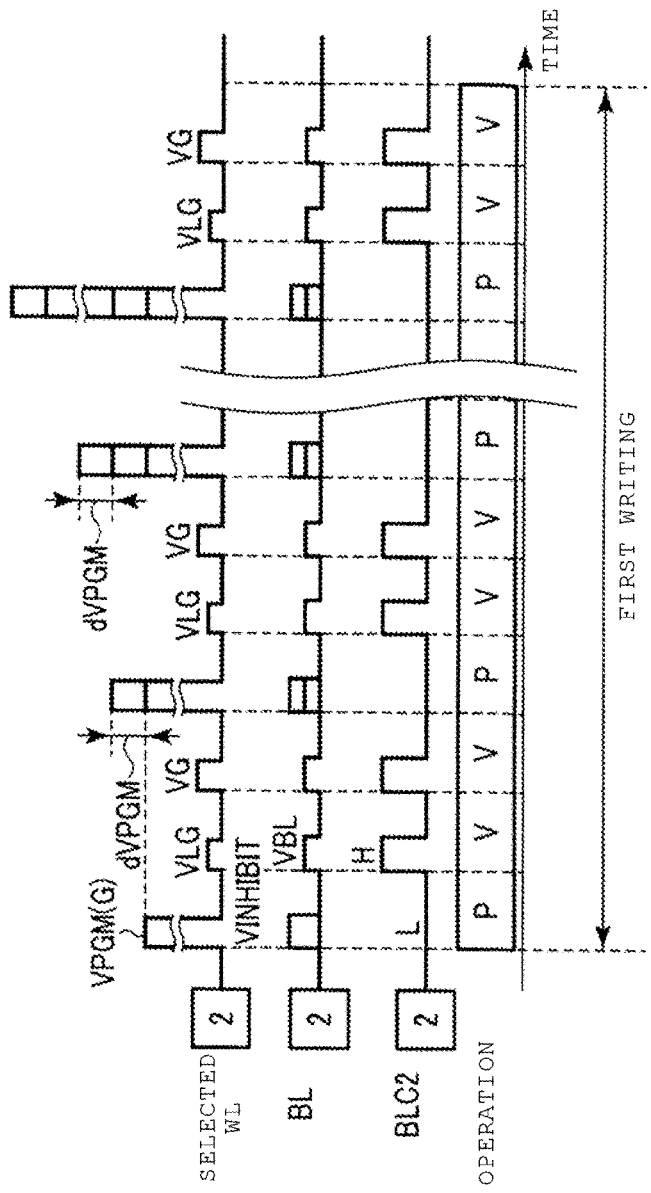
FIG. 34 is a diagram illustrating pulses during a write operation of the semiconductor memory device according to the second embodiment.

As illustrated in FIG. 34, if the second writing regarding writing of the E level from the D level and writing of the F level from the E level is completed, the sequencer 111 performs the first writing regarding writing of the G level from the F level.

The operations in FIGS. 32 to 34 are based on the operation described with reference to FIG. 25. Thus, in a case where a method of applying the first writing and the second writing is changed, pulses in a write operation of the semiconductor memory device 100 according to the second embodiment are also changed according to the method of applying the first writing and the second writing.

2-3. Effects

As mentioned above, in the second embodiment, a description has been made of a case where the memory cell transistor MT can store 8-level data, but the same effects as those in the first embodiment can be achieved.

2-4. Modification Example of Second Embodiment

A description will be made of a modification example of the second embodiment. In the modification example of the second embodiment, the write operation of the second embodiment is applied to a semiconductor memory device employing a sense module based on a current sense method (the sense module described in the modification example of the first embodiment) as a sense module. The fundamental configuration and operation of the semiconductor memory device 100 according to the modification example of the second embodiment are the same as those of the semiconductor memory device 100 according to the first embodiment, the modification example of the first embodiment, and the second embodiment. Therefore, the content described in the first embodiment, the modification example of the first embodiment, and the second embodiment, and the content which can be easily analogized from the first embodiment, the modification example of the first embodiment, and the second embodiment will not be described again.

2-4-1. Summary of Sense Amplifier Unit

A configuration and an operation of the sense amplifier unit 140 related to the modification example of the second embodiment are the same as those of the sense amplifier unit 140 described in the modification example of the first embodiment.

2-4-2. Operation 2-4-2-1. Operation Flow of Write Operation

The above-described sense module based on the current sense method and program verification operation described in the modification example of the first embodiment are also applicable to the operation flow described with reference to FIGS. 26 to 31. For simplification, herein, a description will be made of the content of steps S2003 to S2005 in FIG. 27, steps S2203 to S2205 in FIG. 29, and steps S2403 to S2405 in FIG. 31 which are different from the content described in the second embodiment.

Step S2003

The sequencer 111 performs a program verification operation in order to determine whether or not a write target memory cell transistor MT is included in the first to third groups. In this case, the sequencer 111 performs the program verification operation by using the voltage VA.

Step S2004

The sequencer 111 determines whether or not all write target memory cell transistors MT have passed the program verification operation.

Step S2005

If any memory cell transistor MT have not passed the program verification operation (NO in step S2004) among the write target memory cell transistors MT, the sequencer 111 determines in which group of the first to third groups the write target memory cell transistor MT is included. The sequencer 111 resets various voltages on the basis of a determined group, and performs step S2002.

Step S2203

The sequencer 111 performs a program verification operation in order to determine whether or not a write target memory cell transistor MT is included in the first to third groups. In this case, the sequencer 111 performs the program verification operation by using the voltage VD.

Step S2204

The sequencer 111 determines whether or not all write target memory cell transistors MT have passed the program verification operation.

Step S2205

If any memory cell transistors MT have not passed the program verification operation (NO in step S2204) among the write target memory cell transistors MT, the sequencer 111 determines in which group of the first to third groups the write target memory cell transistor MT is included. The sequencer 111 resets various voltages on the basis of a determined group, and performs step S2202.

Step S2403

The sequencer 111 performs a program verification operation in order to determine whether or not a write target memory cell transistor MT is included in the first to third groups. In this case, the sequencer 111 performs the program verification operation by using the voltage VG.

Step S2404

The sequencer 111 determines whether or not all write target memory cell transistors MT have passed the program verification operation.

Step S2405

If any memory cell transistors MT have not passed the program verification operation (NO in step S2404) among the write target memory cell transistors MT, the sequencer 111 determines in which group of the first to third groups the write target memory cell transistor MT is included. The sequencer 111 resets various voltages on the basis of a determined group, and performs step S2402.

The operations illustrated in FIGS. 26 to 31 are based on the operation described with reference to FIG. 25. Thus, in a case where a method of applying the first writing and the second writing is changed, an operation flow of a write operation of the semiconductor memory device 100 according to the modification example of the second embodiment is also changed according to the method of applying the first writing and the second writing.

2-4-2-2. Specific Example of Pulse

Next, with reference to FIGS. 35 to 37, a description will be made of a specific pulse example in a write operation of the semiconductor memory device related to the modification example of the second embodiment. Illustration methods in FIGS. 35 to 37 are the same as that in FIG. 23.

Figure 35:
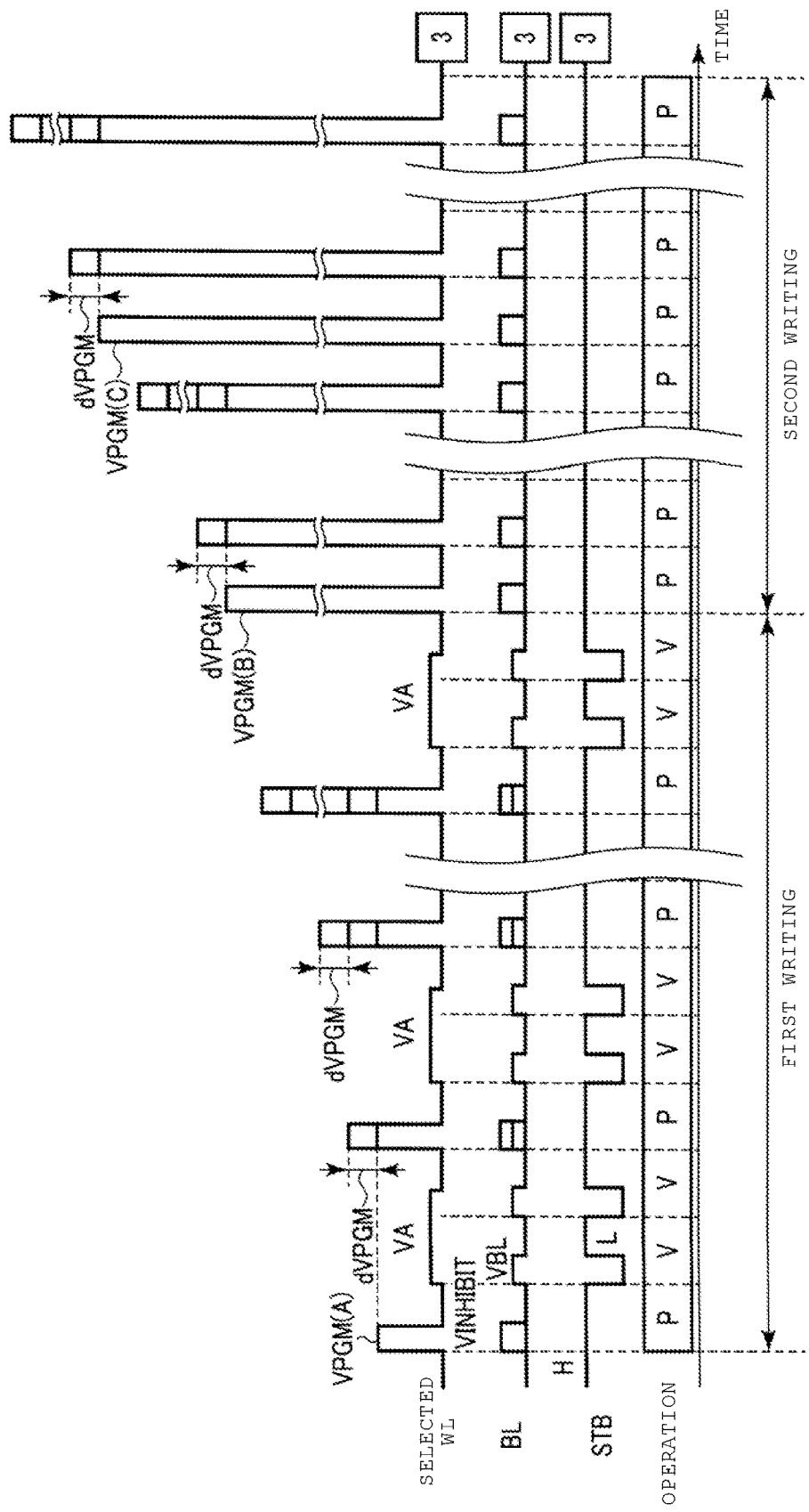
FIG. 35 is a diagram illustrating pulses during a write operation of the semiconductor memory device according to a modification example of the second embodiment.
Figure 36:
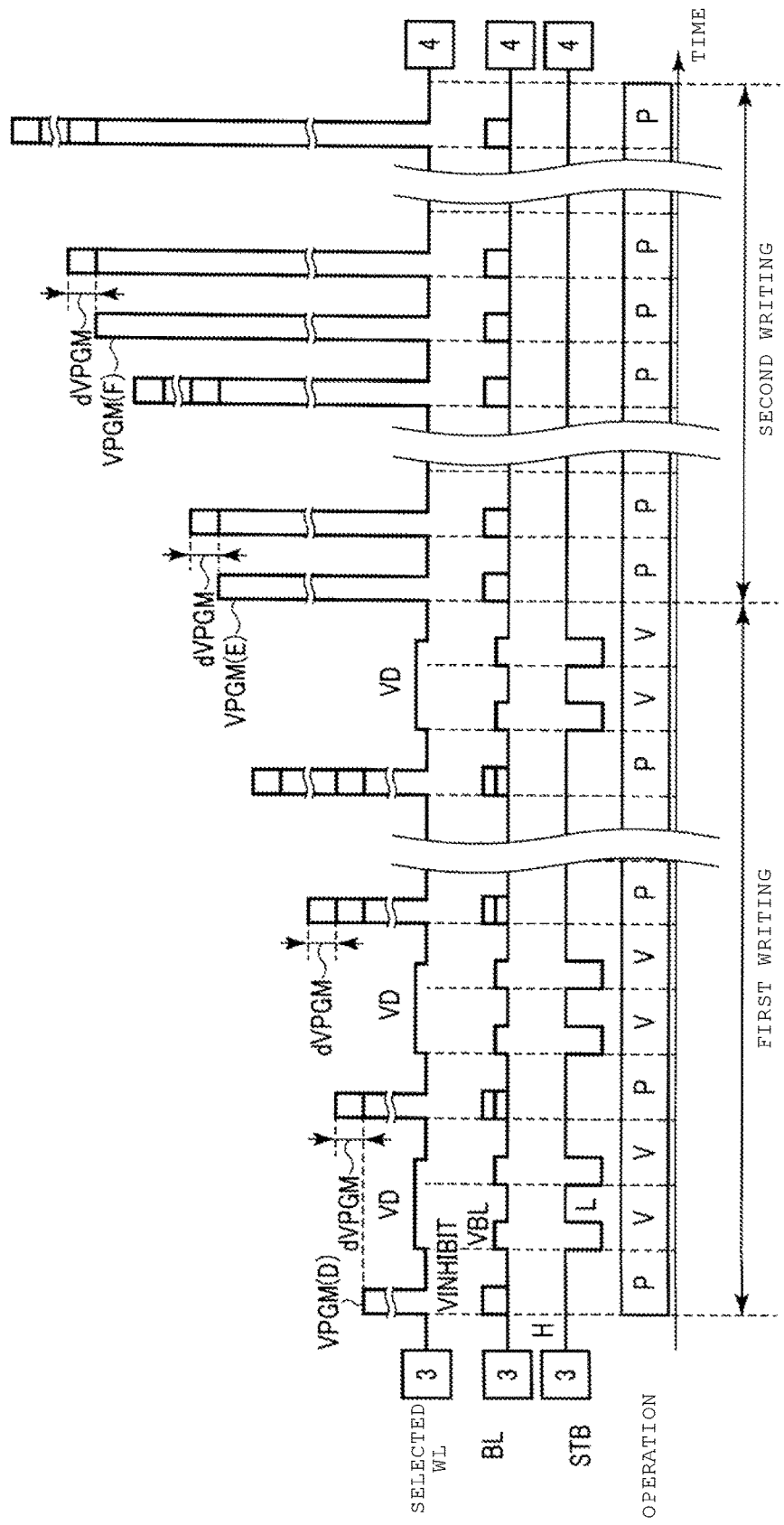
FIG. 36 is a diagram illustrating pulses during a write operation of the semiconductor memory device according to a modification example of the second embodiment.
Figure 37:
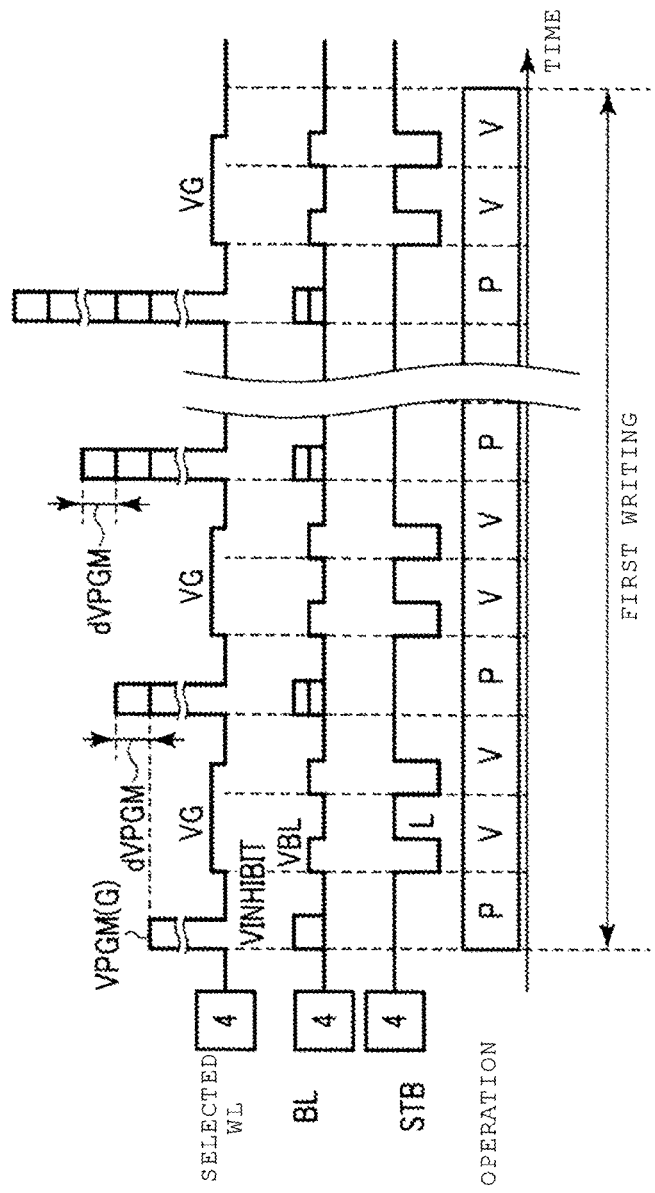
FIG. 37 is a diagram illustrating pulses during a write operation of the semiconductor memory device according to a modification example of the second embodiment.

As illustrated in FIGS. 35 to 37, the data write method described in the second embodiment is also applicable to the semiconductor memory device 100 having the sense module based on the current sense method described in the modification example of the first embodiment.

2-4-3. Effects

As mentioned above, the current sense method described in the modification example of the first embodiment is applicable to the write method described in the second embodiment. Consequently, the same effects as the effects described in the second embodiment can also be achieved in the semiconductor memory device 100 employing the current sense method.

3. Third Embodiment

A third embodiment will be described. In the second embodiment, a description has been made of a write method of causing a threshold voltage distribution to transition from the Er level to the A level, the B level, the C level, the D level, the E level, the F level, and the G level in this order. In the third embodiment, a description will be made of a case of employing a write method in which a threshold voltage distribution is caused to transition to any level instead of sequential transition to levels. The fundamental configuration and operation of the semiconductor memory device 100 according to the third embodiment are the same as those of the semiconductor memory device 100 according to the first embodiment and the second embodiment. Therefore, the content described in the first embodiment and the second embodiment and the content which can be easily analogized from the first embodiment and the second embodiment will not be described again.

3-1. Summary of Sense Amplifier Unit

A configuration and an operation of the sense amplifier unit 140 according to the third embodiment are the same as those of the sense amplifier unit 140 described in the first embodiment.

3-2. Operation 3-2-1. Summary of Write Operation

In the third embodiment, a description will be made of a write method in which a threshold voltage distribution is caused to transition to any level instead of sequential transition to levels.

As an example, the sequencer 111 does not perform writing of the A to C levels in a case where a threshold voltage of the memory cell transistor MT is caused to transition to the D to F levels. The sequencer 111 does not perform writing of the A to F levels in a case where a threshold voltage of the memory cell transistor MT is caused to transition to the G level. In other words, the sequencer 111 skips an A level program operation to a C level program operation when a D level program operation to an F level program operation is performed. The sequencer 111 skips an A level program operation to an F level program operation when a G level program operation is performed. A specific example of the second method is not limited to the above example, and the level that is skipped may be selected as appropriate. In a case where a program operation is skipped, the sequencer 111 applies the voltage VINHIBIT to a bit line related to the selected memory cell transistor MT on which a program operation is skipped.

In the third embodiment, the first writing is applied to writing of the A level from the Er level, writing of the D level from the Er level, and writing of the G level from the Er level. The second writing is applied to writing of the B level from the A level, writing of the C level from the B level, writing of the E level from the D level, and writing of the F level from the E level. However, a method of applying the first writing and the second writing is not limited to the above description.

3-2-2. Operation Flow of Write Operation

Next, with reference to FIGS. 38 to 43, a description will be made of an operation flow of a write operation of the semiconductor memory device 100 according to the third embodiment, and an operation flow based on the operation described in 3-2-1.

Step S3000

Figure 38:
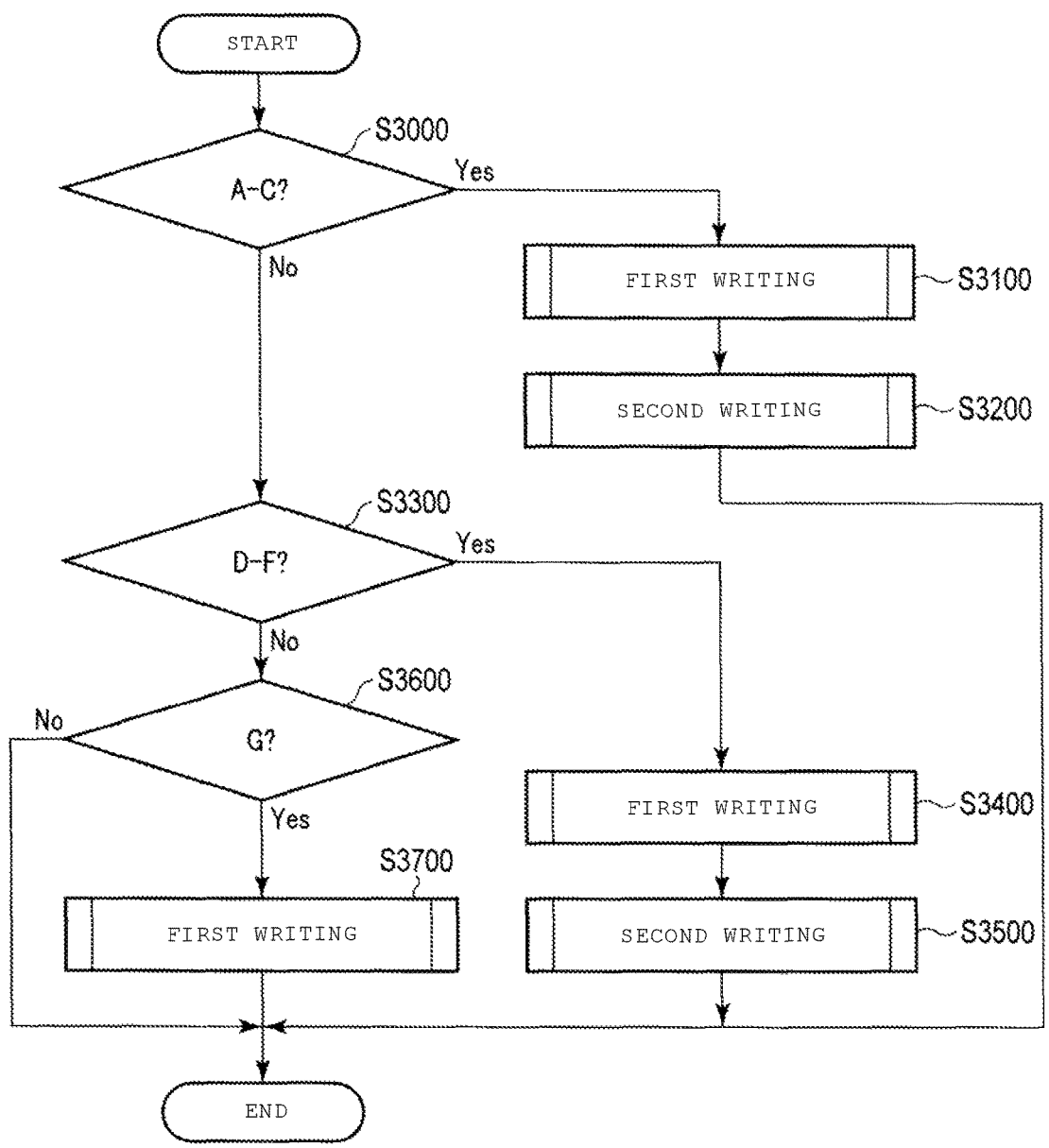
FIG. 38 is a flowchart illustrating a write operation of a semiconductor memory device according to a third embodiment.

As illustrated in FIG. 38, in the write operation of the third embodiment, the sequencer 111 determines whether or not there is a memory cell transistor MT into which data of the A level to the C level is to be written.

Step S3100 and step S3200

When there is a memory cell transistor MT into which data of the A level to the C level is to be written (YES in step S3000), the sequencer 111 performs program operations regarding the A level to the C level.

Step S3300

In the write operation of the third embodiment, the sequencer 111 determines whether or not there is a memory cell transistor MT into which data of the D level to the F level is to be written.

Step S3400 and Step S3500

When there is a memory cell transistor MT into which data of the D level to the F level is to be written (YES in step S3300), the sequencer 111 performs program operations regarding the D level to the F level.

Step S3600

In the write operation of the third embodiment, the sequencer 111 determines whether or not there is a memory cell transistor MT into which data of the G level is to be written.

Step S3700

When there is a memory cell transistor MT into which data of the G level is to be written (YES in step S3600), the sequencer 111 performs program operations regarding the G level.

Figure 39:
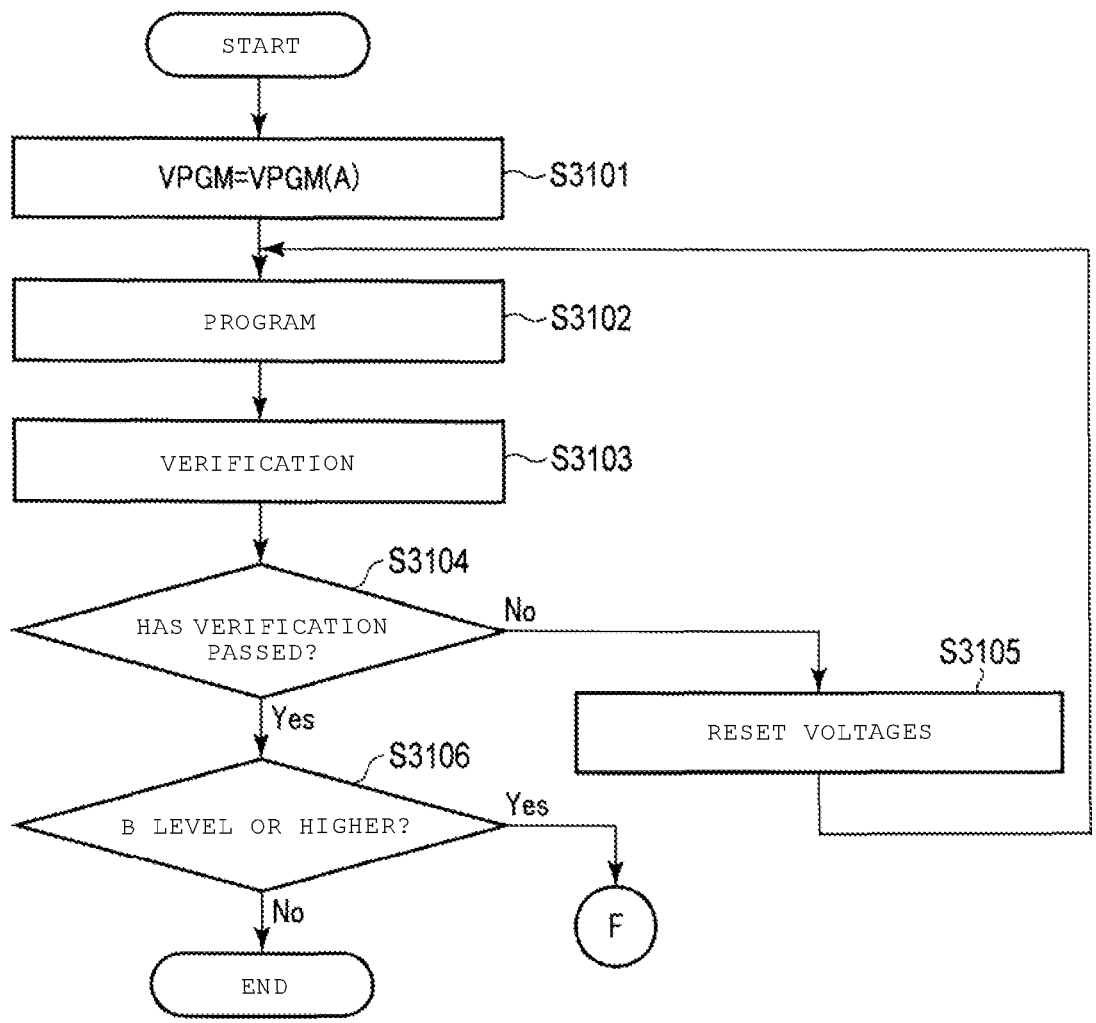
FIG. 39 is a flowchart illustrating a write operation of the semiconductor memory device according to the third embodiment.

With reference to FIG. 39, a description will be made of an operation flow of the first writing (step S3100) regarding writing of the A level from the Er level.

Step S3101 to Step S3106

The semiconductor memory device 100 performs the same operations as those in steps S1001 to S1006.

Figure 40:
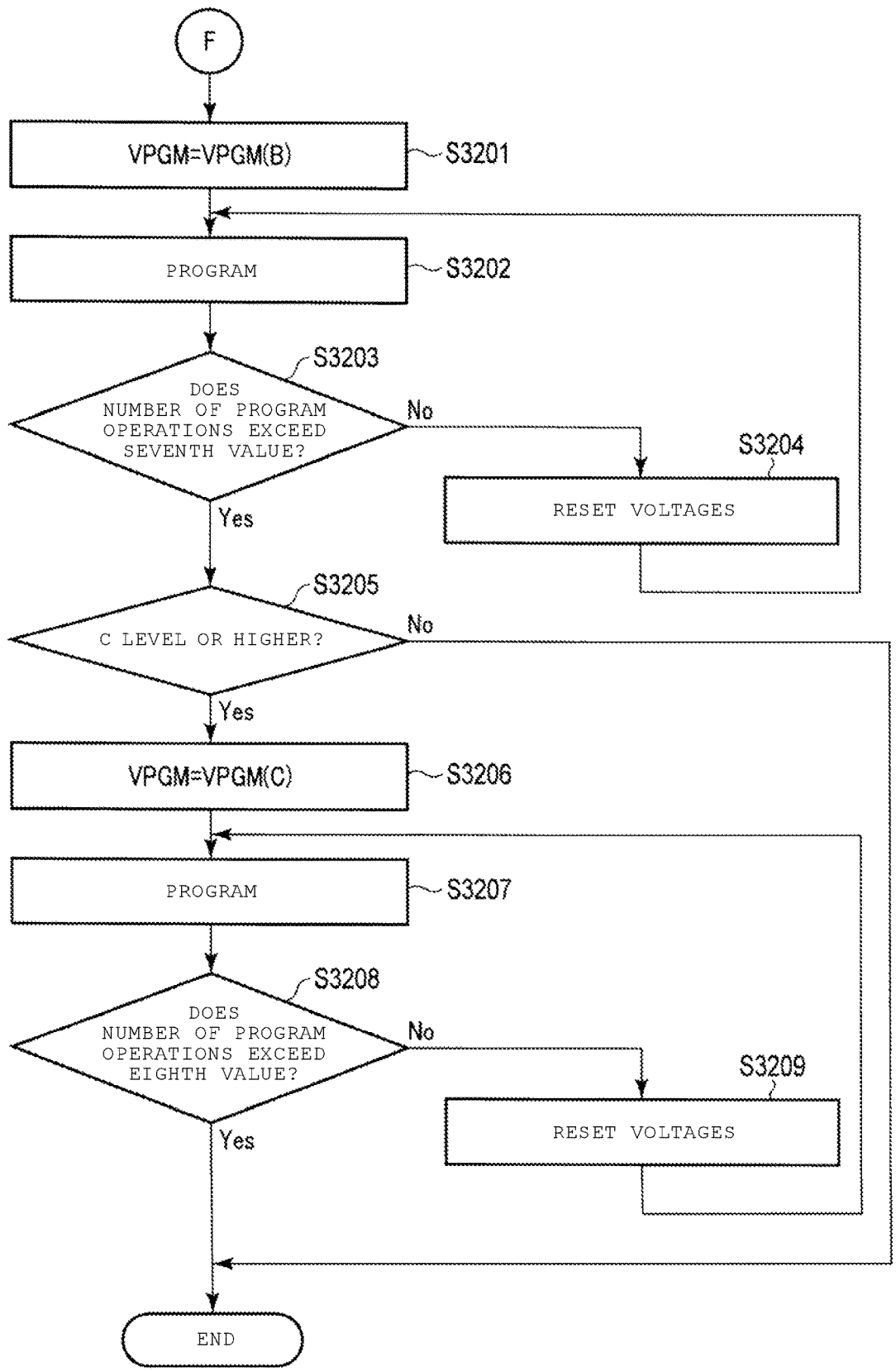
FIG. 40 is a flowchart illustrating a write operation of the semiconductor memory device according to the third embodiment.

With reference to FIG. 40, a description will be made of an operation flow of the first writing (step S3200) regarding writing of the B level from the A level and writing of the C level from the B level.

Step S3201 to Step S3209

The semiconductor memory device 100 performs the same operations as those in step S1101 to step S1109.

The sequencer 111 performs a determination operation by using a seventh value (the number of B level program operations) instead of the first value in step S3203, and performs a determination operation by using an eighth value (the number of C level program operations) instead of the second value in step S3208.

Figure 41:
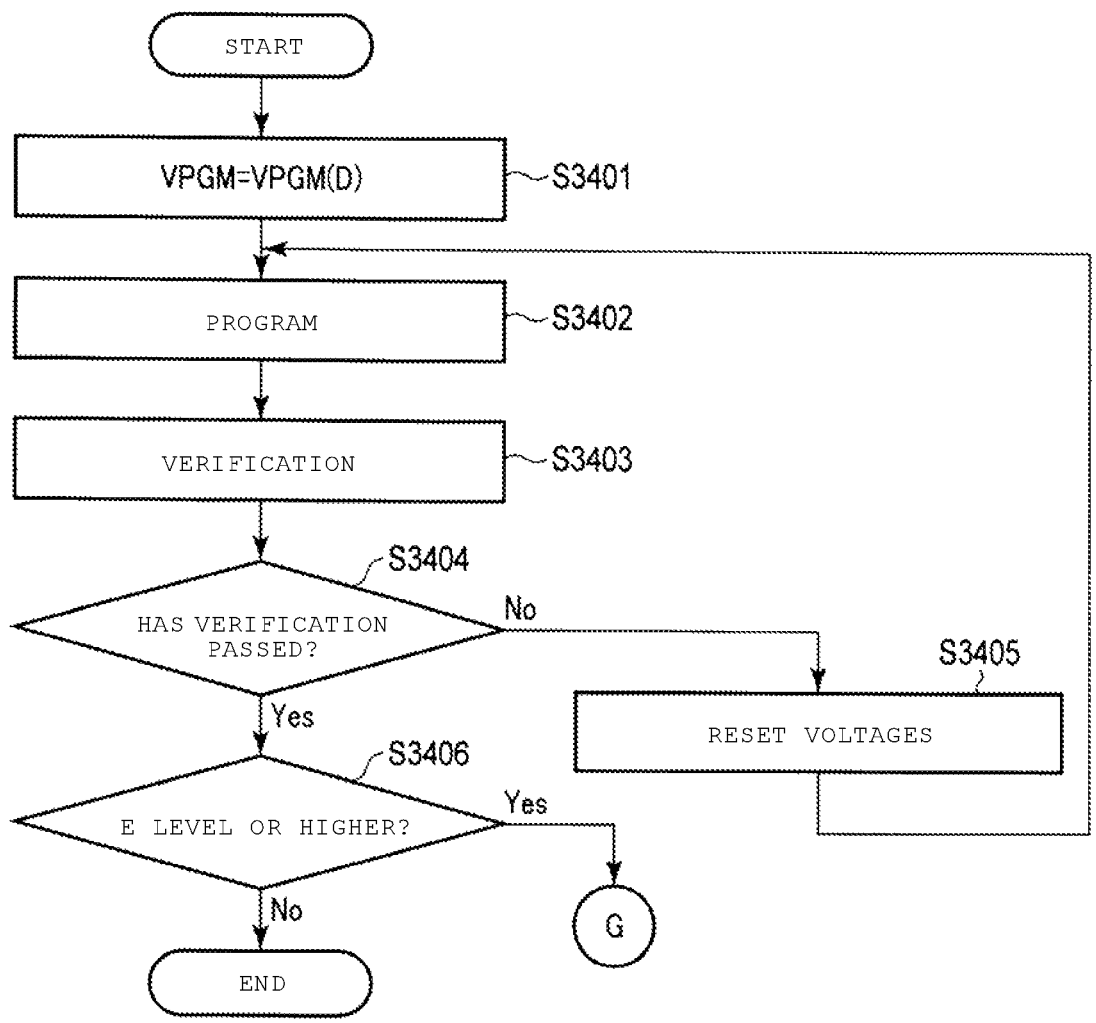
FIG. 41 is a flowchart illustrating a write operation of the semiconductor memory device according to the third embodiment.

With reference to FIG. 41, a description will be made of an operation flow of the first writing (step S3400) regarding writing of the D level from the Er level.

Step S3401 to Step S3406

The semiconductor memory device 100 performs the same operations as those in steps S2201 to S2206.

Figure 42:
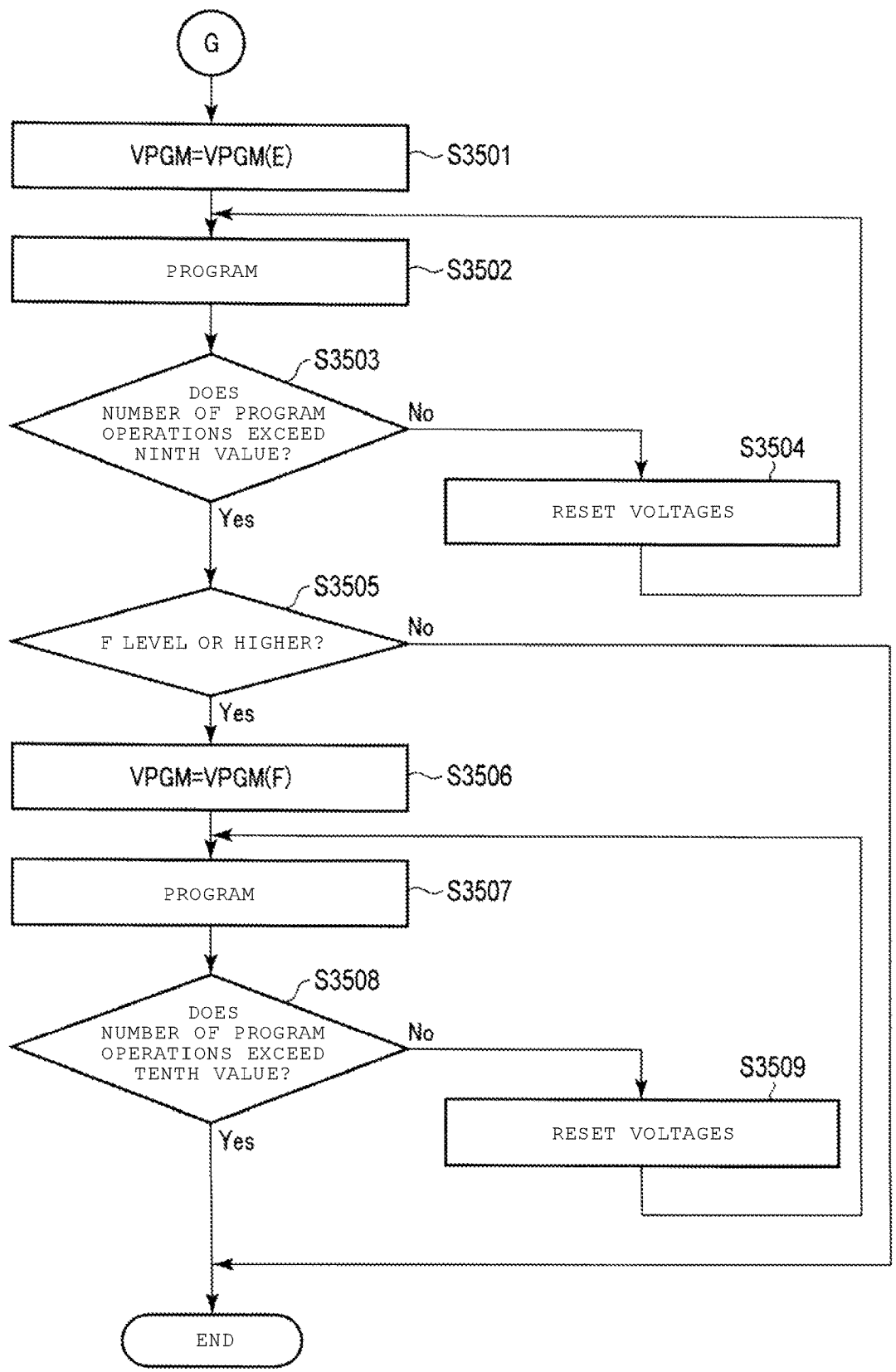
FIG. 42 is a flowchart illustrating a write operation of the semiconductor memory device according to the third embodiment.

With reference to FIG. 42, a description will be made of an operation flow of the first writing (step S3500) regarding writing of the E level from the D level and writing of the F level from the E level.

Step S3501 to Step S3509

The semiconductor memory device 100 performs the same operations as those in step S2301 to step S2309.

The sequencer 111 performs a determination operation by using a ninth value (the number of E level program operations) instead of the fifth value in step S3503, and performs a determination operation by using a tenth value (the number of F level program operations) instead of the sixth value in step S3508.

Figure 43:
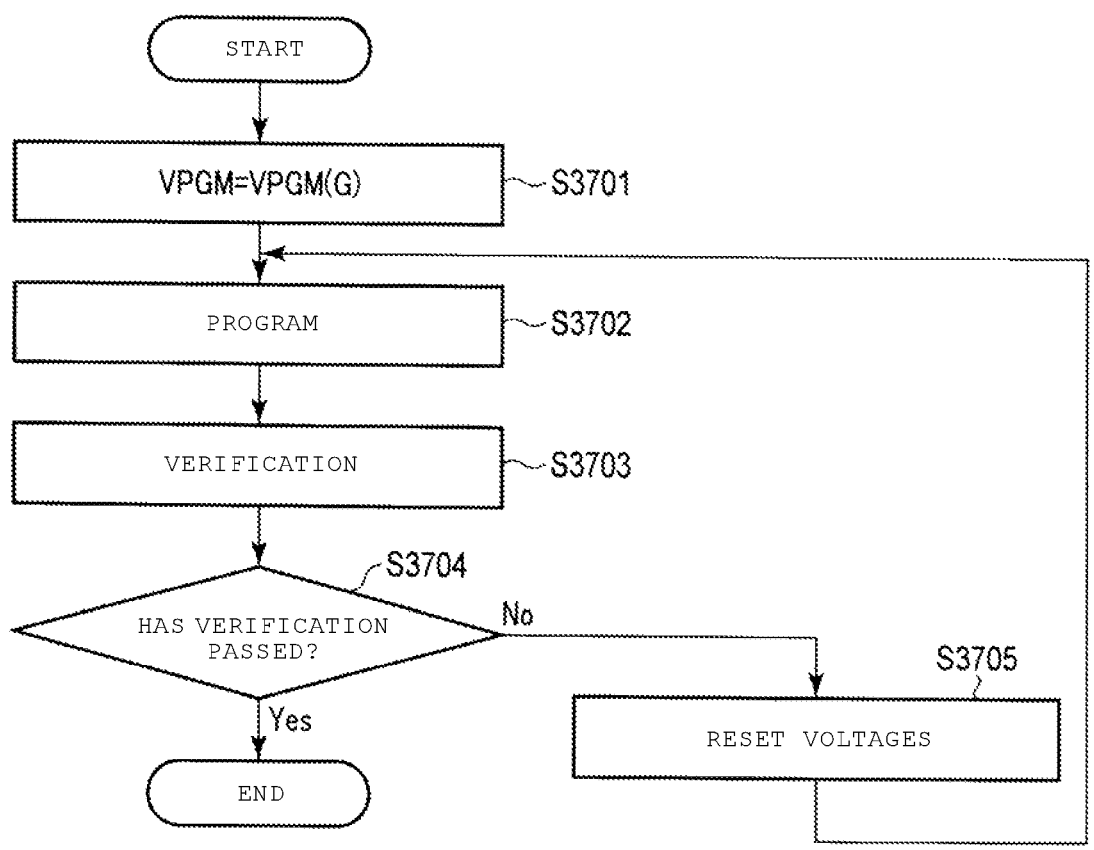
FIG. 43 is a flowchart illustrating a write operation of the semiconductor memory device according to the third embodiment.

With reference to FIG. 43, a description will be made of an operation flow of the first writing (step S3700) regarding writing of the G level from the Er level.

Step S3701 to Step S3706

The semiconductor memory device 100 performs the same operations as those in steps S2401 to S2406.

Specific pulses in a write operation of the semiconductor memory device according to the third embodiment are the same as those in FIGS. 32 to 34 except for voltages for skipped bit lines, and thus a description thereof will be omitted.

3-3. Effects

As mentioned above, a case of using the second method as a write method is also applicable to the write method described in the second embodiment. Consequently, the same effects as the effects described in the second embodiment can also be achieved.

3-4. Modification Example of Third Embodiment

A description will be made of a modification example of the third embodiment. In the modification example of the third embodiment, a description will be made of a case where the write operation of the third embodiment is applied to a semiconductor memory device employing a sense module based on a current sense method (the sense module described in the modification example of the first embodiment) as a sense module. The fundamental configuration and operation of the semiconductor memory device 100 according to the modification example of the third embodiment are the same as those of the semiconductor memory device 100 according to the first embodiment, the modification example of the first embodiment, the second embodiment, the modification example of the second embodiment, and the third embodiment. Therefore, the content described in the first embodiment, the modification example of the first embodiment, the second embodiment, the modification example of the second embodiment, and the third embodiment, and the content which can be easily analogized from the first embodiment, the modification example of the first embodiment, the second embodiment, the modification example of the second embodiment, and the third embodiment will not be described again.

3-4-1. Summary of Sense Amplifier Unit

A configuration and an operation of the sense amplifier unit 140 related to the modification example of the third embodiment are the same as those of the sense amplifier unit 140 described in the modification example of the first embodiment.

3-4-2. Operation
3-4-2-1. Operation Flow of Write Operation

The above-described sense module based on the current sense method and program verification operation described in the modification example of the first embodiment are also applicable to the operation flow described with reference to FIGS. 38 to 43. For simplification, herein, a description will be made of the content of steps S3103 to S3105 in FIG. 39, steps S3403 to S3405 in FIG. 41, and steps S3703 to S3705 in FIG. 43 which are different from the content described in the third embodiment.

Step S3103

The sequencer 111 performs a program verification operation in order to determine whether or not a write target memory cell transistor MT is included in the first to third groups. In this case, the sequencer 111 performs the program verification operation by using the voltage VA.

Step S3104

The sequencer 111 determines whether or not all write target memory cell transistors MT have passed the program verification operation.

Step S3105

If any memory cell transistors MT have not passed the program verification operation (NO in step S3104) among the write target memory cell transistors MT, the sequencer 111 determines in which group of the first to third groups the write target memory cell transistor MT is included. The sequencer 111 resets various voltages on the basis of a determined group, and performs step S3102.

Step S3403

The sequencer 111 performs a program verification operation in order to determine whether or not a write target memory cell transistor MT is included in the first to third groups. In this case, the sequencer 111 performs the program verification operation by using the voltage VD.

Step S3404

The sequencer 111 determines whether or not all write target memory cell transistors MT have passed the program verification operation.

Step S3405

If any memory cell transistors MT have not passed the program verification operation (NO in step S3404) among the write target memory cell transistors MT, the sequencer 111 determines in which group of the first to third groups the write target memory cell transistor MT is included. The sequencer 111 resets various voltages on the basis of a determined group, and performs step S3402.

Step S3703

The sequencer 111 performs a program verification operation in order to determine whether or not a write target memory cell transistor MT is included in the first to third groups. In this case, the sequencer 111 performs the program verification operation by using the voltage VG.

Step S3704

The sequencer 111 determines whether or not all write target memory cell transistors MT have passed the program verification operation.

Step S3705

If any memory cell transistors MT have not passed the program verification operation (NO in step S3704) among the write target memory cell transistors MT, the sequencer 111 determines in which group of the first to third groups the write target memory cell transistor MT is included. The sequencer 111 resets various voltages on the basis of a determined group, and performs step S3702.

Specific pulses in a write operation of the semiconductor memory device according to the modification example of the third embodiment are the same as those in FIGS. 35 to 37 except for voltages for skipped bit lines, and thus a description thereof will be omitted.

3-4-3. Effects

As mentioned above, the current sense method described in the modification example of the first embodiment is applicable to the write method described in the third embodiment. Consequently, the semiconductor memory device 100 employing the current sense method can also achieve the same effects described in the third embodiment.

4. Fourth Embodiment

A fourth embodiment will be described. In the fourth embodiment, a description will be made of a case where a memory cell transistor stores 16-level data, and the write operation of the first embodiment is applied to a semiconductor memory device employing a sense module (the sense module described in the first embodiment) based on the voltage sense method as a sense module. The fundamental configuration and operation of the semiconductor memory device 100 according to the fourth embodiment are the same as those of the semiconductor memory device 100 according to the first to third embodiments. Therefore, the content described in the first to third embodiments and the content which can be easily analogized from the first to third embodiments will not be described.

4-1. Configuration 4-1-1. Summary of Sense Amplifier Unit

A configuration and an operation of the sense amplifier unit 140 according to the fourth embodiment are the same as those of the sense amplifier unit 140 described in the first embodiment.

4-1-2. Relationship Between Threshold Voltage Distribution Memory Cell Transistor and Data With reference to FIG. 44, a description will be made of a relationship between a threshold voltage distribution of the memory cell transistor MT and data.

Figure 44:
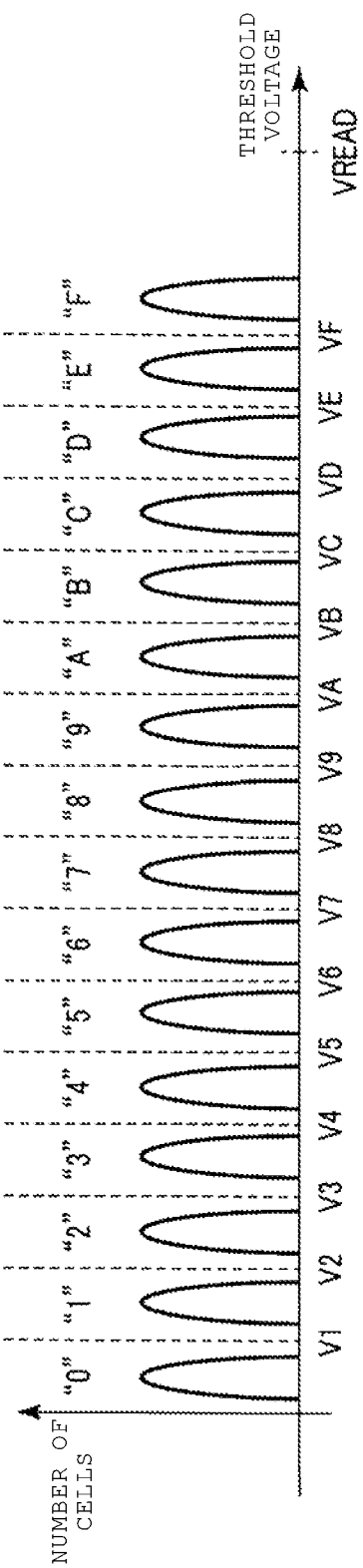
FIG. 44 is a diagram illustrating a relationship between a threshold voltage distributions and data of a memory cell transistor of a semiconductor memory device according to a fourth embodiment.

As illustrated in FIG. 44, each of the memory cell transistors MT can retain, for example, 4-bit data according to a threshold voltage thereof. The 4-bit data is, for example, "1111", "1011", "0101", "1000", "1001", "0001", "0011", "0111", "0101", "1101", "1100", "0100", "0000", "0010", "0110", and "1110" in ascending order of threshold voltages.

A threshold voltage of the memory cell transistor MT retaining data of "1111" is within a predetermined distribution, and a threshold voltage distribution corresponding to the data of "1111" will be referred to as a "0" level. The 0 level is a threshold voltage distribution in a state in which electric charge in the charge storage layer is removed, and thus data is erased, and has a positive or negative voltages (for example, below voltage V1).

"1011", "0101", "1000", "1001", "0001", "0011", "0111", "0101", "1101", "1100", "0100", "0000", "0010", "0110", and "1110" are threshold voltage distributions in a state in which electric charge is injected into the charge storage layer, and thus data is written.

A threshold voltage of the memory cell transistor MT retaining data of "1011" is within a "1" level distribution, and is greater than a threshold voltage in the 0 level (for example, equal to the voltage V1 (or more) and less than a voltage V2 where V1<V2).

A threshold voltage of the memory cell transistor MT retaining data of "0101" is within a "2" level distribution, and is greater than a threshold voltage in the 1 level (for example, equal to the voltage V2 (or more) and less than a voltage V3 where V2<V3).

A threshold voltage of the memory cell transistor MT retaining data of "1000" is within a "3" level distribution, and is greater than a threshold voltage in the 2 level (for example, equal to the voltage V3 (or more) and less than a voltage V4 where V3<V4).

A threshold voltage of the memory cell transistor MT retaining data of "1001" is within a "4" level distribution, and is greater than a threshold voltage in the 3 level (for example, equal to the voltage V4 (or more) and less than a voltage V5 where V4<V5).

A threshold voltage of the memory cell transistor MT retaining data of "0001" is within a "5" level distribution, and is greater than a threshold voltage in the 4 level (for example, equal to the voltage V5 (or more) and less than a voltage V6 where V5<V6).

A threshold voltage of the memory cell transistor MT retaining data of "0011" is within a "6" level distribution, and is greater than a threshold voltage in the 5 level (for example, equal to the voltage V6 (or more) and less than a voltage V7 where V6<V7).

A threshold voltage of the memory cell transistor MT retaining data of "0111" is within a "7" level distribution, and is greater than a threshold voltage in the 6 level (for example, equal to the voltage V7 (or more) and less than a voltage V8 where V7<V8).

A threshold voltage of the memory cell transistor MT retaining data of "0101" is within an "8" level distribution, and is greater than a threshold voltage in the 7 level (for example, equal to the voltage V8 (or more) and less than a voltage V9 where V8<V9).

A threshold voltage of the memory cell transistor MT retaining data of "1101" is within a "9" level distribution, and is greater than a threshold voltage in the 8 level (for example, equal to the voltage V9 (or more) and less than a voltage VA where V9<VA).

A threshold voltage of the memory cell transistor MT retaining data of "1100" is within an "A" level distribution, and is greater than a threshold voltage in the 9 level (for example, equal to the voltage VA (or more) and less than a voltage VB where VA<VB).

A threshold voltage of the memory cell transistor MT retaining data of "0100" is within an "B" level distribution, and is greater than a threshold voltage in the A level (for example, equal to the voltage VB (or more) and less than a voltage VC where VB<VC).

A threshold voltage of the memory cell transistor MT retaining data of "0000" is within a "C" level distribution, and is greater than a threshold voltage in the B level (for example, equal to the voltage VC (or more) and less than a voltage VD where VC<VD).

A threshold voltage of the memory cell transistor MT retaining data of "0010" is within a "D" level distribution, and is greater than a threshold voltage in the C level (for example, equal to the voltage VD (or more) and less than a voltage VE where VD<VE).

A threshold voltage of the memory cell transistor MT retaining data of "0110" is within an "E" level distribution, and is greater than a threshold voltage in the D level (for example, equal to the voltage VE (or more) and less than a voltage VF where VE<VF).

A threshold voltage of the memory cell transistor MT retaining data of "1110" is within an "F" level distribution, and is greater than a threshold voltage in the E level (for example, equal to the voltage VF or more).

A relationship between 4-bit data and a threshold voltage is not limited to this relationship, and, for example, the data of "1111" may correspond to the "F" level, and a relationship between both of the two may be selected as appropriate.

4-2. Operation 4-2-1. Summary of Write Operation

Figure 45:
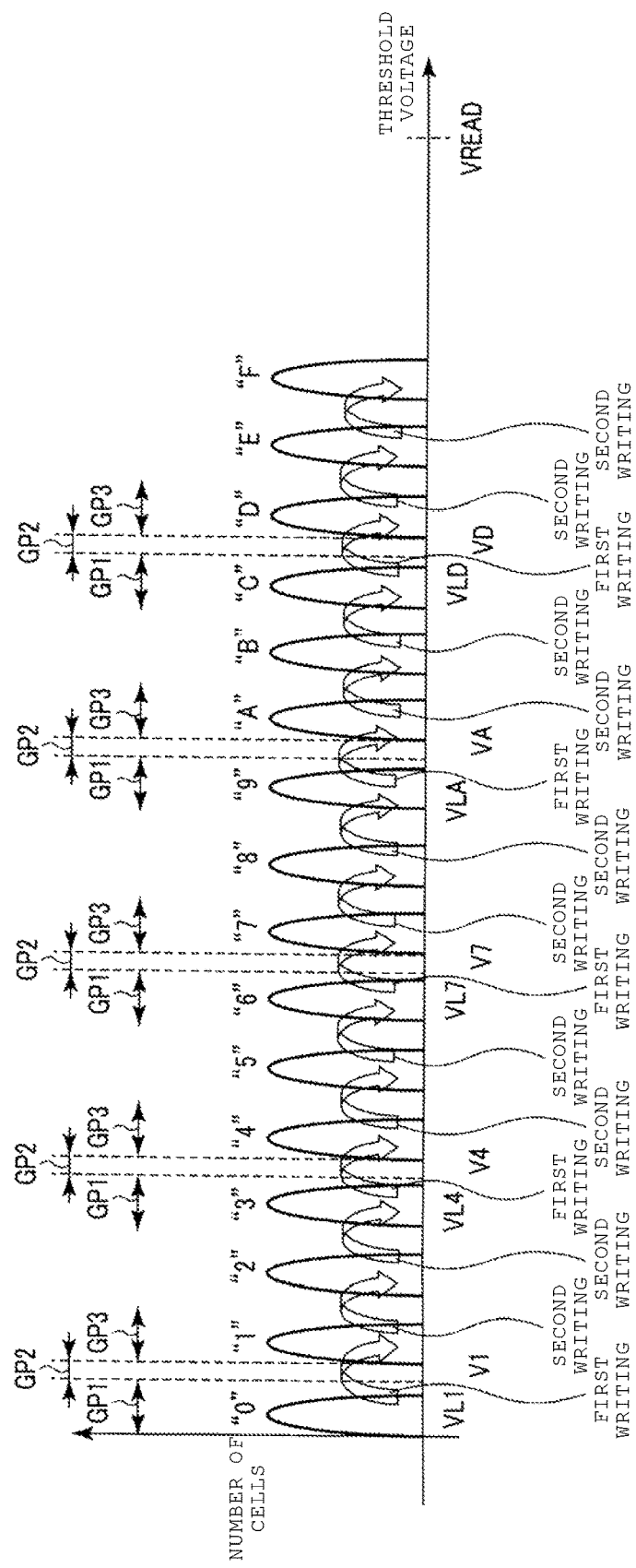
FIG. 45 is a diagram illustrating a write operation of the semiconductor memory device according to the fourth embodiment.

With reference to FIG. 45, a description will be made of a summary of a write operation of the semiconductor memory device according to the fourth embodiment.

In the fourth embodiment, when the sequencer 111 performs a write operation on the memory cell array 130, roughly two types of write methods, first writing and second writing, are performed in the same manner as in the first embodiment.

In the fourth embodiment, a description will be made of a write method of causing a threshold voltage distribution to transition from the 0 level to the 1 level, the 2 level, the 3 level, the 4 level, the 5 level, the 6 level, the 7 level, the 8 level, the 9 level, the A level, the B level, the C level, the D level, the E level, and the F level in this order.

As illustrated in FIG. 45, in the fourth embodiment, the first writing is applied to writing of the 1 level from the 0 level, writing of the 4 level from the 3 level, writing of the 7 level from the 6 level, writing of the A level from the 9 level, and writing of the D level from the C level. The second writing is applied to remaining writings. However, a method of applying the first writing and the second writing is not limited to the above description.

When the first writing is performed, the sequencer 111 determines in which group of the first to third groups the selected memory cell transistor MT is included.

4-2-2. Operation Flow of Write Operation

Next, with reference to FIGS. 46 to 56, a description will be made of an operation flow of a write operation of the semiconductor memory device 100 according to the fourth embodiment, and an operation flow based on the operation described in FIG. 45. The sense module based on the voltage sense method and the program verification operation described in the first embodiment are used for the fourth embodiment.

Figure 46:
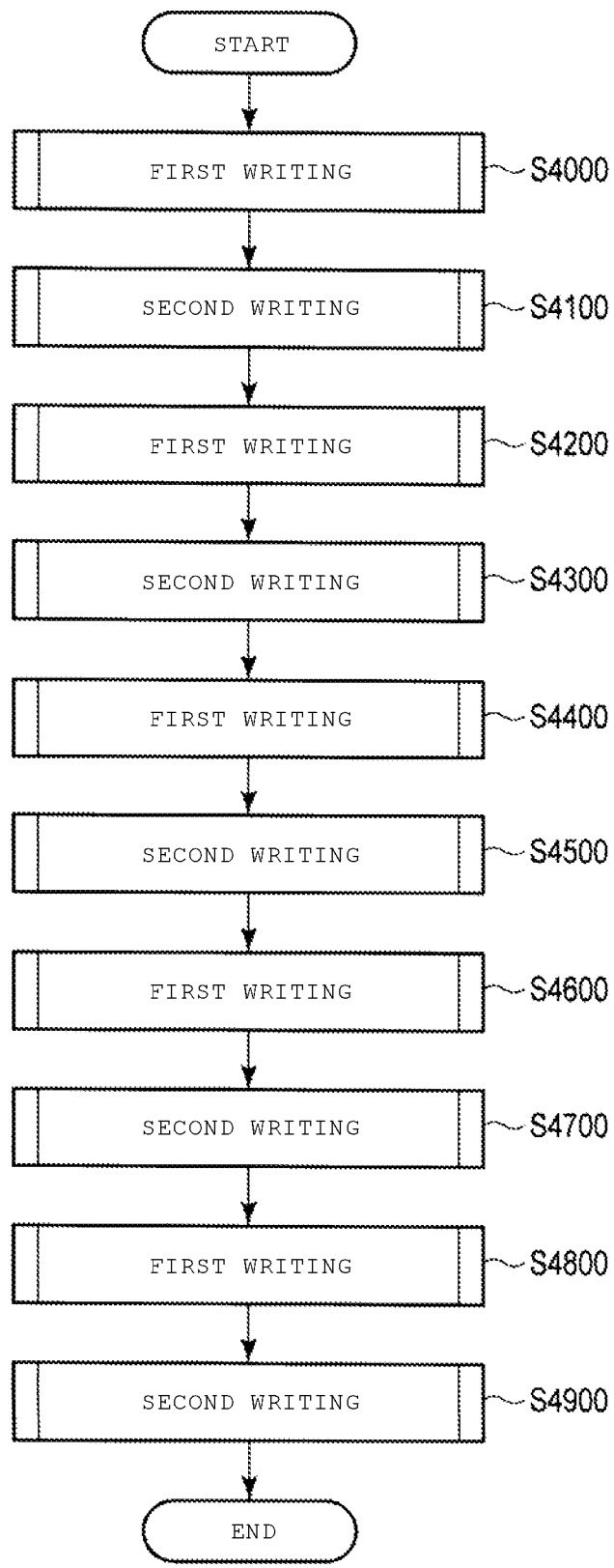
FIG. 46 is a flowchart illustrating a write operation of the semiconductor memory device according to the fourth embodiment.

As illustrated in FIG. 46, the semiconductor memory device 100 in a write operation of the fourth embodiment performs the first writing (step S4000) regarding writing of the 1 level from the 0 level, and then performs the second writing (step S4100) regarding writing of the 2 level from the 1 level and writing of the 3 level from the 2 level. Next, the semiconductor memory device 100 performs the first writing (step S4200) regarding writing of the 4 level from the 3 level, and then performs the second writing (step S4300) regarding writing of the 5 level from the 4 level and writing of the 6 level from the 5 level. Next, the semiconductor memory device 100 performs the first writing (step S4400) regarding writing of the 7 level from the 6 level, and then performs the second writing (step S4500) regarding writing of the 8 level from the 7 level and writing of the 9 level from the 8 level. Next, the semiconductor memory device 100 performs the first writing (step S4600) regarding writing of the A level from the 9 level, and then performs the second writing (step S4700) regarding writing of the B level from the A level and writing of the C level from the B level. Next, the semiconductor memory device 100 performs the first writing (step S4800) regarding writing of the D level from the C level, then performs the second writing (step S4900) regarding writing of the E level from the D level and writing of the F level from the E level, and finishes the write operation.

Figure 47:
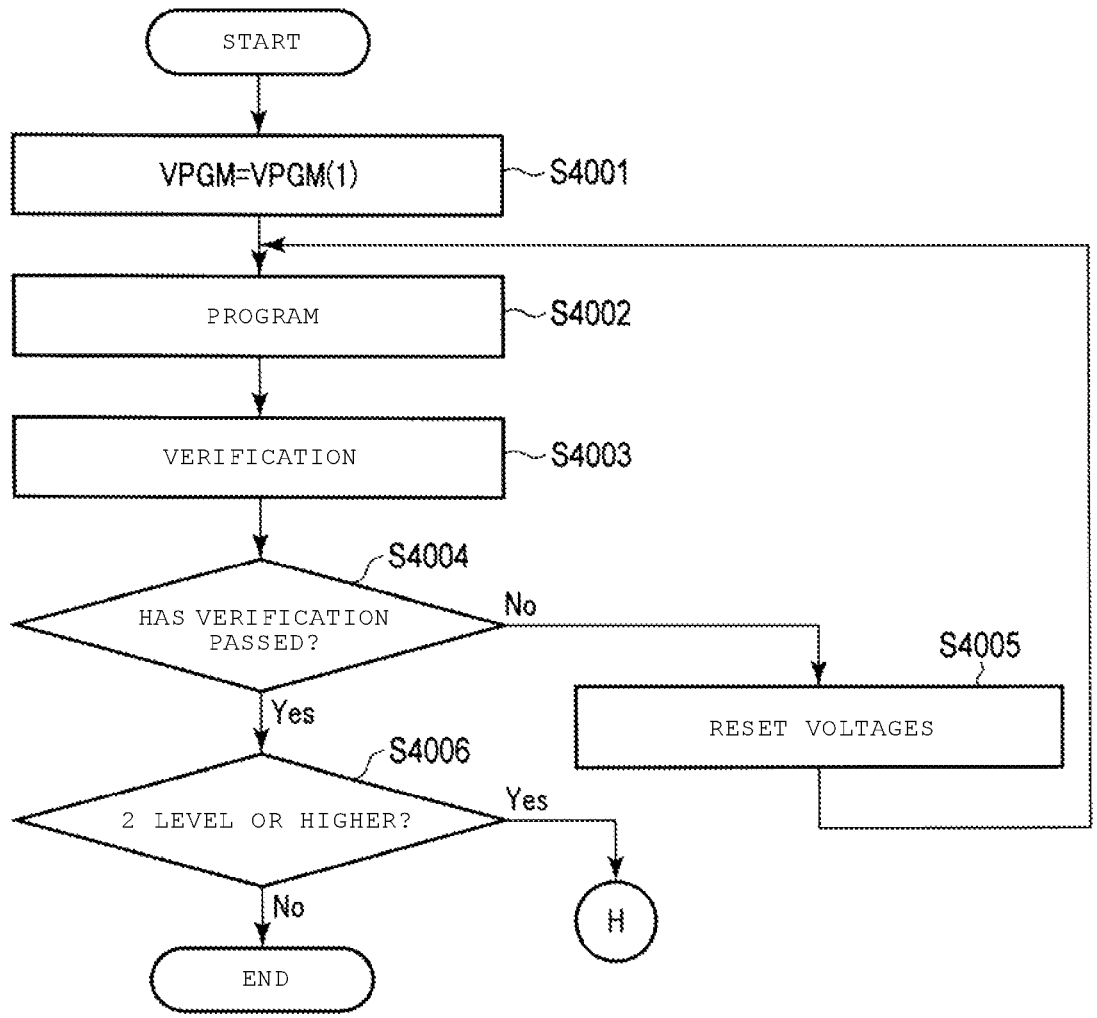
FIG. 47 is a flowchart illustrating a write operation of the semiconductor memory device according to the fourth embodiment.

With reference to FIG. 47, a description will be made of an operation flow of the first writing (step S4000) regarding writing of the 1 level from the 0 level.

Step S4001

First, the sequencer 111 performs a 1 level program operation on the memory cell transistor MT into which data of the 1 level or higher is to be written. Specifically, the sequencer 111 sets a program voltage VPGM to a 1 level program voltage VPGM(1).

Step S4002

The sequencer 111 performs a 1 level program operation on a target memory cell transistor MT by using the program voltage.

Step S4003

Next, the sequencer 111 performs a first program verification operation in order to determine whether or not a write target memory cell transistor MT is included in the first group. In this case, the sequencer 111 performs a program verification operation by using the voltage VL1.

Next, the sequencer 111 performs a second program verification operation in order to determine whether or not the write target memory cell transistor MT is included in the second group. In this case, the sequencer 111 performs a program verification operation by using the voltage V1 (where VL1<V1).

Step S4004

The sequencer 111 determines whether or not all write target memory cell transistors MT have passed the second program verification operation.

Step S4005

If any memory cell transistors MT have not passed the first and second program verification operations (NO in step S4004) among the write target memory cell transistors MT, the sequencer 111 determines in which group of the first to third groups the write target memory cell transistor MT is included. The sequencer 111 resets various voltages on the basis of a determined group, and performs step S4002.

Specifically, the sequencer 111 increases the program voltage VPGM by dVPGM, sets a voltage of the bit line BL included in the first group to the voltage VSS, sets a voltage of the bit line BL included in the second group to the voltage VBL, and sets a voltage of the bit line BL included in the third group to the voltage VINHIBIT.

Step S4006

Once all of the write target memory cell transistors MT have passed the second program verification operation (YES in step S4004), the sequencer 111 determines whether or not there is a memory cell transistor MT into which data of the 2 level or higher is to be written.

When there is no memory cell transistor MT into which data of the 2 level or higher is to be written (NO in step S4006), the sequencer 111 finishes the write operation.

Figure 48:
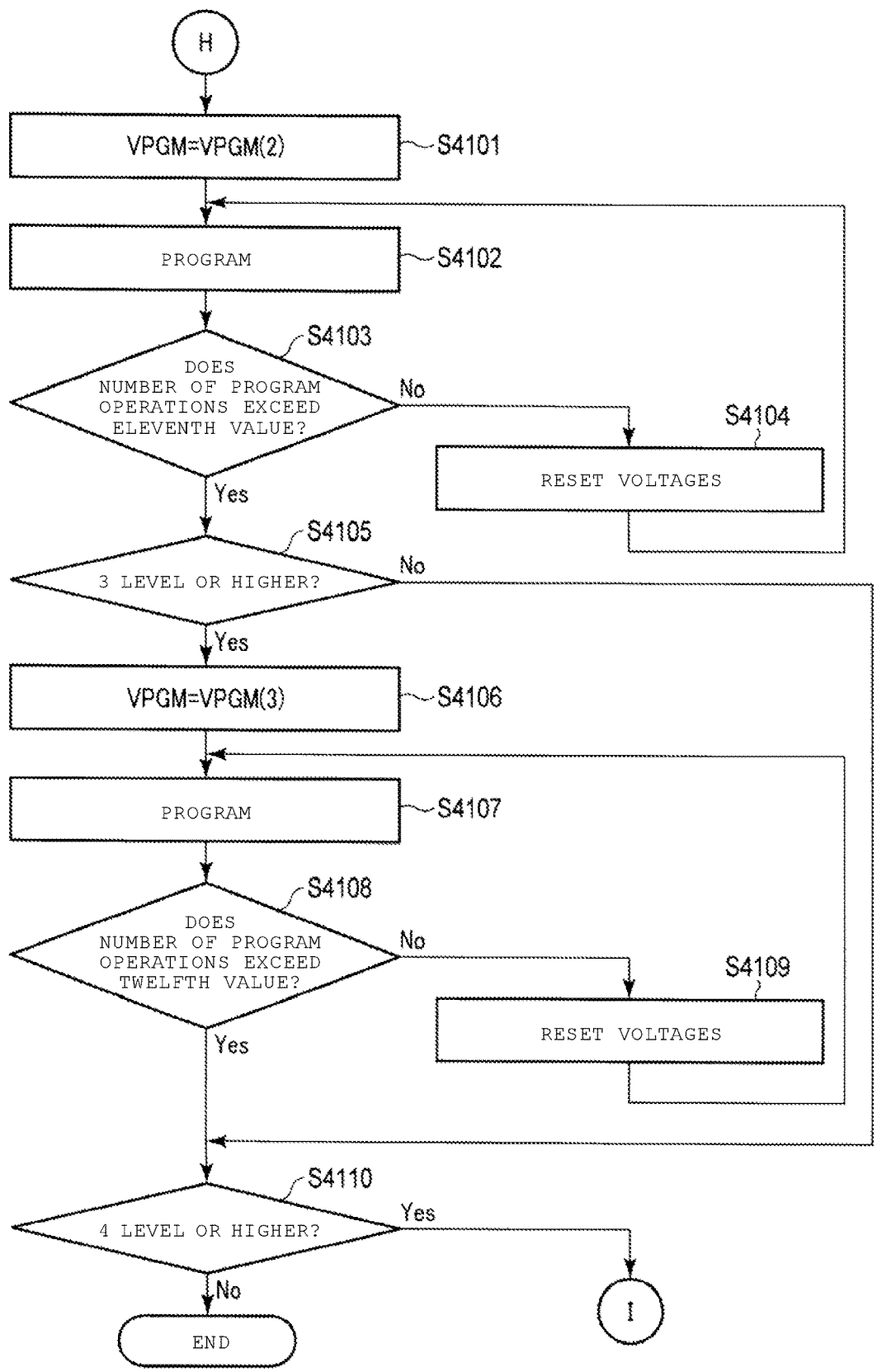
FIG. 48 is a flowchart illustrating a write operation of the semiconductor memory device according to the fourth embodiment.

With reference to FIG. 48, a description will be made of an operation flow of the second writing (step S4100) regarding writing of the 2 level from the 1 level and writing of the 3 level from the 2 level.

Step S4101

When there is a memory cell transistor MT into which data of the 2 level or higher is to be written (YES in step S4006), the sequencer 111 sets the program voltage VPGM to a 2 level program voltage VPGM(2). The voltage VPGM(2) is higher than the previous voltage VPGM(1)+dVPGM*Y (where Y is any integer).

Step S4102

The sequencer 111 performs a 2 level program operation on a target memory cell transistor MT by using the program voltage.

Step S4103

As described above, in the second writing, the number of program operations is restricted. The sequencer 111 counts the number of times of execution (the number of program operations) of step S4102, and determines whether or not the number of times of execution exceeds an eleventh value (the number of 2 level program operations) stored in the register 112. The eleventh value is the number of program operations after any level program operation is completed.

Step S4104

When the number of times of step S4102 does not exceed the eleventh value (NO in step S4103), the sequencer 111 resets various voltages so as to perform step S4102. Specifically, the sequencer 111 increases the program voltage VPGM by dVPGM.

Step S4105

When the number of times of step S4102 exceeds the eleventh value (YES in step S4103), the sequencer 111 determines whether or not there is a memory cell transistor MT into which data of the 3 level or higher is to be written.

When there is no memory cell transistor MT into which data of the 3 level or higher is to be written (NO in step S4105), the sequencer 111 finishes the write operation.

Step S4106

In a case where the sequencer 111 determines that there is a memory cell transistor MT into which data of the 3 level or higher is to be written (YES in step S4105), the sequencer 111 sets the program voltage VPGM to a 3 level program voltage VPGM(3). The voltage VPGM(3) is higher than the previous voltage VPGM(2)+dVPGM*Y (where Y is any integer).

Step S4107

The sequencer 111 performs a 3 level program operation on a target memory cell transistor MT by using the program voltage.

Step S4108

The sequencer 111 counts the number of times of execution (the number of program operations) of step S4107, and determines whether or not the number of times of execution exceeds a twelfth value (the number of 3 level program operations) stored in the register 112. The twelfth value is the number of program operations after any level program operation is completed.

When the number of times of execution of step S4107 exceeds the twelfth value (YES in step S4108), the sequencer 111 finishes the write operation.

Step S4109

When the number of times of step S4107 does not exceed the twelfth value (NO in step S4108), the sequencer 111 resets various voltages so as to perform step S4107. Specifically, the sequencer 111 increases the program voltage VPGM by dVPGM.

Step S4110

When the number of times of step S4107 exceeds the twelfth value (YES in step S4108), the sequencer 111 determines whether or not there is a memory cell transistor MT into which data of the 4 level or higher is to be written.

When there is no memory cell transistor MT into which data of the 4 level or higher is to be written (NO in step S4110), the sequencer 111 finishes the write operation.

Figure 49:
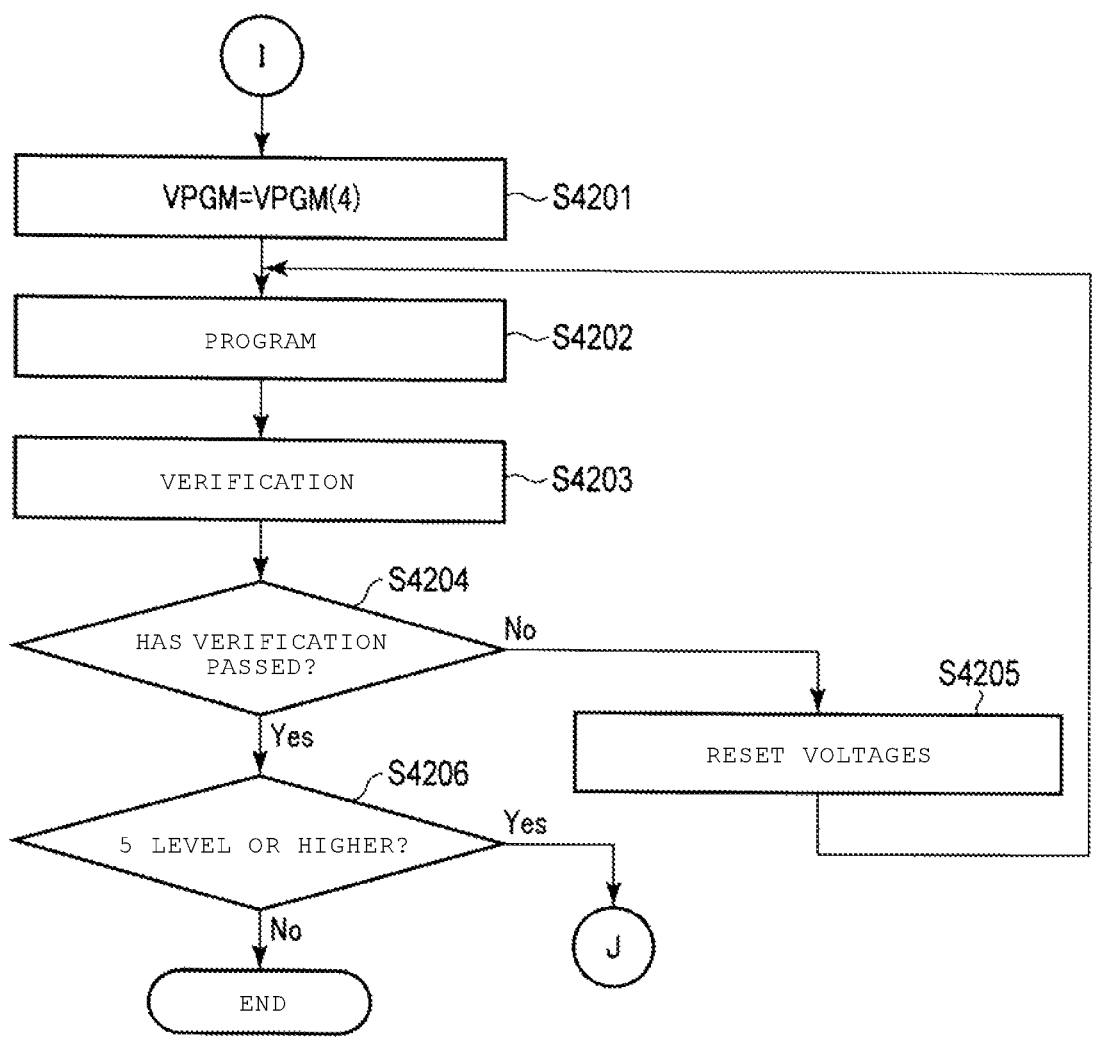
FIG. 49 is a flowchart illustrating a write operation of the semiconductor memory device according to the fourth embodiment.

With reference to FIG. 49, a description will be made of an operation flow of the first writing (step S4200) regarding writing of the 4 level from the 3 level.

Step S4201

When there is a memory cell transistor MT into which data of the 4 level or higher is to be written (YES in step S4110), the sequencer 111 sets the program voltage VPGM to a 4 level program voltage VPGM(4).

Step S4202

The sequencer 111 performs a 4 level program operation on a target memory cell transistor MT by using the program voltage.

Step S4203

Next, the sequencer 111 performs a first program verification operation in order to determine whether or not a write target memory cell transistor MT is included in the first group. In this case, the sequencer 111 performs a program verification operation by using the voltage VL4.

Next, the sequencer 111 performs a second program verification operation in order to determine whether or not the write target memory cell transistor MT is included in the second group. In this case, the sequencer 111 performs a program verification operation by using the voltage V4 (where VL4<V4).

Step S4204

The sequencer 111 determines whether or not all write target memory cell transistors MT have passed the second program verification operation.

Step S4205

If any memory cell transistors MT have not passed the first and second program verification operations (NO in step S4204) among the write target memory cell transistors MT, the sequencer 111 determines in which group of the first to third groups the write target memory cell transistor MT is included. The sequencer 111 resets various voltages on the basis of a determined group, and performs step S4202.

Specifically, the sequencer 111 increases the program voltage VPGM by dVPGM, sets a voltage of the bit line BL included in the first group to the voltage VSS, sets a voltage of the bit line BL included in the second group to the voltage VBL, and sets a voltage of the bit line BL included in the third group to the voltage VINHIBIT.

Step S4206

Once all of the write target memory cell transistors MT have passed the second program verification operation (YES in step S4204), the sequencer 111 determines whether or not there is a memory cell transistor MT into which data of the 5 level or higher is to be written.

When there is no memory cell transistor MT into which data of the 5 level or higher is to be written (NO in step S4206), the sequencer 111 finishes the write operation.

Figure 50:
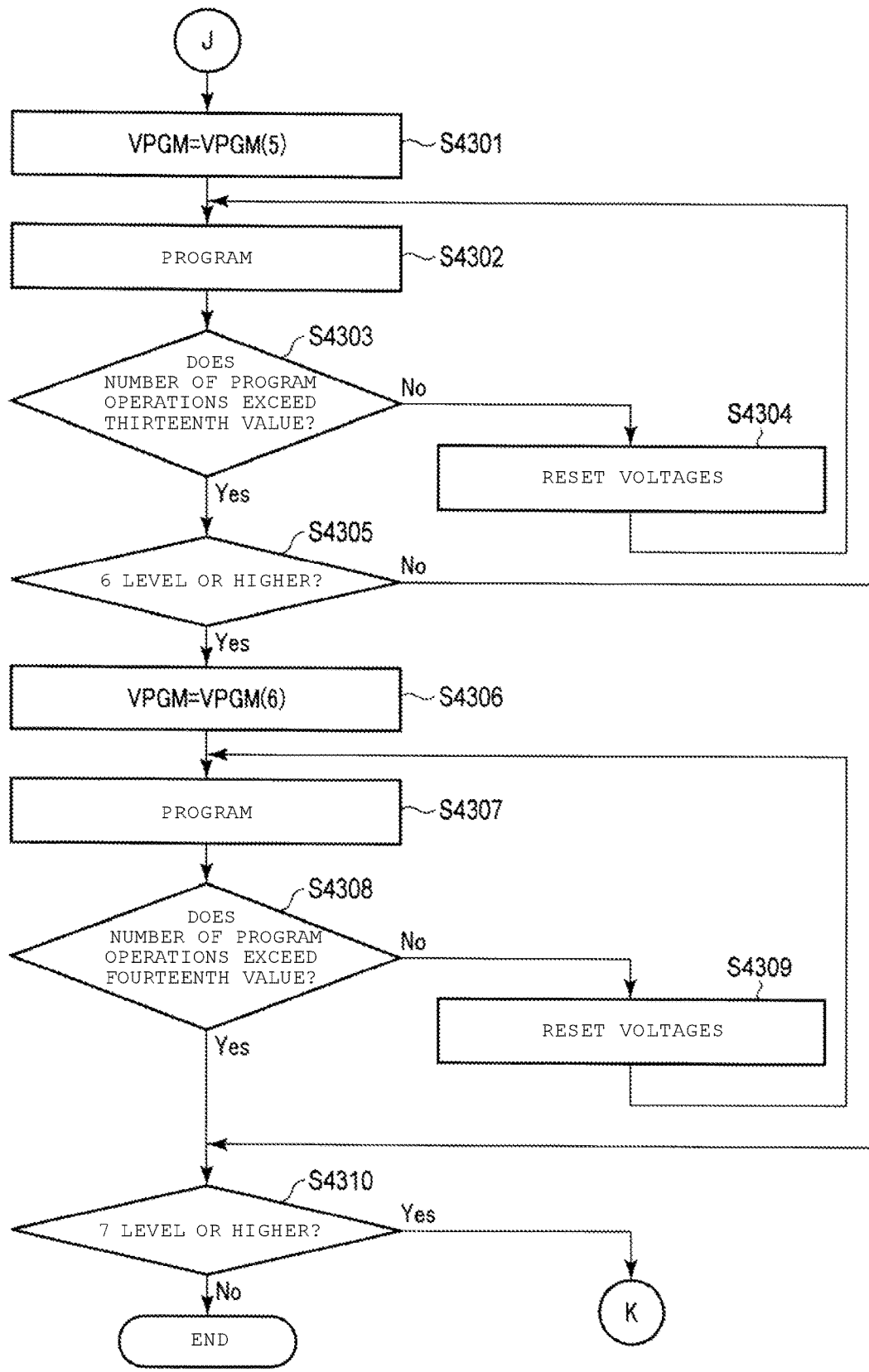
FIG. 50 is a flowchart illustrating a write operation of the semiconductor memory device according to the fourth embodiment.

With reference to FIG. 50, a description will be made of an operation flow of the second writing (step S4300) regarding writing of the 5 level from the 4 level and writing of the 6 level from the 5 level.

Step S4301

When there is a memory cell transistor MT into which data of the 5 level or higher is to be written (YES in step S4206), the sequencer 111 sets the program voltage VPGM to a 5 level program voltage VPGM(5). The voltage VPGM (5) is higher than the previous voltage VPGM(4)+dVPGM*Y (where Y is any integer).

Step S4302

The sequencer 111 performs a 5 level program operation on a target memory cell transistor MT by using the program voltage.

Step S4303

As described above, in the second writing, the number of program operations is restricted. The sequencer 111 counts the number of times of execution (the number of program operations) of step S4302, and determines whether or not the number of times of execution exceeds a thirteenth value (the number of 5 level program operations) stored in the register 112. The thirteenth value is the number of program operations after any level program operation is completed.

Step S4304

When the number of times of step S4302 does not exceed the thirteenth value (NO in step S4303), the sequencer 111 resets various voltages so as to perform step S4302. Specifically, the sequencer 111 increases the program voltage VPGM by dVPGM.

Step S4305

When the number of times of step S4302 exceeds the thirteenth value (YES in step S4303), the sequencer 111 determines whether or not there is a memory cell transistor MT into which data of the 6 level or higher is to be written.

When there is no memory cell transistor MT into which data of the 6 level or higher is to be written (NO in step S4305), the sequencer 111 finishes the write operation.

Step S4306

In a case where the sequencer 111 determines that there is a memory cell transistor MT into which data of the 6 level or higher is to be written (YES in step S4305), the sequencer 111 sets the program voltage VPGM to a 6 level program voltage VPGM(6). The voltage VPGM(6) is higher than the previous voltage VPGM(5)+dVPGM*Y (where Y is any integer).

Step S4307

The sequencer 111 performs a 6 level program operation on a target memory cell transistor MT by using the program voltage.

Step S4308

The sequencer 111 counts the number of times of execution (the number of program operations) of step S4307, and determines whether or not the number of times of execution exceeds a fourteenth value (the number of 6 level program operations) stored in the register 112. The fourteenth value is the number of program operations after any level program operation is completed.

In a case where it is determined whether or not the number of times of execution of step S4307 exceeds the fourteenth value (YES in step S4308), the sequencer 111 finishes the write operation.

Step S4309

When the number of times of step S4307 does not exceed the fourteenth value (NO in step S4308), the sequencer 111 resets various voltages so as to perform step S4307. Specifically, the sequencer 111 increases the program voltage VPGM by dVPGM.

Step S4310

When the number of times of step S4307 exceeds the fourteenth value (YES in step S4308), the sequencer 111 determines whether or not there is a memory cell transistor MT into which data of the 7 level or higher is to be written.

When there is no memory cell transistor MT into which data of the 7 level or higher is to be written (NO in step S4310), the sequencer 111 finishes the write operation.

Figure 51:
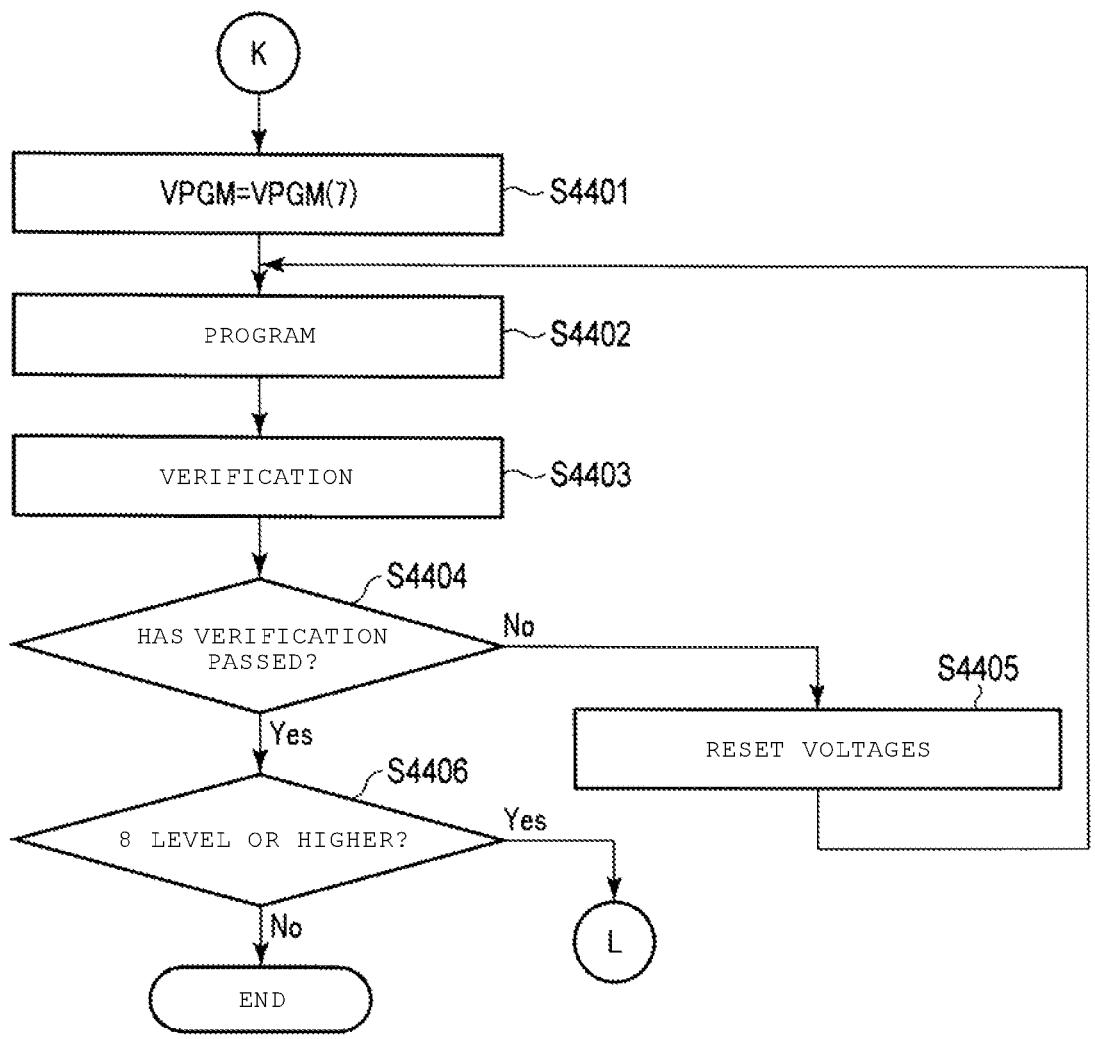
FIG. 51 is a flowchart illustrating a write operation of the semiconductor memory device according to the fourth embodiment.

With reference to FIG. 51, a description will be made of an operation flow of the first writing (step S4400) regarding writing of the 7 level from the 6 level.

Step S4401

When there is a memory cell transistor MT into which data of the 7 level or higher is to be written (YES in step S4310), the sequencer 111 sets the program voltage VPGM to a 7 level program voltage VPGM(7).

Step S4402
The sequencer 111 performs a 7 level program operation on a target memory cell transistor MT by using the program voltage.

Step S4403
Next, the sequencer 111 performs a first program verification operation in order to determine whether or not a write target memory cell transistor MT is included in the first group. In this case, the sequencer 111 performs a program verification operation by using the voltage VL7.

Next, the sequencer 111 performs a second program verification operation in order to determine whether or not the write target memory cell transistor MT is included in the second group. In this case, the sequencer 111 performs a program verification operation by using the voltage V7 (where VL7<V7).

Step S4404
The sequencer 111 determines whether or not all write target memory cell transistors MT have passed the second program verification operation.

Step S4405
If any memory cell transistors MT have not passed the first and second program verification operations (NO in step S4404) among the write target memory cell transistors MT, the sequencer 111 determines in which group of the first to third groups the write target memory cell transistor MT is included. The sequencer 111 resets various voltages on the basis of a determined group, and performs step S4402.

Specifically, the sequencer 111 increases the program voltage VPGM by dVPGM, sets a voltage of the bit line BL included in the first group to the voltage VSS, sets a voltage of the bit line BL included in the second group to the voltage VBL, and sets a voltage of the bit line BL included in the third group to the voltage VINHIBIT.

Step S4406
Once all of the write target memory cell transistors MT have passed the second program verification operation (YES in step S4404), the sequencer 111 determines whether or not there is a memory cell transistor MT into which data of the 8 level or higher is to be written.

When there is no memory cell transistor MT into which data of the 8 level or higher is to be written (NO in step S4406), the sequencer 111 finishes the write operation.

Figure 52:
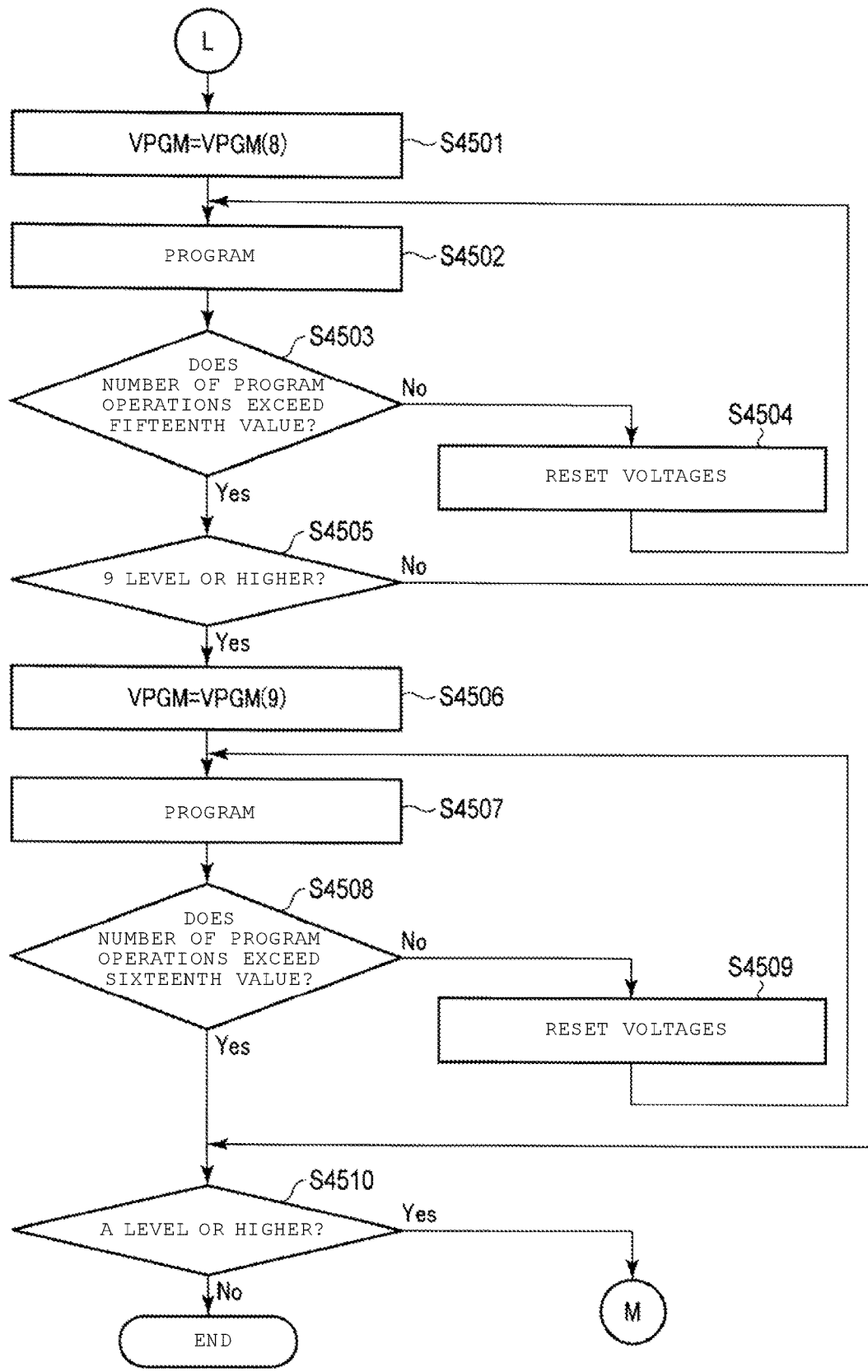
FIG. 52 is a flowchart illustrating a write operation of the semiconductor memory device according to the fourth embodiment.

With reference to FIG. 52, a description will be made of an operation flow of the second writing (step S4500) regarding writing of the 8 level from the 7 level and writing of the 9 level from the 8 level.

Step S4501
When there is a memory cell transistor MT into which data of the 8 level or higher is to be written (YES in step S4406), the sequencer 111 sets the program voltage VPGM to an 8 level program voltage VPGM(8). The voltage VPGM(8) is higher than the previous voltage VPGM(7)+dVPGM*Y (where Y is any integer).

Step S4502
The sequencer 111 performs an 8 level program operation on a target memory cell transistor MT by using the program voltage.

Step S4503
As described above, in the second writing, the number of program operations is restricted. The sequencer 111 counts the number of times of execution (the number of program operations) of step S4502, and determines whether or not the number of times of execution exceeds a fifteenth value (the number of 8 level program operations) stored in the register 112. The fifteenth value is the number of program operations after any level program operation is completed.

Step S4504
When the number of times of step S4502 does not exceed the fifteenth value (NO in step S4503), the sequencer 111 resets various voltages so as to perform step S4502. Specifically, the sequencer 111 increases the program voltage VPGM by dVPGM.

Step S4505
When the number of times of step S4502 exceeds the fifteenth value (YES in step S4503), the sequencer 111 determines whether or not there is a memory cell transistor MT into which data of the 9 level or higher is to be written.

When there is no memory cell transistor MT into which data of the 9 level or higher is to be written (NO in step S4505), the sequencer 111 finishes the write operation.

Step S4506
In a case where the sequencer 111 determines that there is a memory cell transistor MT into which data of the 9 level or higher is to be written (YES in step S4505), the sequencer 111 sets the program voltage VPGM to a 9 level program voltage VPGM(9). The voltage VPGM(9) is higher than the previous voltage VPGM(8)+dVPGM*Y (where Y is any integer).

Step S4507
The sequencer 111 performs a 9 level program operation on a target memory cell transistor MT by using the program voltage.

Step S4508
The sequencer 111 counts the number of times of execution (the number of program operations) of step S4507, and determines whether or not the number of times of execution exceeds a sixteenth value (the number of 9 level program operations) stored in the register 112. The sixteenth value is the number of program operations after any level program operation is completed.

In a case where it is determined whether or not the number of times of execution of step S4507 exceeds the sixteenth value (YES in step S4508), the sequencer 111 finishes the write operation.

Step S4509
When the number of times of step S4507 does not exceed the sixteenth value (NO in step S4508), the sequencer 111 resets various voltages so as to perform step S4507. Specifically, the sequencer 111 increases the program voltage VPGM by dVPGM.

Step S4510
When the number of times of step S4507 exceeds the sixteenth value (YES in step S4508), the sequencer 111 determines whether or not there is a memory cell transistor MT into which data of the A level or higher is to be written.

When there is no memory cell transistor MT into which data of the A level or higher is to be written (NO in step S4510), the sequencer 111 finishes the write operation.

Figure 53:
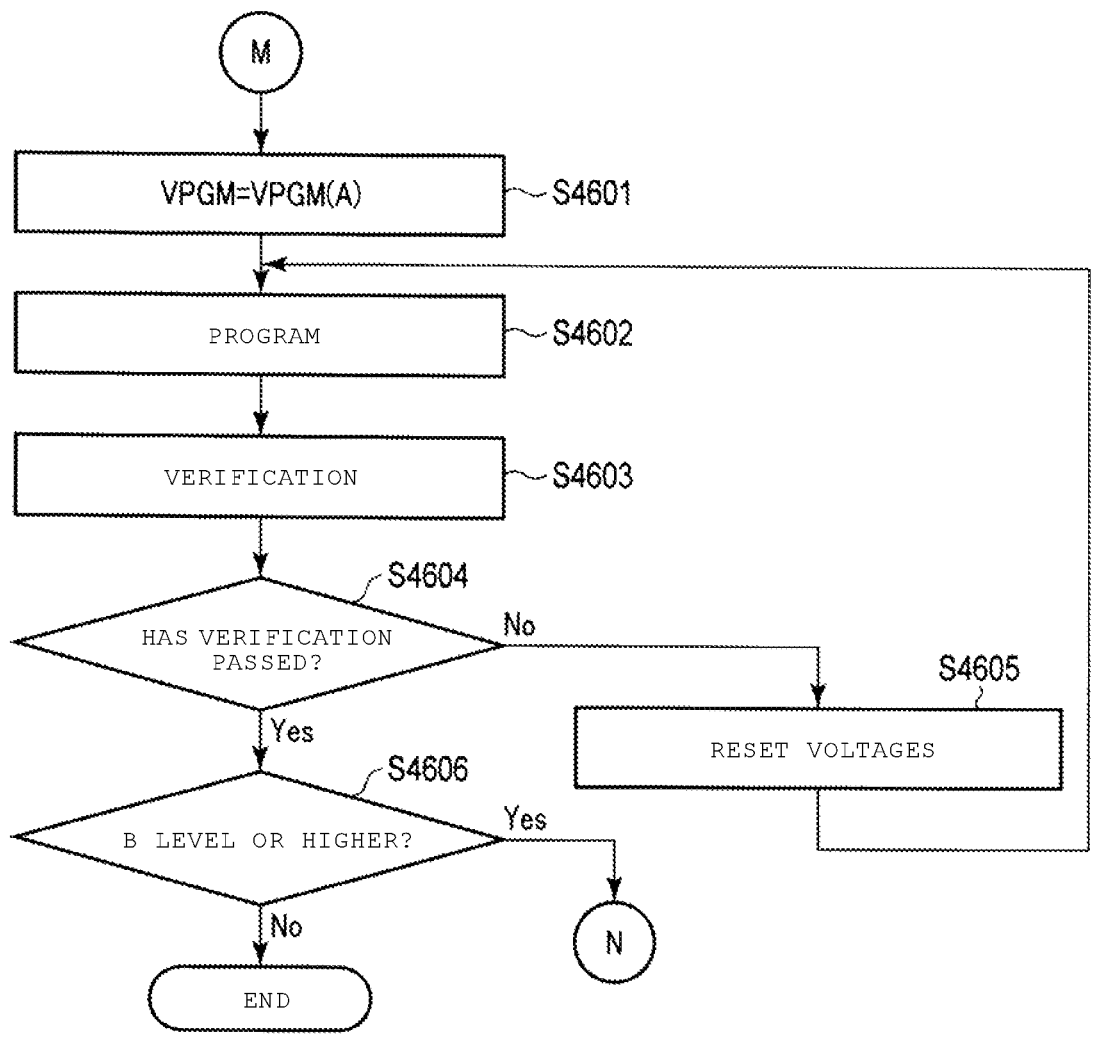
FIG. 53 is a flowchart illustrating a write operation of the semiconductor memory device according to the fourth embodiment.

With reference to FIG. 53, a description will be made of an operation flow of the first writing (step S4600) regarding writing of the A level from the 9 level.

Step S4601 to step S4606
The semiconductor memory device 100 performs the same operations as those in steps S2001 to S2006.

Figure 54:
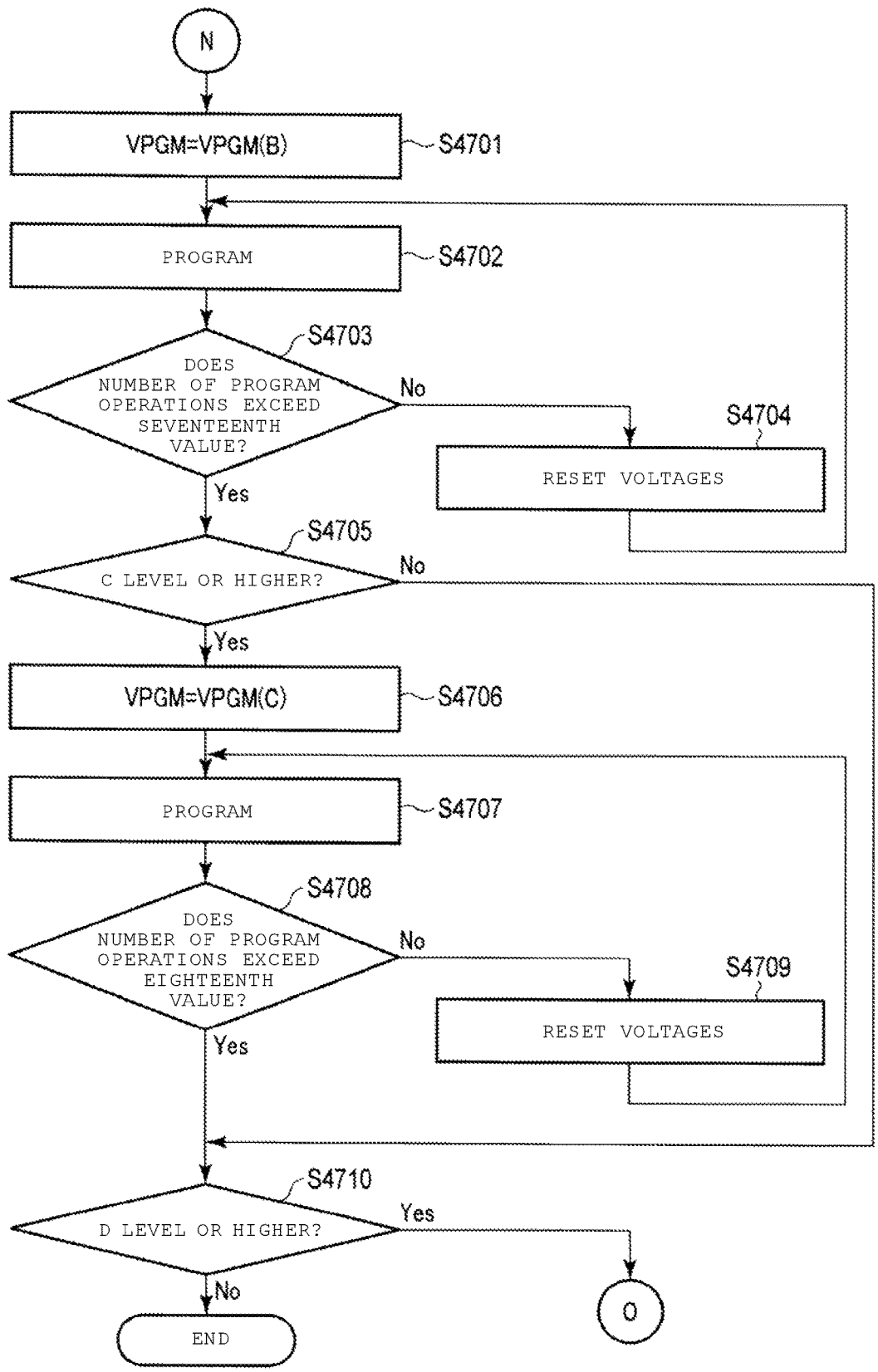
FIG. 54 is a flowchart illustrating a write operation of the semiconductor memory device according to the fourth embodiment.

With reference to FIG. 54, a description will be made of an operation flow of the second writing (step S4700) regarding writing of the B level from the A level and writing of the C level from the B level.

Step S4701 to step S4710
The memory system 1 performs the same operations as those in steps S2101 to S2110.

The sequencer 111 performs a determination operation by using a seventeenth value (the number of B level program operations) instead of the third value in step S4703, and performs a determination operation by using an eighteenth value (the number of C level program operations) instead of the second value in step S4708.

Figure 55:
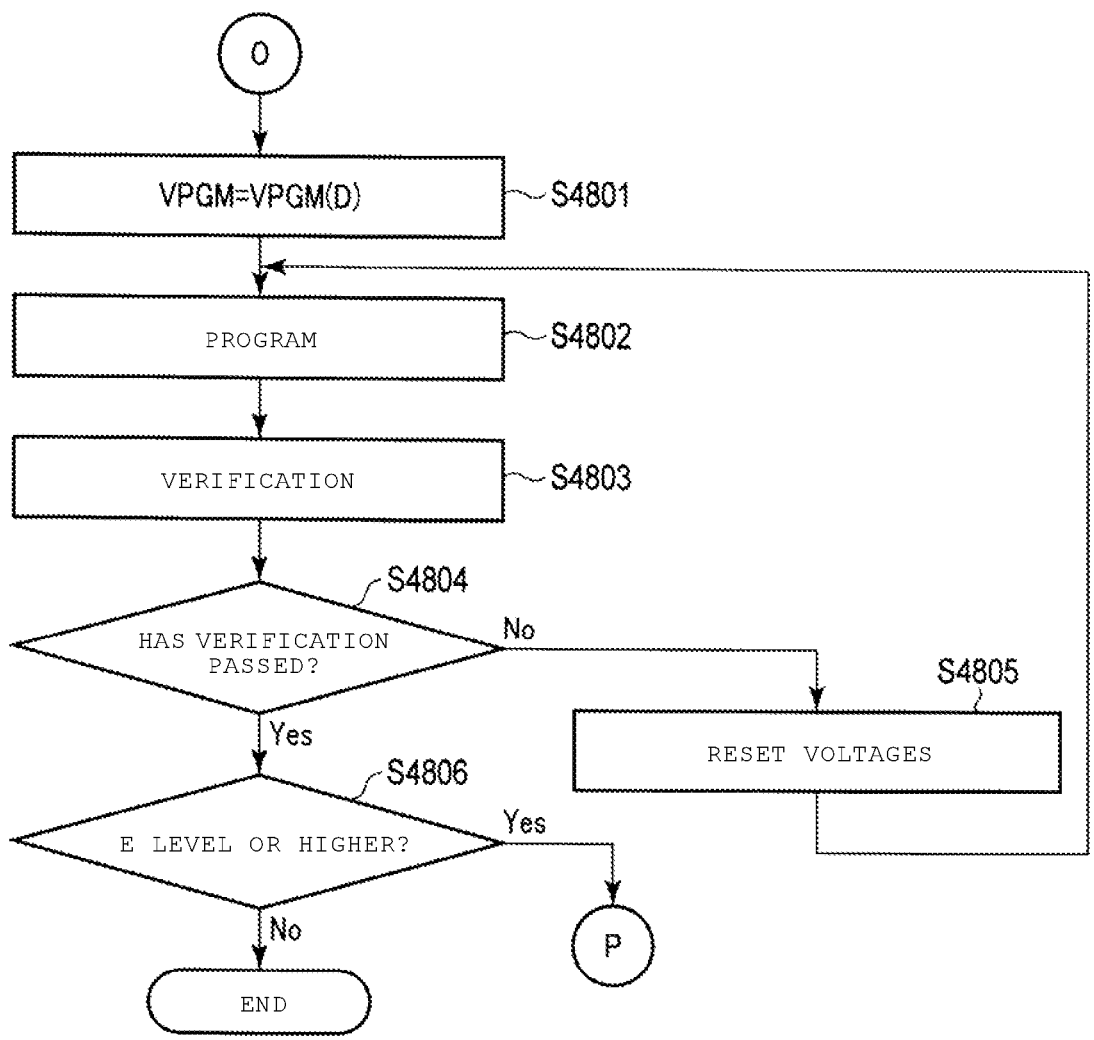
FIG. 55 is a flowchart illustrating a write operation of the semiconductor memory device according to the fourth embodiment.

With reference to FIG. 55, a description will be made of an operation flow of the first writing (step S4800) regarding writing of the D level from the C level.

Step S4801 to step S4806

The semiconductor memory device 100 performs the same operations as those in steps S2201 to S2206.

Figure 56:
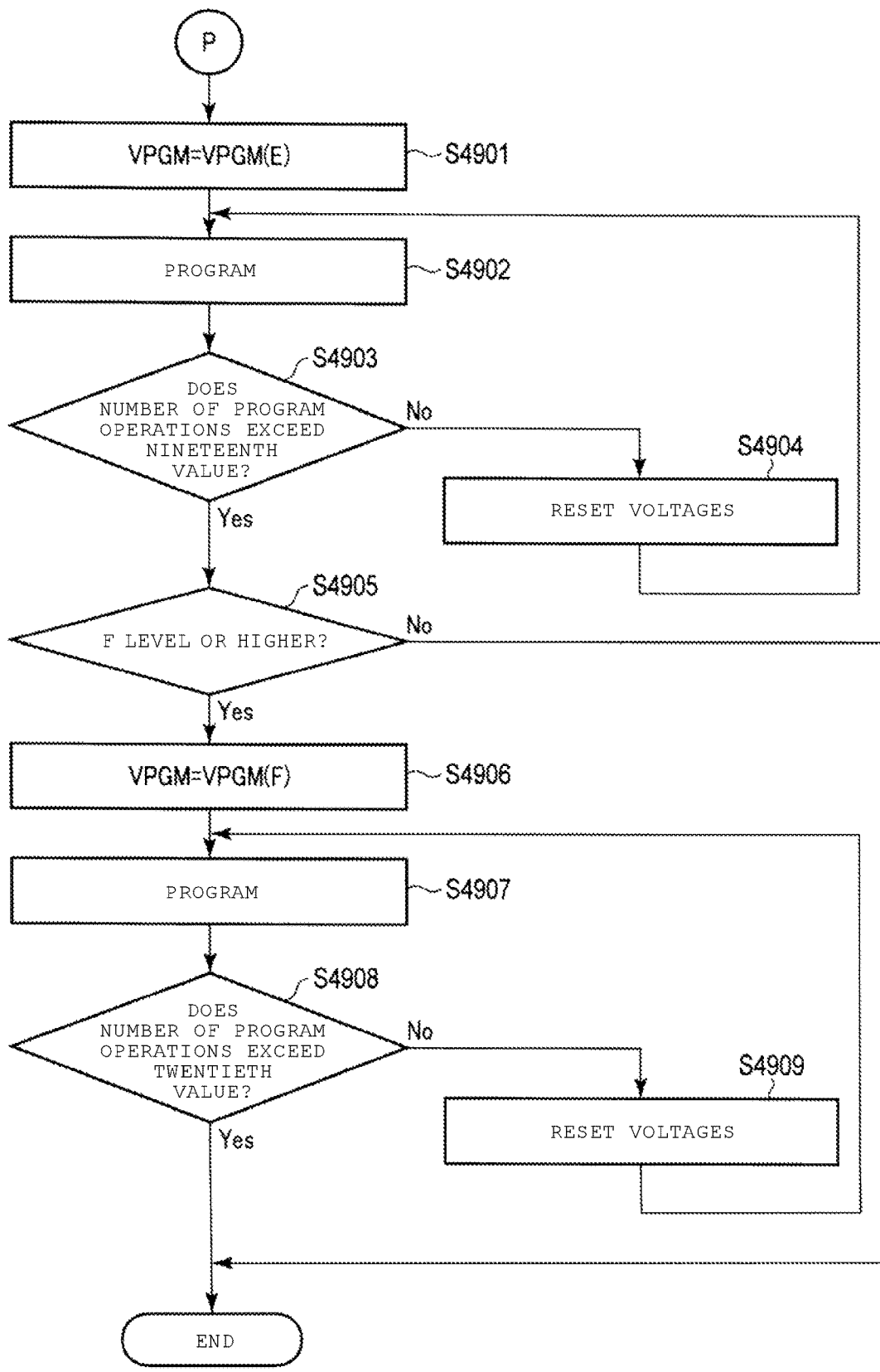
FIG. 56 is a flowchart illustrating a write operation of the semiconductor memory device according to the fourth embodiment.

With reference to FIG. 56, a description will be made of an operation flow of the second writing (step S4900) regarding writing of the E level from the D level and writing of the F level from the E level.

Step S4901 to step S4909

The memory system 1 performs the same operations as those in steps S2301 to S2309.

The sequencer 111 performs a determination operation by using a nineteenth value (the number of E level program operations) instead of the fifth value in step S4903, and performs a determination operation by using a twentieth value (the number of F level program operations) instead of the sixth value in step S4908.

The operations illustrated in FIGS. 46 to 56 are based on the operation described with reference to FIG. 45. Thus, in a case where a method of applying the first writing and the second writing is changed, an operation flow of a write operation of the semiconductor memory device 100 according to the fourth embodiment is also changed according to the method of applying the first writing and the second writing.

4-2-3. Specific Example of Pulse

Next, with reference to FIGS. 57 to 61, a description will be made of a specific pulse example in a case where the write operation of the fourth embodiment is applied to the above-described memory cell transistor MT. Illustration methods in FIGS. 57 to 61 are the same as that in FIG. 13.

Figure 57:
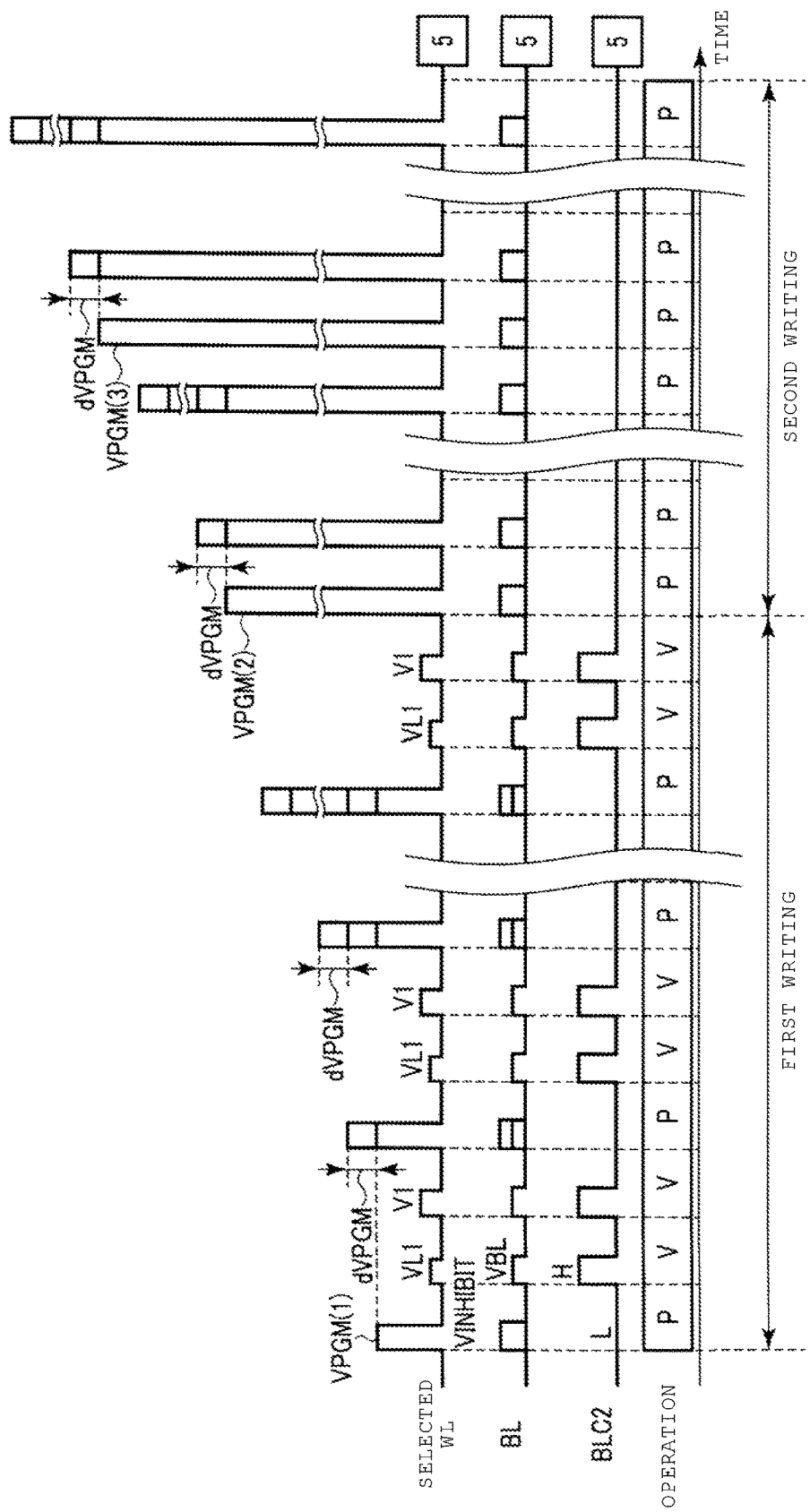
FIG. 57 is a diagram illustrating pulses during a write operation of the semiconductor memory device according to the fourth embodiment.

As illustrated in FIG. 57, first, the sequencer 111 performs the first writing regarding writing of the 1 level from the 0 level. If the first writing regarding writing of the 1 level from the 0 level is completed, the sequencer 111 performs the second writing regarding writing of the 2 level from the 1 level and writing of the 3 level from the 2 level.

Figure 58:
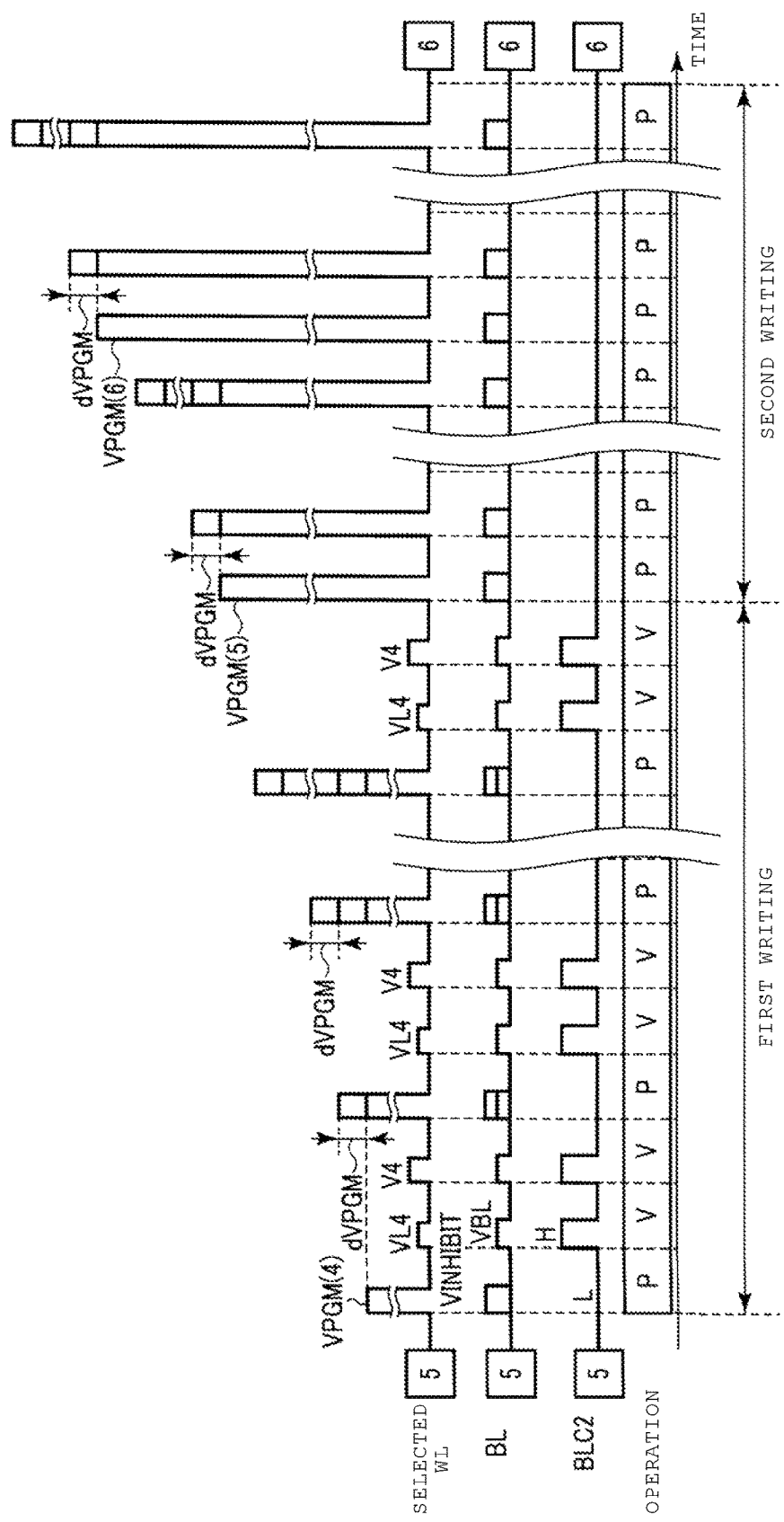
FIG. 58 is a diagram illustrating pulses during a write operation of the semiconductor memory device according to the fourth embodiment.

As illustrated in FIG. 58, if the second writing regarding writing of the 2 level from the 1 level and writing of the 3 level from the 2 level is completed, the sequencer 111 performs the first writing regarding writing of the 4 level from the 3 level. If the first writing regarding writing of the 4 level from the 3 level is completed, the sequencer 111 performs the second writing regarding writing of the 5 level from the 4 level and writing of the 6 level from the 5 level.

Figure 59:
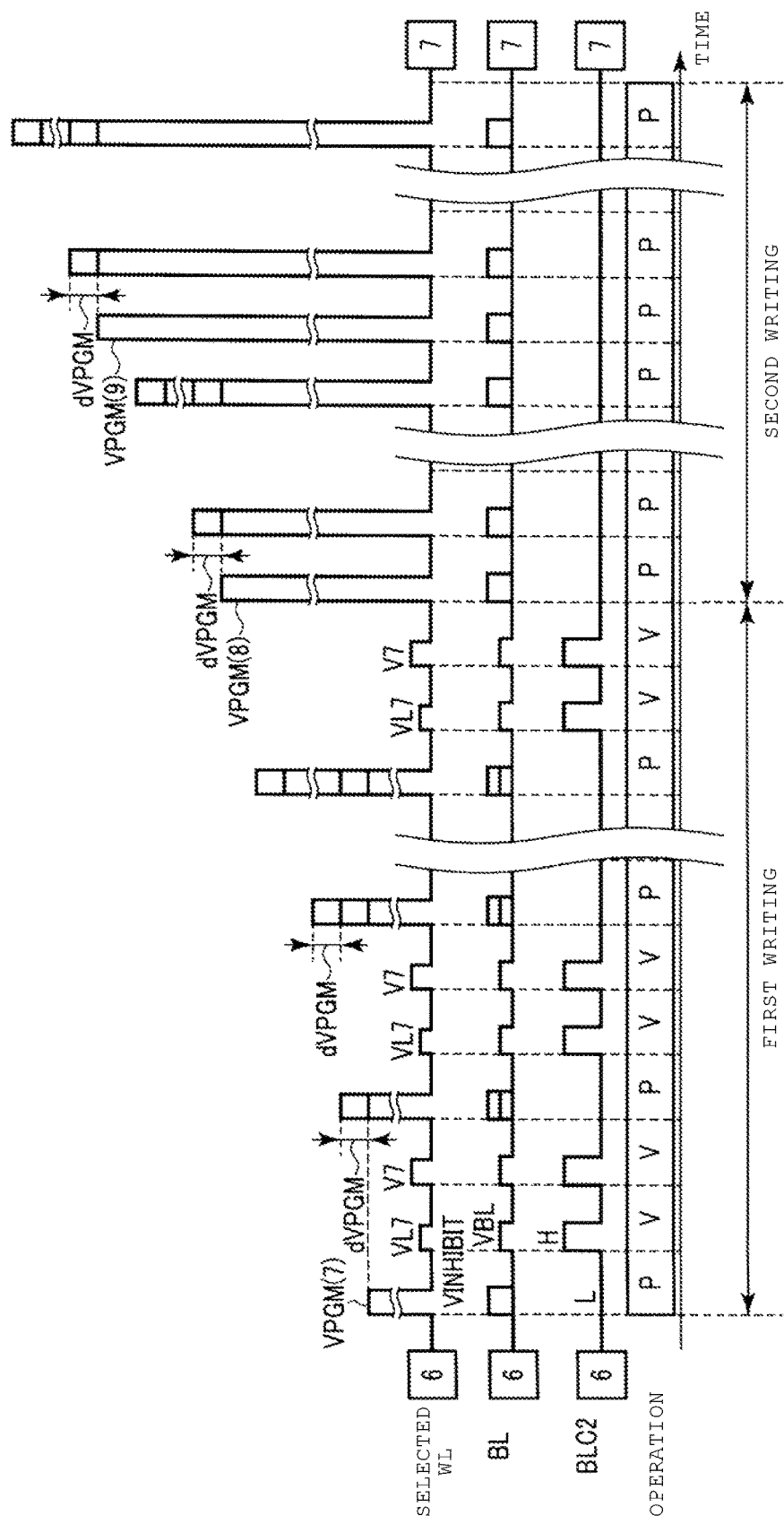
FIG. 59 is a diagram illustrating pulses during a write operation of the semiconductor memory device according to the fourth embodiment.

As illustrated in FIG. 59, if the second writing regarding writing of the 5 level from the 4 level and writing of the 6 level from the 5 level is completed, the sequencer 111 performs the first writing regarding writing of the 7 level from the 6 level. If the first writing regarding writing of the 7 level from the 6 level is completed, the sequencer 111 performs the second writing regarding writing of the 8 level from the 7 level and writing of the 9 level from the 8 level.

Figure 60:
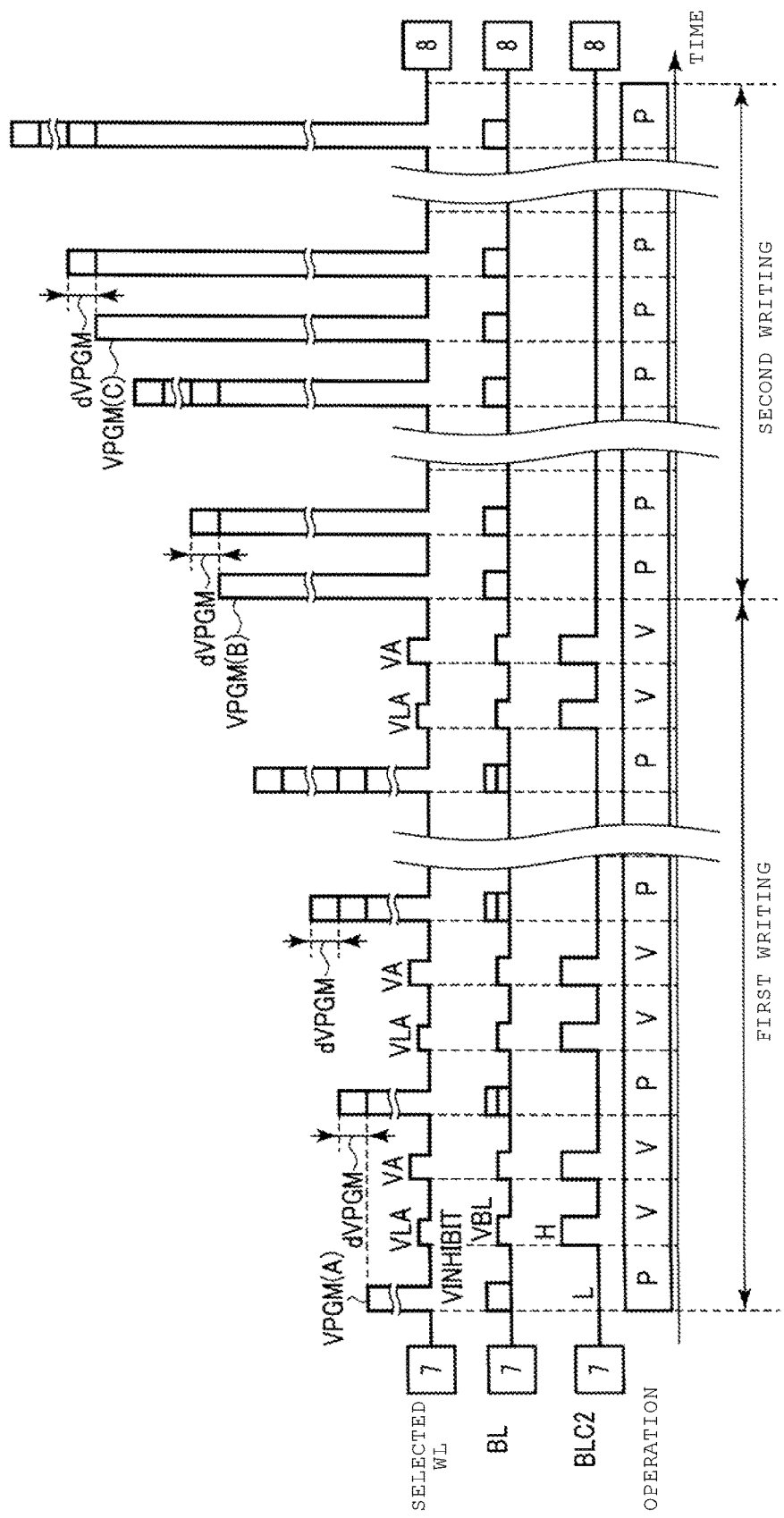
FIG. 60 is a diagram illustrating pulses during a write operation of the semiconductor memory device according to the fourth embodiment.

As illustrated in FIG. 60, if the second writing regarding writing of the 8 level from the 7 level and writing of the 9 level from the 8 level is completed, the sequencer 111 performs the first writing regarding writing of the A level from the 9 level. If the first writing regarding writing of the A level from the 9 level is completed, the sequencer 111 performs the second writing regarding writing of the B level from the A level and writing of the C level from the B level.

Figure 61:
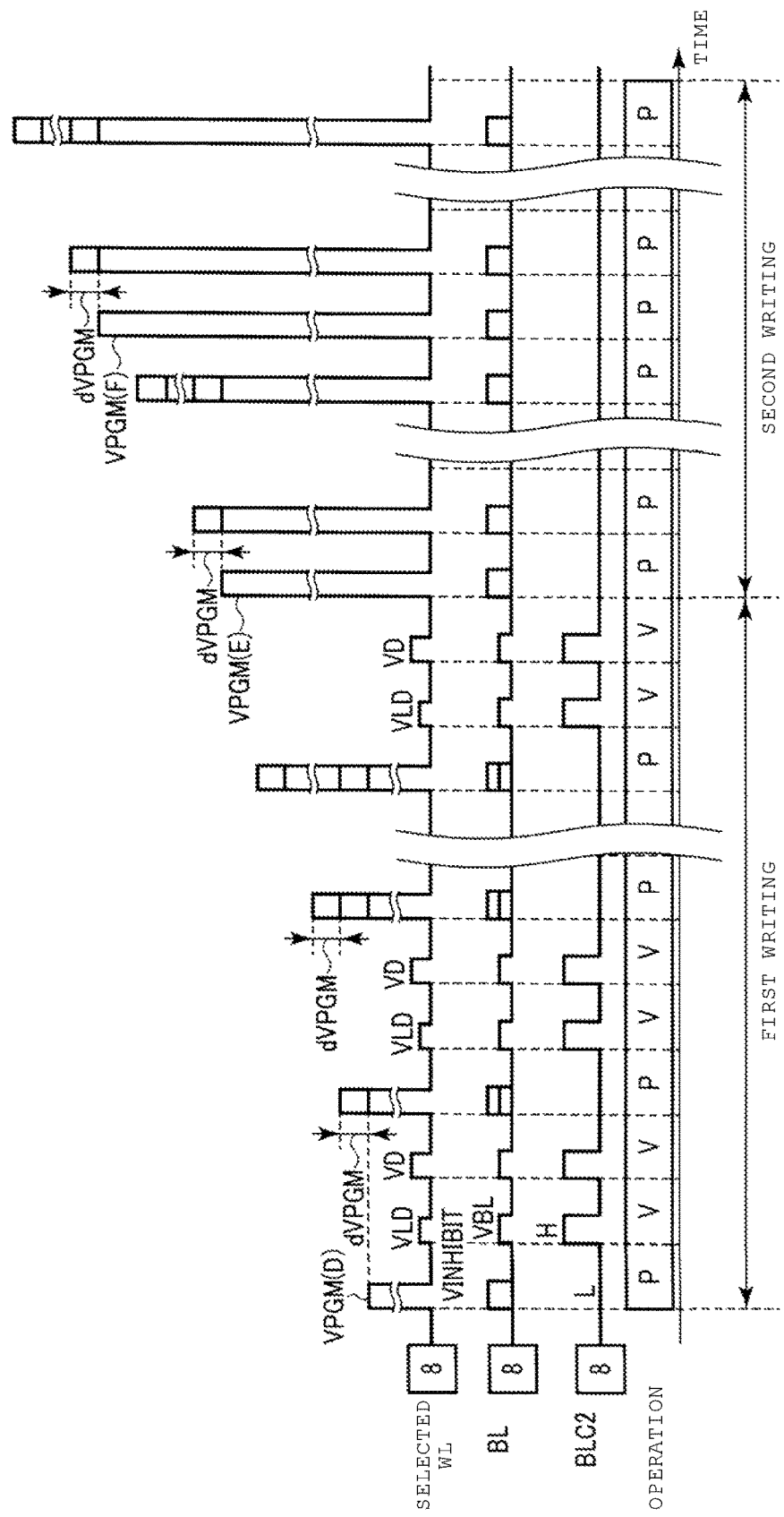
FIG. 61 is a diagram illustrating pulses during a write operation of the semiconductor memory device according to the fourth embodiment.
Figure 62:
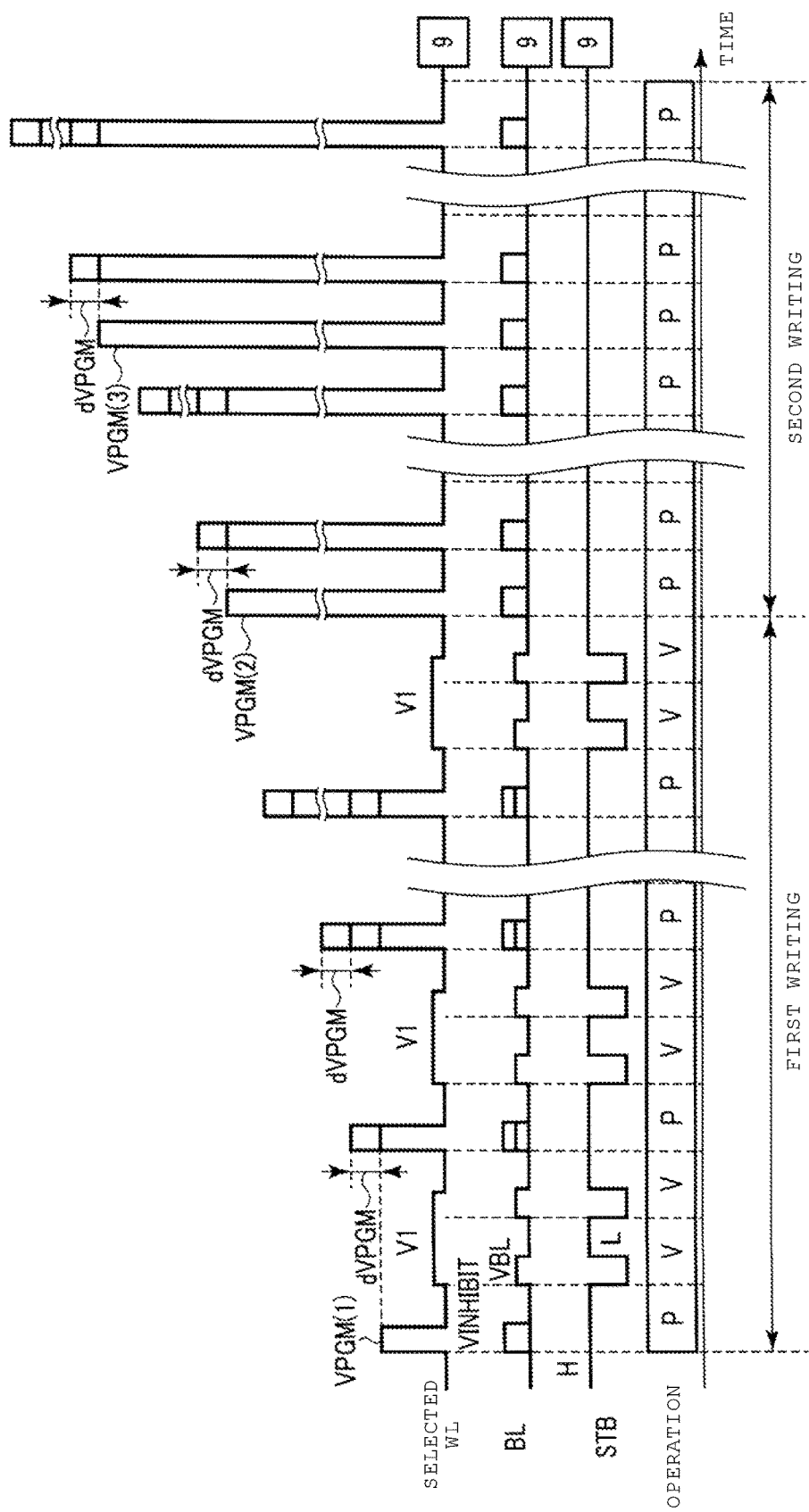
FIG. 62 is a diagram illustrating pulses during a write operation of the semiconductor memory device according to a modification example of the fourth embodiment.
Figure 63:
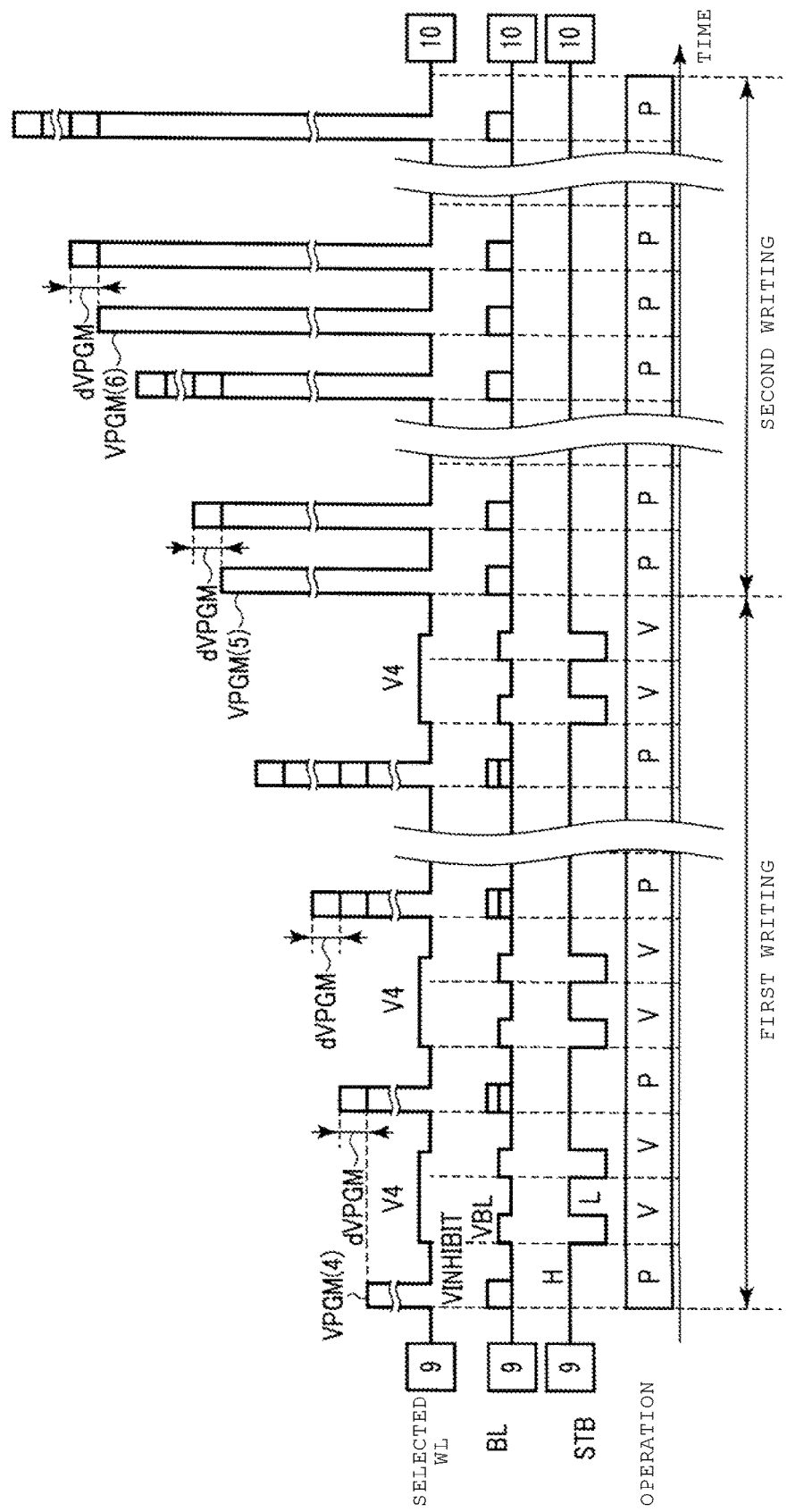
FIG. 63 is a diagram illustrating pulses during a write operation of the semiconductor memory device according to a modification example of the fourth embodiment.
Figure 64:
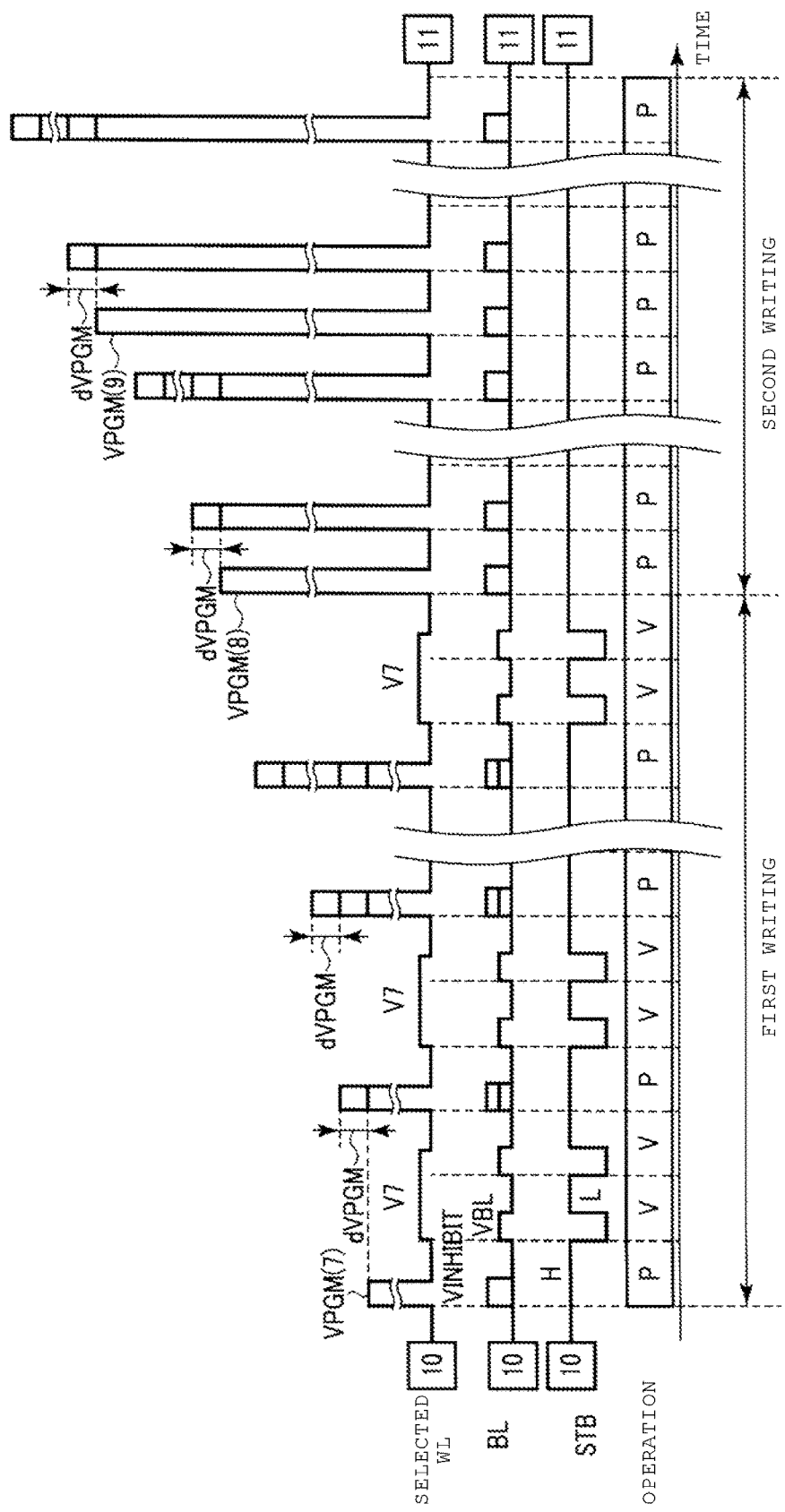
FIG. 64 is a diagram illustrating pulses during a write operation of the semiconductor memory device according to a modification example of the fourth embodiment.
Figure 65:
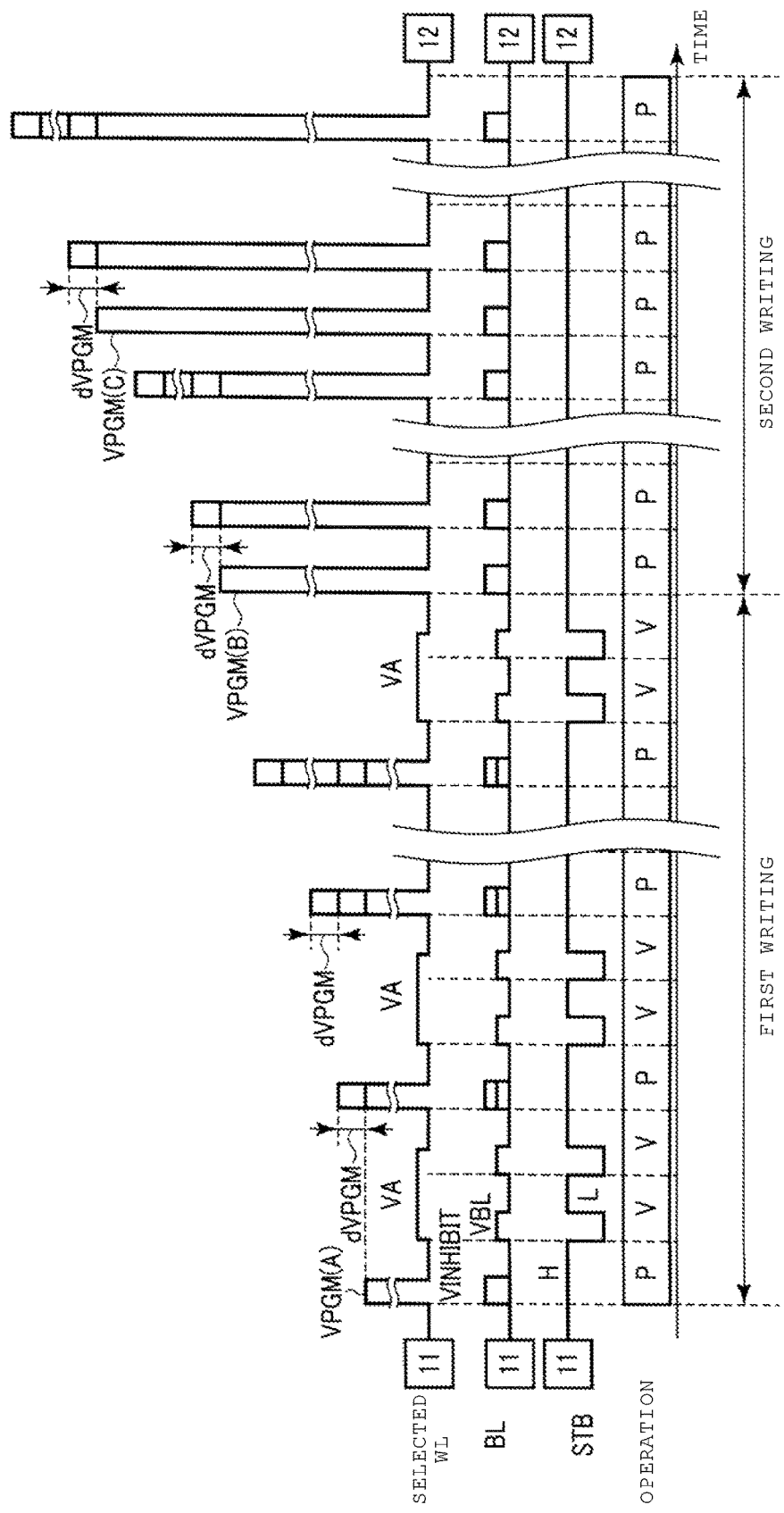
FIG. 65 is a diagram illustrating pulses during a write operation of the semiconductor memory device according to a modification example of the fourth embodiment.
Figure 66:
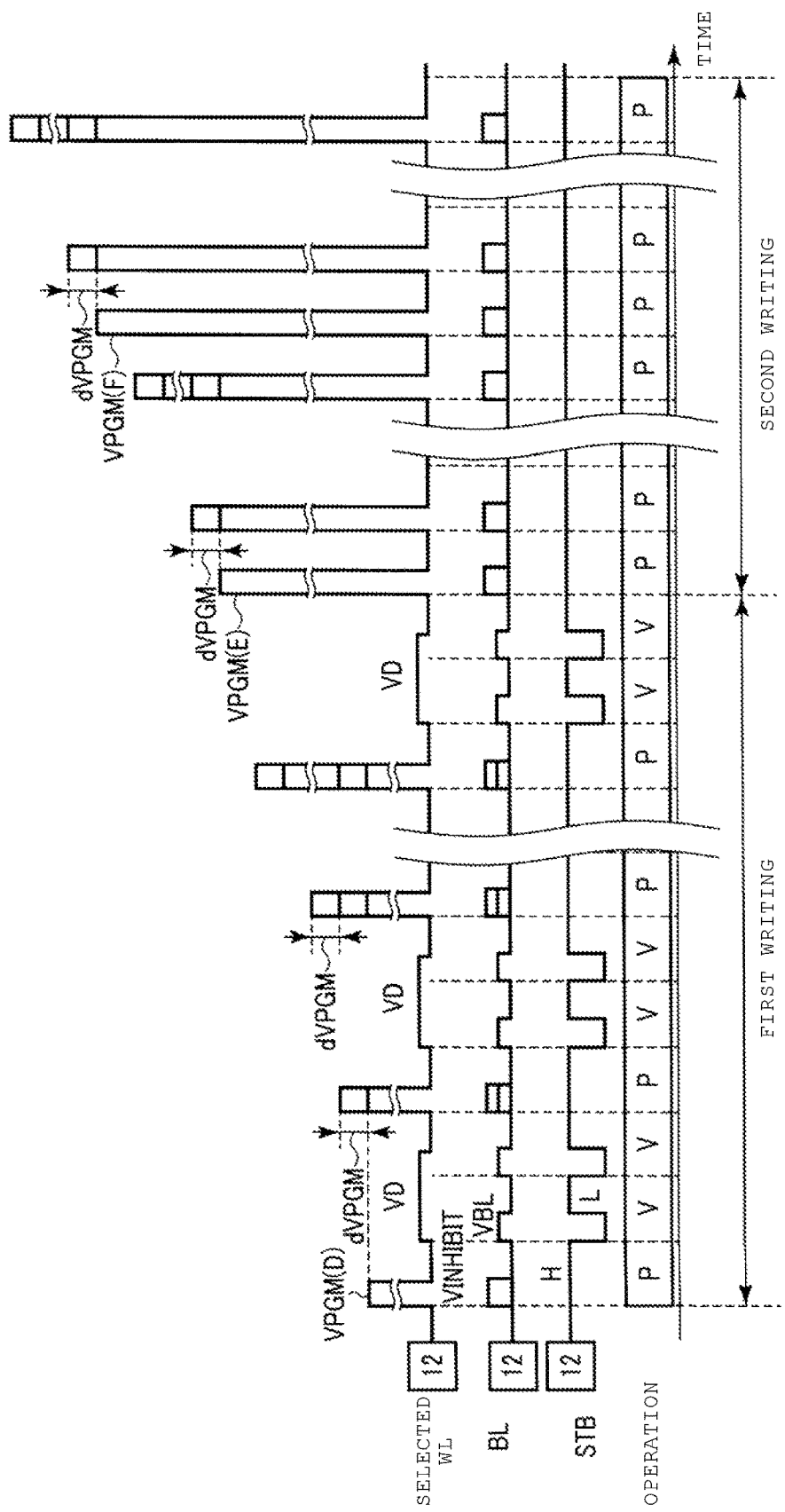
FIG. 66 is a diagram illustrating pulses during a write operation of the semiconductor memory device according to a modification example of the fourth embodiment.

As illustrated in FIG. 61, if the second writing regarding writing of the B level from the A level and writing of the C level from the B level is completed, the sequencer 111 performs the first writing regarding writing of the D level from the C level. If the first writing regarding writing of the D level from the C level is completed, the sequencer 111 performs the second writing regarding writing of the E level from the D level and writing of the F level from the E level.

The operations in FIGS. 57 to 61 are based on the operation described with reference to FIG. 45. Thus, in a case where a method of applying the first writing and the second writing is changed, pulses in a write operation of the semiconductor memory device 100 according to the fourth embodiment are also changed according to the method of applying the first writing and the second writing.

4-3. Effects

As mentioned above, in the fourth embodiment, a description has been made of a case where the memory cell transistor MT can store 16-level data, but the same effects as those in the first embodiment can be achieved.

4-4. Modification Example of Fourth Embodiment

A description will be made of a modification example of the fourth embodiment. In the modification example of the fourth embodiment, a description will be made of a case where the write operation of the fourth embodiment is applied to a semiconductor memory device employing a sense module based on a current sense method (the sense module described in the modification example of the first embodiment) as a sense module. A fundamental configuration and a fundamental operation of the semiconductor memory device 100 according to the modification example of the fourth embodiment are the same as those of the semiconductor memory device 100 according to the first embodiment, the modification example of the first embodiment, the second embodiment, the modification example of the second embodiment, the third embodiment, the modification example of the third embodiment, and the fourth embodiment. Therefore, the content described in the first embodiment, the modification example of the first embodiment, the second embodiment, the modification example of the second embodiment, the third embodiment, the modification example of the third embodiment, and the fourth embodiment, and the content which can be easily analogized from the first embodiment, the modification example of the first embodiment, the second embodiment, the modification example of the second embodiment, the third embodiment, the modification example of the third embodiment, and the fourth embodiment will not be described again.

4-4-1. Summary of Sense Amplifier Unit

A configuration and an operation of the sense amplifier unit 140 related to the modification example of the fourth embodiment are the same as those of the sense amplifier unit 140 described in the modification example of the first embodiment.

4-4-2. Operation 4-4-2-1. Operation Flow of Write Operation

The above-described sense module based on the current sense method and program verification operation described in the modification example of the first embodiment are also applicable to the operation flow described with reference to FIGS. 46 to 56. For simplification, herein, a description will be made of the content of steps S4003 to S4005 in FIG. 47, steps S4203 to S4205 in FIG. 49, steps S4403 to S4405 in FIG. 51, steps S4603 to S4605 in FIG. 53, and steps S4803 to S4805 in FIG. 55 which are different from the content described in the fourth embodiment.

Step S4003

The sequencer 111 performs a program verification operation in order to determine whether or not a write target memory cell transistor MT is included in the first to third groups. In this case, the sequencer 111 performs the program verification operation by using the voltage V1.

Step S4004

The sequencer 111 determines whether or not all write target memory cell transistors MT have passed the program verification operation.

Step S4005

If any memory cell transistors MT have not passed the program verification operation (NO in step S4004) among the write target memory cell transistors MT, the sequencer 111 determines in which group of the first to third groups the write target memory cell transistor MT is included. The sequencer 111 resets various voltages on the basis of a determined group, and performs step S4002.

Step S4203

The sequencer 111 performs a program verification operation in order to determine whether or not a write target memory cell transistor MT is included in the first to third groups. In this case, the sequencer 111 performs the program verification operation by using the voltage V4.

Step S4204

The sequencer 111 determines whether or not all write target memory cell transistors MT have passed the program verification operation.

Step S4205

If any memory cell transistors MT have not passed the program verification operation (NO in step S4204) among the write target memory cell transistors MT, the sequencer 111 determines in which group of the first to third groups the write target memory cell transistor MT is included. The sequencer 111 resets various voltages on the basis of a determined group, and performs step S4202.

Step S4403

The sequencer 111 performs a program verification operation in order to determine whether or not a write target memory cell transistor MT is included in the first to third groups. In this case, the sequencer 111 performs the program verification operation by using the voltage V7.

Step S4404

The sequencer 111 determines whether or not all write target memory cell transistors MT have passed the program verification operation.

Step S4405

If any memory cell transistors MT have not passed the program verification operation (NO in step S4404) among the write target memory cell transistors MT, the sequencer 111 determines in which group of the first to third groups the write target memory cell transistor MT is included. The sequencer 111 resets various voltages on the basis of a determined group, and performs step S4402.

Step S4603

The sequencer 111 performs a program verification operation in order to determine whether or not a write target memory cell transistor MT is included in the first to third groups. In this case, the sequencer 111 performs the program verification operation by using the voltage VA.

Step S4604

The sequencer 111 determines whether or not all write target memory cell transistors MT have passed the program verification operation.

Step S4605

If any memory cell transistors MT have not passed the program verification operation (NO in step S4604) among the write target memory cell transistors MT, the sequencer 111 determines in which group of the first to third groups the write target memory cell transistor MT is included. The sequencer 111 resets various voltages on the basis of a determined group, and performs step S4602.

Step S4803

The sequencer 111 performs a program verification operation in order to determine whether or not a write target memory cell transistor MT is included in the first to third groups. In this case, the sequencer 111 performs the program verification operation by using the voltage VD.

Step S4804

The sequencer 111 determines whether or not all write target memory cell transistors MT have passed the program verification operation.

Step S4805

If any memory cell transistors MT have not passed the program verification operation (NO in step S4804) among the write target memory cell transistors MT, the sequencer 111 determines in which group of the first to third groups the write target memory cell transistor MT is included. The sequencer 111 resets various voltages on the basis of a determined group, and performs step S4802.

The operations illustrated in FIGS. 46 to 56 are based on the operation described with reference to FIG. 45. Thus, in a case where a method of applying the first writing and the second writing is changed, an operation flow of a write operation of the semiconductor memory device 100 according to the modification example of the fourth embodiment is also changed according to the method of applying the first writing and the second writing.

4-4-2-2. Specific Example of Pulse

Next, with reference to FIGS. 62 to 66, a description will be made of a specific pulse example in a write operation of the semiconductor memory device related to the modification example of the fourth embodiment. Illustration methods in FIGS. 62 to 66 are the same as that in FIG. 23.

As illustrated in FIGS. 62 to 66, the data write method described in the fourth embodiment is also applicable to the semiconductor memory device 100 having the sense module based on the current sense method described in the modification example of the first embodiment.

4-4-3. Effects

As mentioned above, the current sense method described in the modification example of the first embodiment is applicable to the write method described in the fourth embodiment. Consequently, the same effects described in the fourth embodiment can also be achieved in the semiconductor memory device 100 employing the current sense method.

5. Fifth Embodiment

A fifth embodiment will be described. In the fourth embodiment, a description has been made of a write method of causing a threshold voltage distribution to transition from the 0 level to the 1 level, the 2 level, the 3 level, the 4 level, the 5 level, the 6 level, the 7 level, the 8 level, the 9 level, the A level, the B level, the C level, the D level, the E level, and the F level in this order. In the fifth embodiment, a description will be made of a case of employing a write method in which a threshold voltage distribution is caused to transition to any level instead of sequential transition to levels. The fundamental configuration and operation of the semiconductor memory device 100 according to the fifth embodiment are the same as those of the semiconductor memory device 100 according to the first to fourth embodiments. Therefore, the content described in the first to fourth embodiments and the content which can be easily analogized from the first to fourth embodiments will not be described.

5-1. Summary of Sense Amplifier Unit

A configuration and an operation of the sense amplifier unit 140 according to the fifth embodiment are the same as those of the sense amplifier unit 140 described in the first embodiment.

5-2. Operation 5-2-1. Summary of Write Operation

In the fifth embodiment, a description will be made of a write method (second method) in which a threshold voltage distribution is caused to transition to any level.

As an example, the sequencer 111 does not perform writing of the 1 to 3 levels in a case where a threshold voltage of the memory cell transistor MT is caused to transition to the 4 to 6 levels. The sequencer 111 does not perform writing of the 1 to 6 levels in a case where a threshold voltage of the memory cell transistor MT is caused to transition to the 7 to 9 levels. The sequencer 111 does not perform writing of the 1 to 9 levels in a case where a threshold voltage of the memory cell transistor MT is caused to transition to the A to C levels. The sequencer 111 does not perform writing of the 1 to C levels in a case where a threshold voltage of the memory cell transistor MT is caused to transition to the D to F levels.

In other words, the sequencer 111 skips a 1 level program operation to a 3 level program operation when a 4 level program operation to a 6 level program operation are performed. The sequencer 111 skips a 1 level program operation to a 6 level program operation when a 7 level program operation to a 9 level program operation are performed. The sequencer 111 skips a 1 level program operation to a 9 level program operation when an A level program operation to a C level program operation are performed. The sequencer 111 skips a 1 level program operation to a C level program operation when a D level program operation to an F level program operation is performed. A specific example of the second method is not limited thereto, and a skipped level may be selected as appropriate.

In the fifth embodiment, the first writing is applied to writing of the 1 level from the 0 level, writing of the 4 level from the 3 level, writing of the 7 level from the 6 level, writing of the A level from the 9 level, and writing of the D level from the C level. The second writing is applied to remaining writings. However, a method of applying the first writing and the second writing is not limited to the above description.

5-2-2. Operation Flow of Write Operation

Next, with reference to FIGS. 67 to 77, a description will be made of an operation flow of a write operation of the semiconductor memory device 100 according to the fifth embodiment, and an operation flow based on the operation described in 5-2-1.

Step S5000

Figure 67:
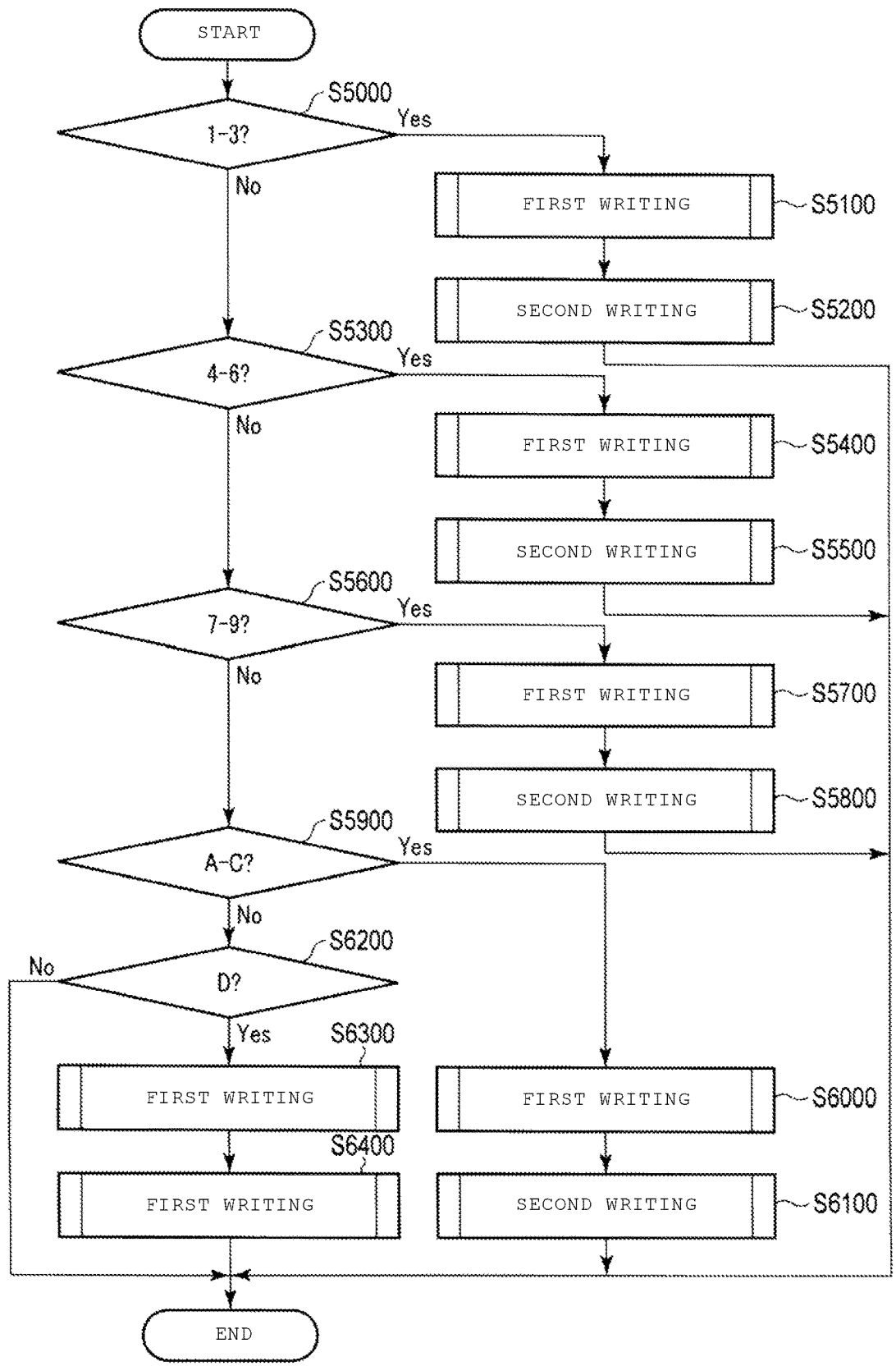
FIG. 67 is a flowchart illustrating a write operation of a semiconductor memory device according to a fifth embodiment.

As illustrated in FIG. 67, in the write operation of the fifth embodiment, the sequencer 111 determines whether or not there is a memory cell transistor MT into which data of the 1 level to the 3 level is to be written.

Step S5100 and step S5200

When there is a memory cell transistor MT into which data of the 1 level to the 3 level is to be written (YES in step S5000), the sequencer 111 performs program operations regarding the 1 level to the 3 level.

Step S5300

In the write operation of the fifth embodiment, the sequencer 111 determines whether or not there is a memory cell transistor MT into which data of the 4 level to the 6 level is to be written.

Step S5400 and Step S5500

When there is a memory cell transistor MT into which data of the 4 level to the 6 level is to be written (YES in step S5300), the sequencer 111 performs program operations regarding the 4 level to the 6 level.

Step S5600

In the write operation of the fifth embodiment, the sequencer 111 determines whether or not there is a memory cell transistor MT into which data of the 7 level to the 9 level is to be written.

Step S5700 and Step S5800

When there is a memory cell transistor MT into which data of the 7 level to the 9 level is to be written (YES in step S5600), the sequencer 111 performs program operations regarding the 7 level to the 9 level.

Step S5900

In the write operation of the fifth embodiment, the sequencer 111 determines whether or not there is a memory cell transistor MT into which data of the A level to the C level is to be written.

Step S6000 and Step S6100

When there is a memory cell transistor MT into which data of the A level to the C level is to be written (YES in step S5900), the sequencer 111 performs program operations regarding the A level to the C level.

Step S6200

In the write operation of the fifth embodiment, the sequencer 111 determines whether or not there is a memory cell transistor MT into which data of the D level to the F level is to be written.

Step S6300 and Step S6400

When there is a memory cell transistor MT into which data of the D level to the F level is to be written (YES in step S6200), the sequencer 111 performs program operations regarding the D level to the F level.

Figure 68:
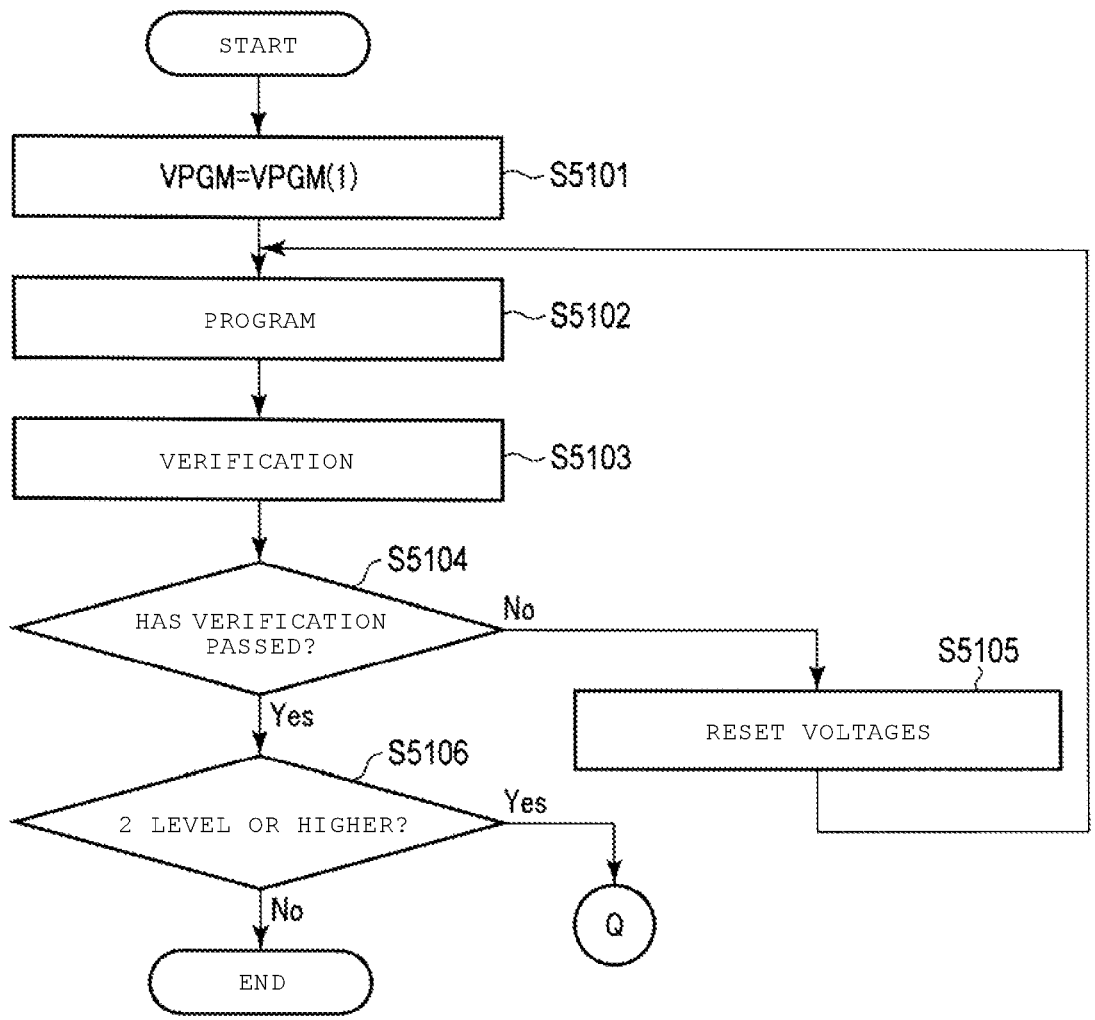
FIG. 68 is a flowchart illustrating a write operation of the semiconductor memory device according to the fifth embodiment.

With reference to FIG. 68, a description will be made of an operation flow of the first writing (step S5100) regarding writing of the 1 level from the 0 level.

Step S5101 to Step S5106

The semiconductor memory device 100 performs the same operations as those in steps S4001 to S4006.

Figure 69:
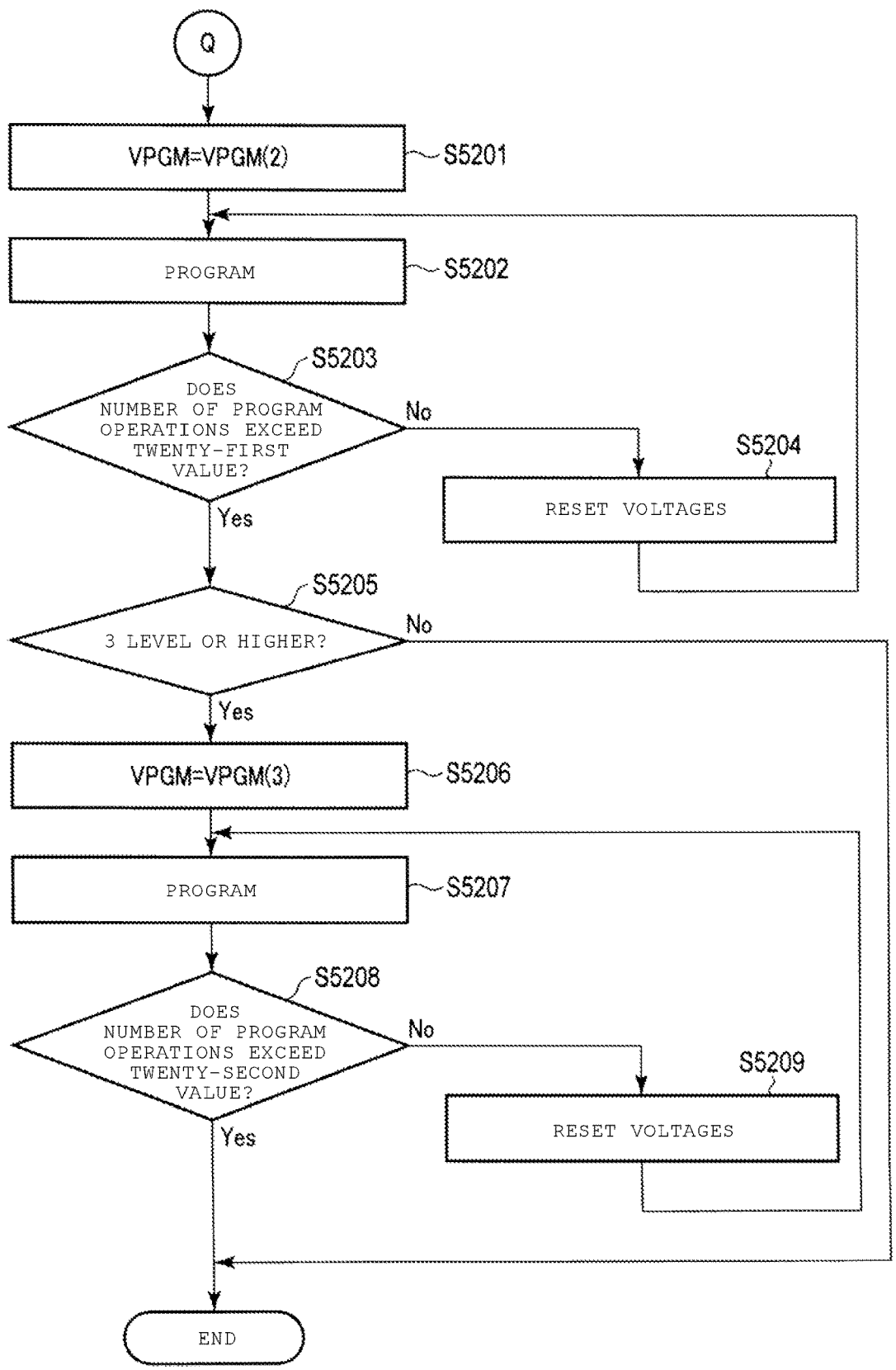
FIG. 69 is a flowchart illustrating a write operation of the semiconductor memory device according to the fifth embodiment.

With reference to FIG. 69, a description will be made of an operation flow of the first writing (step S5200) regarding writing of the 2 level from the 1 level and writing of the 3 level from the 2 level.

Step S5201 to Step S5209

The semiconductor memory device 100 performs the same operations as those in step S4101 to step S4109.

The sequencer 111 performs a determination operation by using a twenty-first value (the number of 2 level program operations) instead of the eleventh value in step S5203, and performs a determination operation by using a twenty-second value (the number of 3 level program operations) instead of the twelfth value in step S5208.

Figure 70:
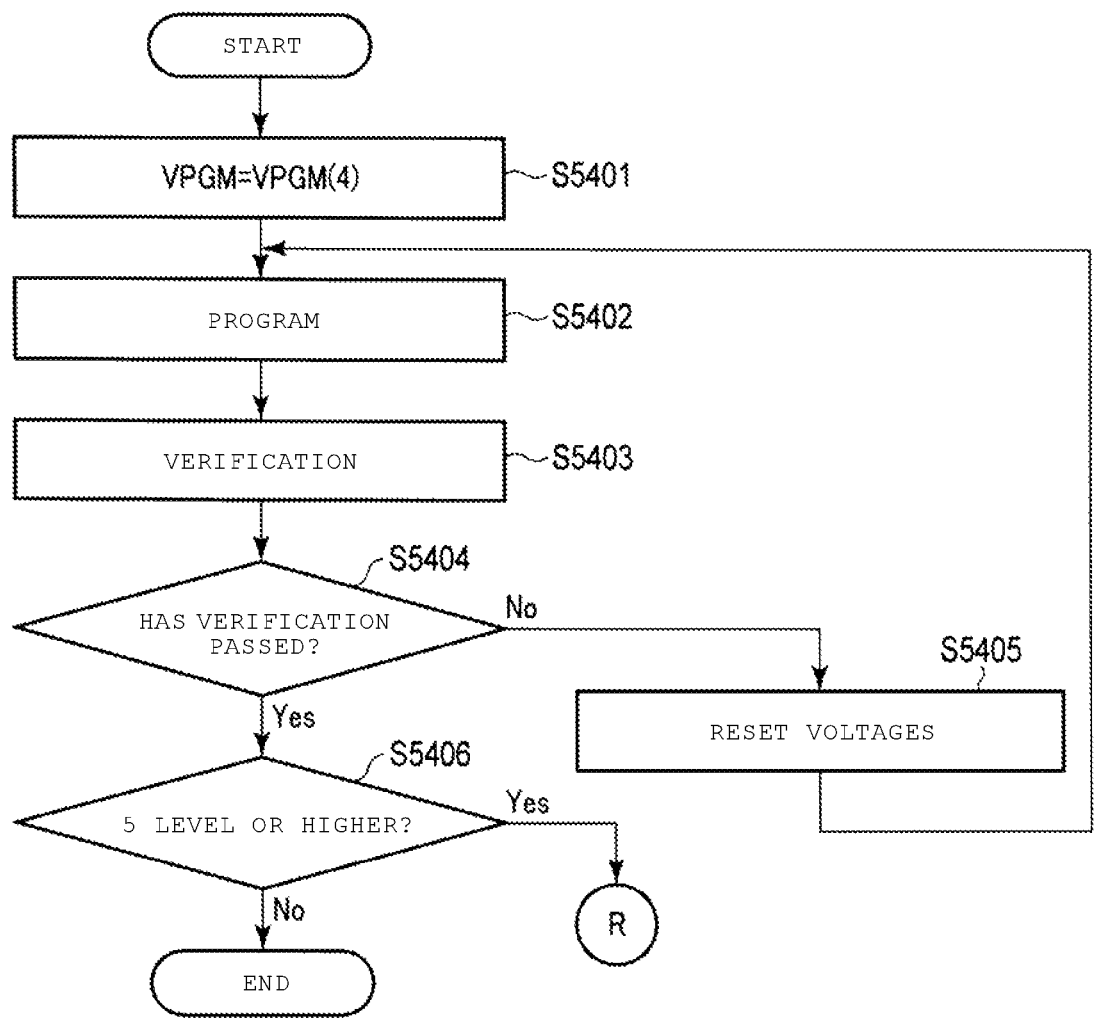
FIG. 70 is a flowchart illustrating a write operation of the semiconductor memory device according to the fifth embodiment.

With reference to FIG. 70, a description will be made of an operation flow of the first writing (step S5400) regarding writing of the 4 level from the 0 level.

Step S5401 to step S5406

The semiconductor memory device 100 performs the same operations as those in steps S4201 to S4206.

Figure 71:
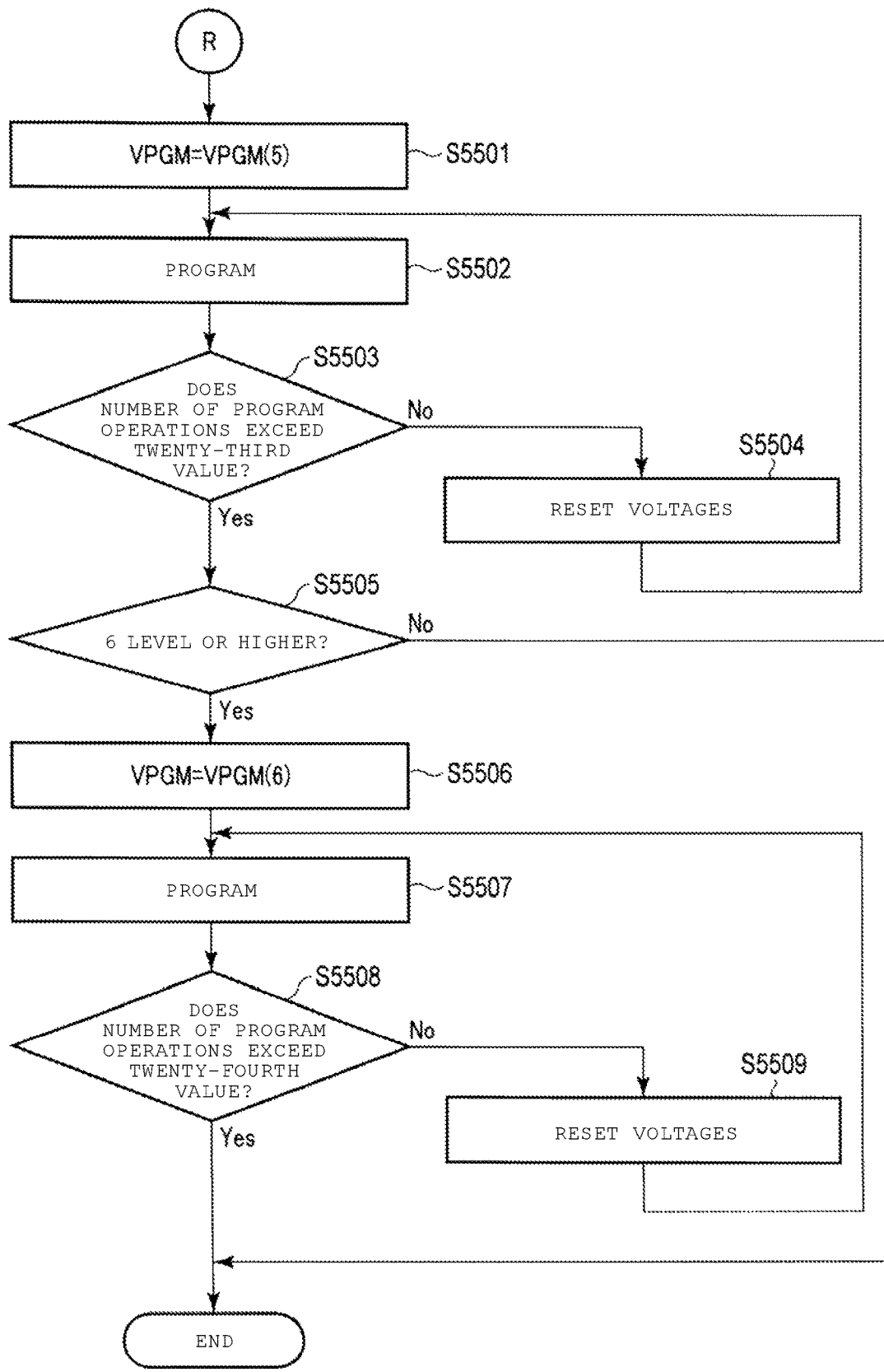
FIG. 71 is a flowchart illustrating a write operation of the semiconductor memory device according to the fifth embodiment.

With reference to FIG. 71, a description will be made of an operation flow of the first writing (step S5500) regarding writing of the 5 level from the 4 level and writing of the 6 level from the 5 level.

Step S5501 to Step S5509

The semiconductor memory device 100 performs the same operations as those in step S4301 to step S4309.

The sequencer 111 performs a determination operation by using a twenty-third value (the number of 5 level program operations) instead of the thirteenth value in step S5503, and performs a determination operation by using a twenty-fourth value (the number of 6 level program operations) instead of the fourteenth value in step S5508.

Figure 72:
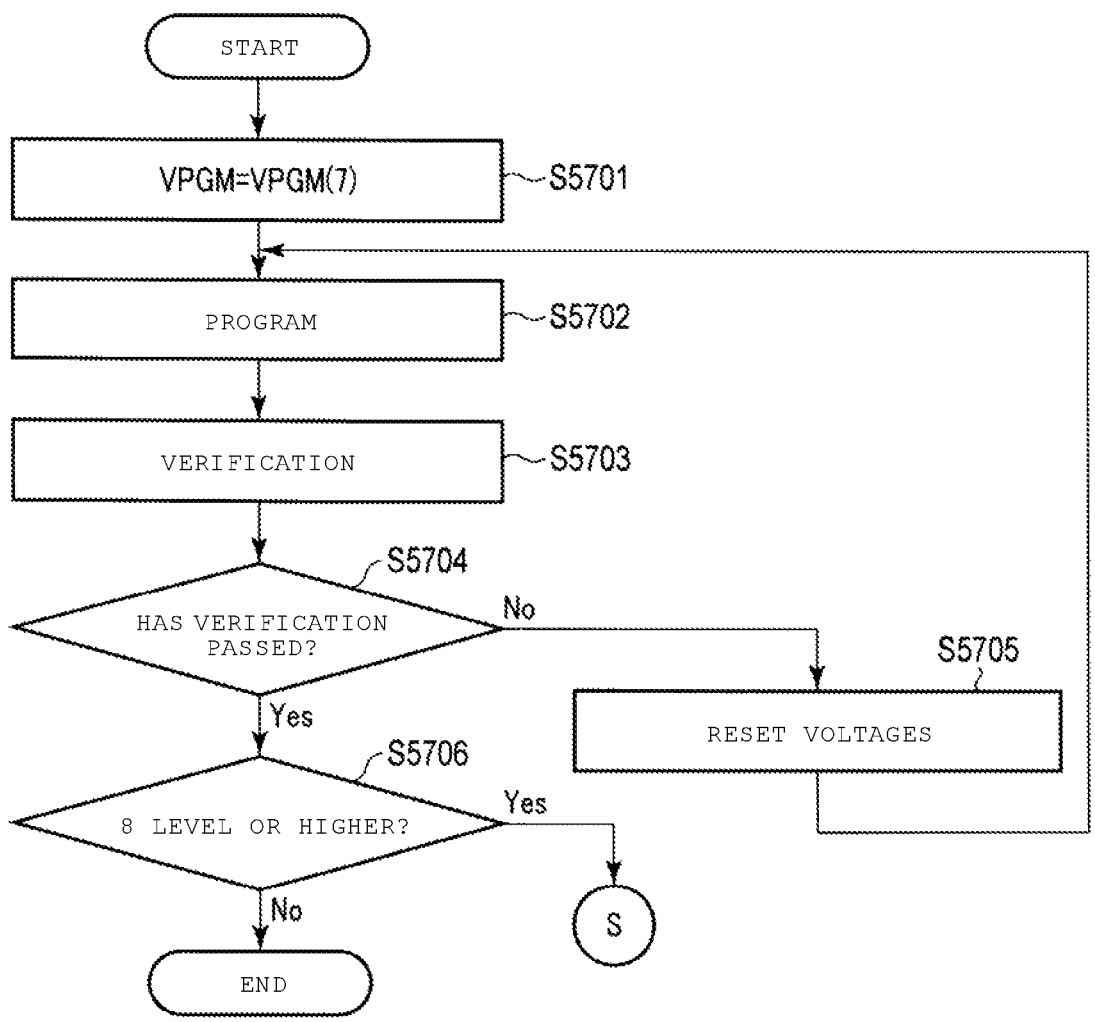
FIG. 72 is a flowchart illustrating a write operation of the semiconductor memory device according to the fifth embodiment.

With reference to FIG. 72, a description will be made of an operation flow of the first writing (step S5700) regarding writing of the 7 level from the 0 level.

Step S5701 to Step S5706

The semiconductor memory device 100 performs the same operations as those in steps S4401 to S4406.

Figure 73:
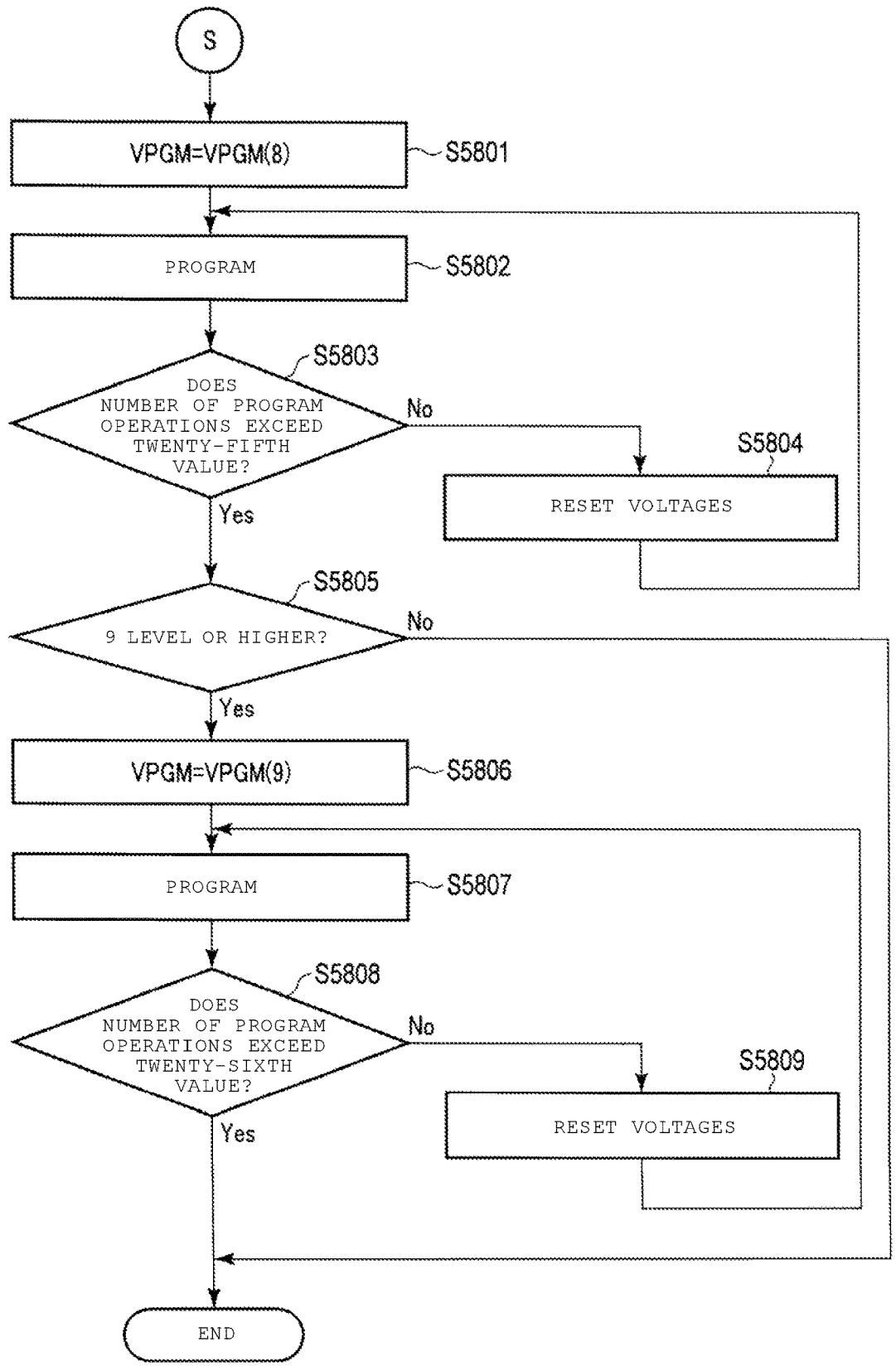
FIG. 73 is a flowchart illustrating a write operation of the semiconductor memory device according to the fifth embodiment.

With reference to FIG. 73, a description will be made of an operation flow of the first writing (step S5800) regarding writing of the 8 level from the 7 level and writing of the 9 level from the 8 level.

Step S5801 to Step S5809

The semiconductor memory device 100 performs the same operations as those in step S4501 to step S4509.

The sequencer 111 performs a determination operation by using a twenty-fifth value (the number of 8 level program operations) instead of the fifteenth value in step S5803, and performs a determination operation by using a twenty-sixth value (the number of 9 level program operations) instead of the sixteenth value in step S5808.

Figure 74:
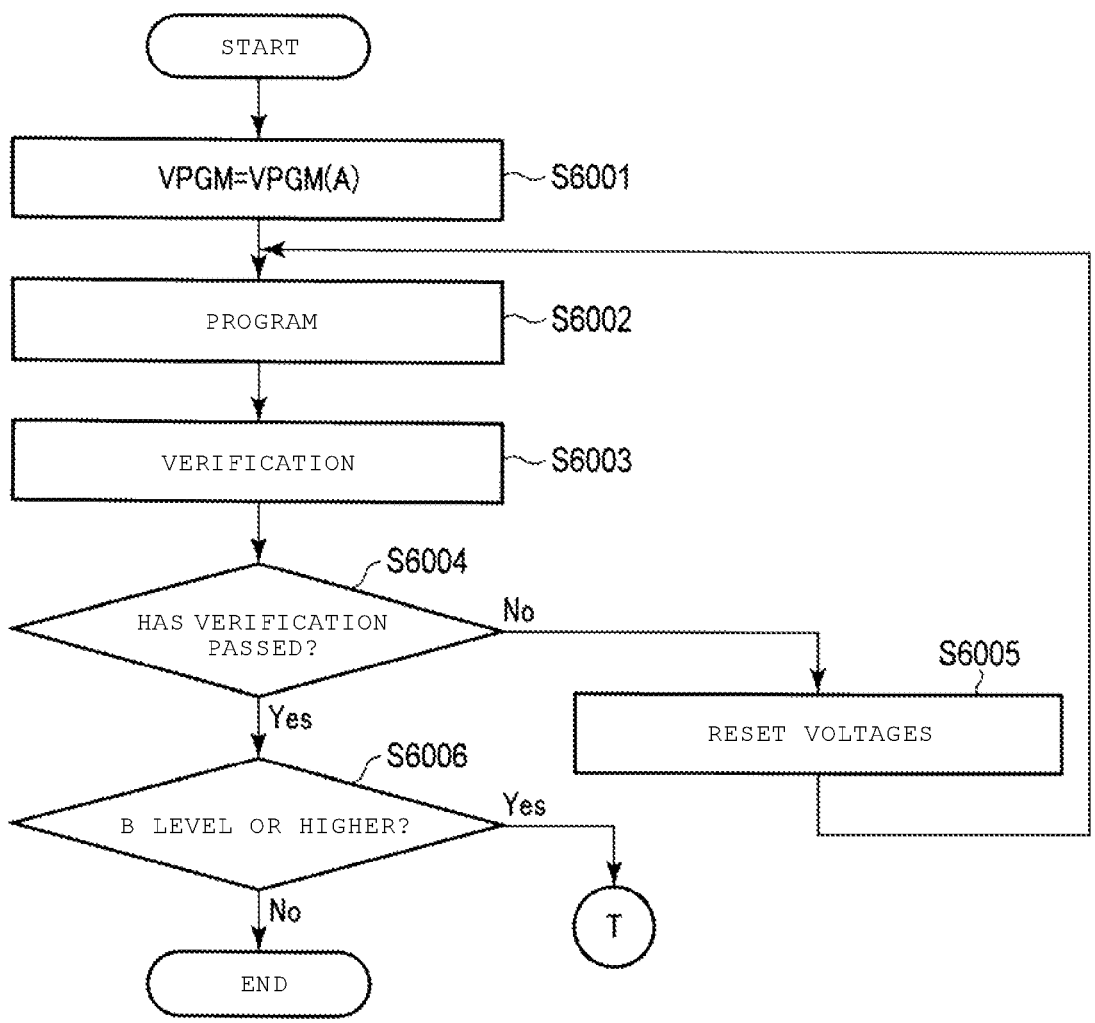
FIG. 74 is a flowchart illustrating a write operation of the semiconductor memory device according to the fifth embodiment.

With reference to FIG. 74, a description will be made of an operation flow of the first writing (step S6000) regarding writing of the A level from the 0 level.

Step S6001 to Step S6006

The semiconductor memory device 100 performs the same operations as those in steps S4601 to S4606.

Figure 75:
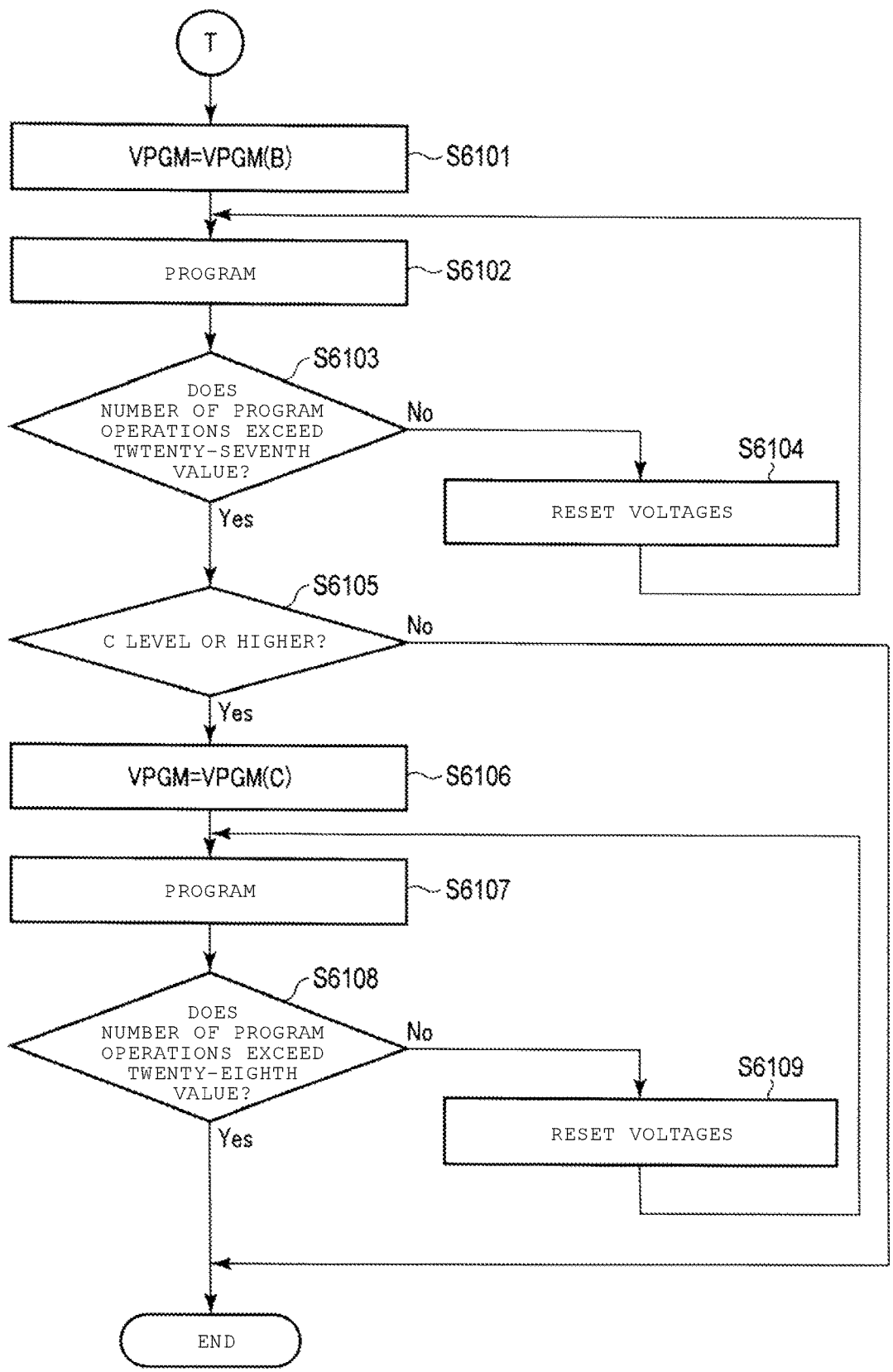
FIG. 75 is a flowchart illustrating a write operation of the semiconductor memory device according to the fifth embodiment.

With reference to FIG. 75, a description will be made of an operation flow of the first writing (step S6100) regarding writing of the B level from the A level and writing of the C level from the B level.

Step S6101 to Step S6109

The semiconductor memory device 100 performs the same operations as those in step S4701 to step S4709.

The sequencer 111 performs a determination operation by using a twenty-seventh value (the number of B level program operations) instead of the seventeenth value in step S6103, and performs a determination operation by using a twenty-eighth value (the number of C level program operations) instead of the eighteenth value in step S6108.

Figure 76:
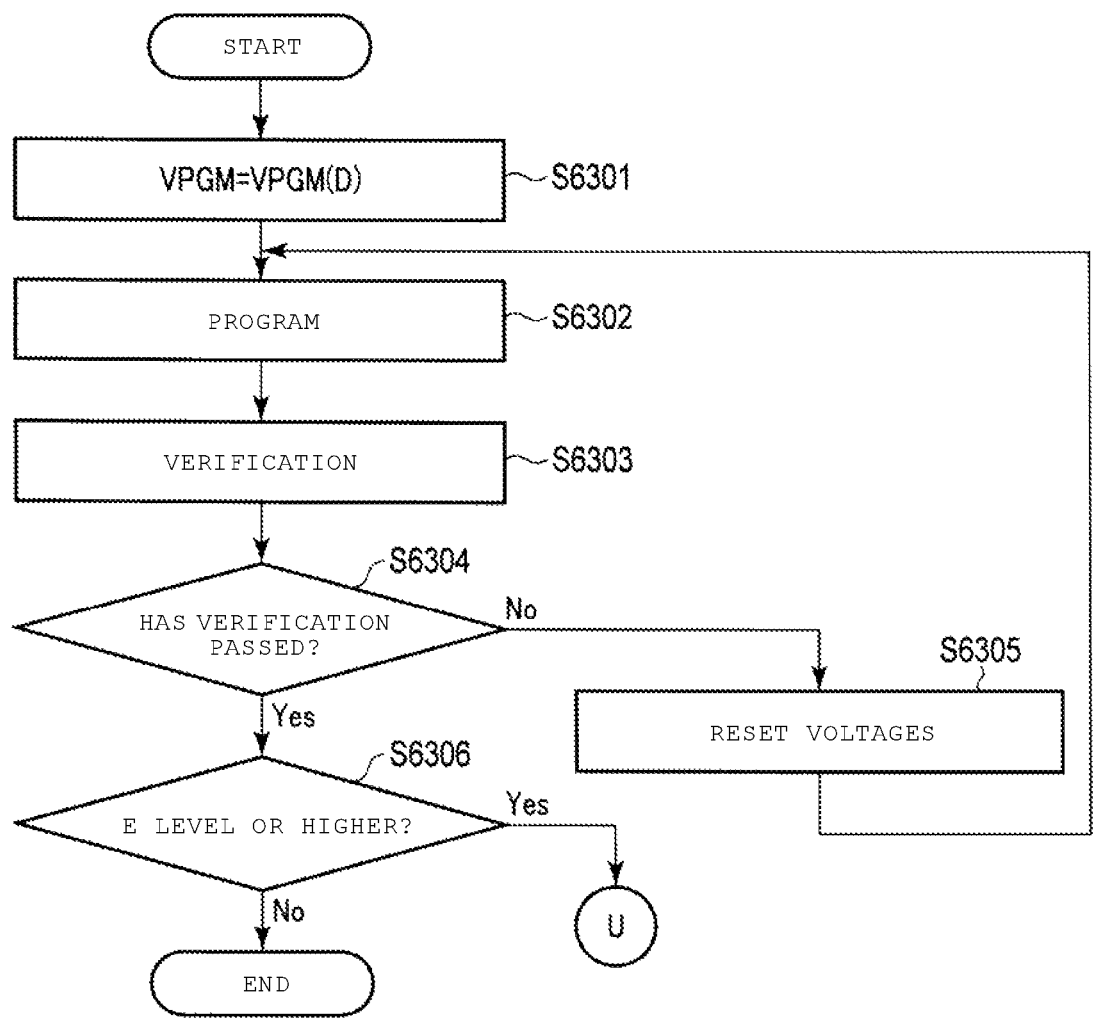
FIG. 76 is a flowchart illustrating a write operation of the semiconductor memory device according to the fifth embodiment.

With reference to FIG. 76, a description will be made of an operation flow of the first writing (step S6300) regarding writing of the D level from the 0 level.

Step S6301 to Step S6306

The semiconductor memory device 100 performs the same operations as those in steps S4801 to S4806.

Figure 77:
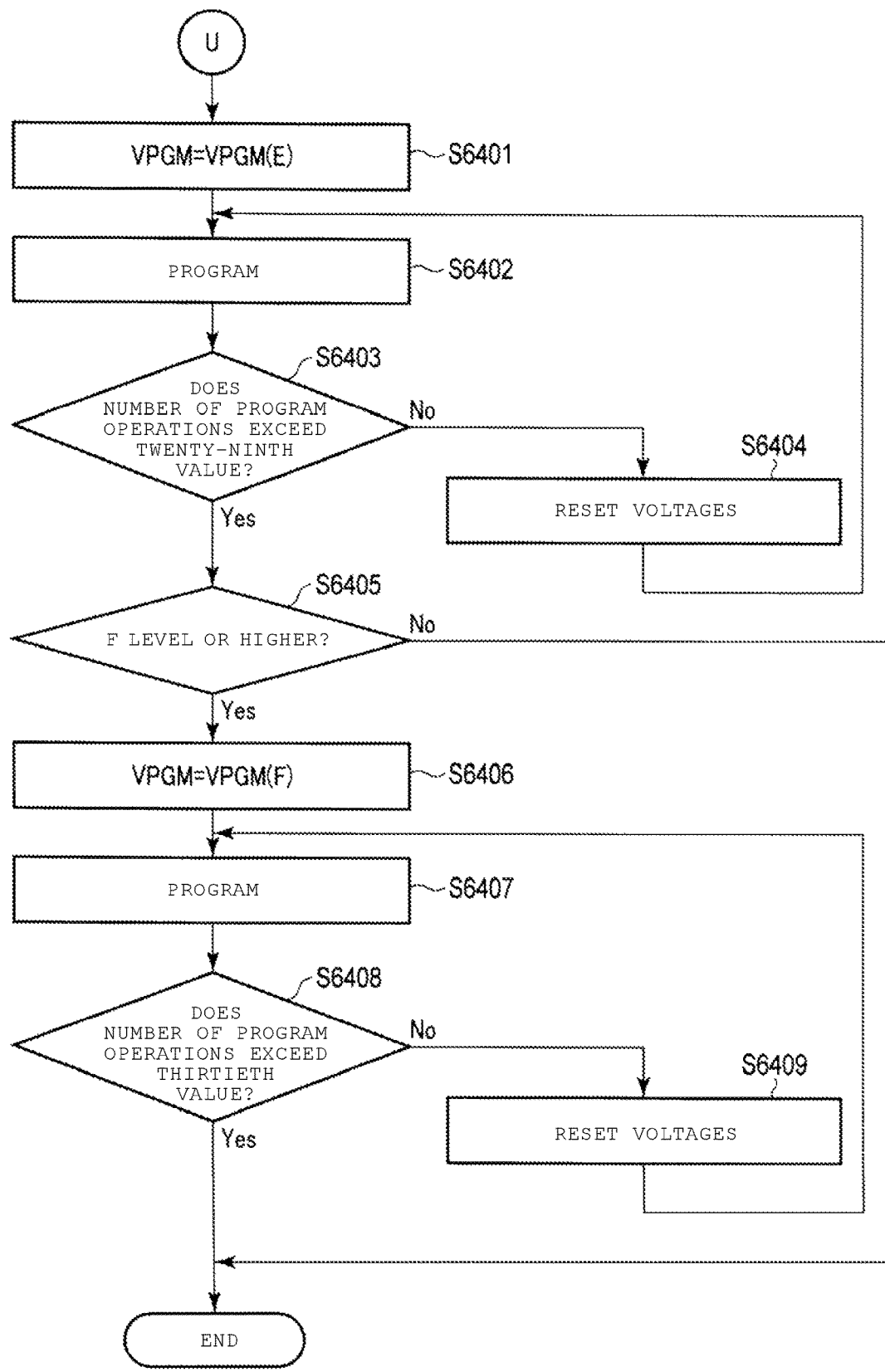
FIG. 77 is a flowchart illustrating a write operation of the semiconductor memory device according to the fifth embodiment.

With reference to FIG. 77, a description will be made of an operation flow of the first writing (step S6400) regarding writing of the E level from the D level and writing of the F level from the E level.

Step S6401 to Step S6409

The semiconductor memory device 100 performs the same operations as those in step S4901 to step S4909.

The sequencer 111 performs a determination operation by using a twenty-ninth value (the number of E level program operations) instead of the nineteenth value in step S6403, and performs a determination operation by using a thirtieth value (the number of F level program operations) instead of the twentieth value in step S6408.

Specific pulses in a write operation of the semiconductor memory device according to the fifth embodiment are the same as those in FIGS. 57 to 61 except for voltages for skipped bit lines, and thus a description thereof will be omitted.

5-3. Effects

As mentioned above, a case of using the second method as a write method is also applicable to the write method described in the fourth embodiment. Consequently, the same effects as the effects described in the fourth embodiment can also be achieved.

5-4. Modification Example of Fifth Embodiment

A description will be made of a modification example of the fifth embodiment. In the modification example of the fifth embodiment, a description will be made of a case where the write operation of the fifth embodiment is applied to a semiconductor memory device employing a sense module based on a current sense method (the sense module described in the modification example of the first embodiment) as a sense module. A fundamental configuration and a fundamental operation of the semiconductor memory device 100 according to the modification example of the fifth embodiment are the same as those of the semiconductor memory device 100 according to the first embodiment, the modification example of the first embodiment, the second embodiment, the modification example of the second embodiment, the third embodiment, the modification example of the third embodiment, the fourth embodiment, the modification example of the fourth embodiment, and the fifth embodiment. Therefore, the content described in the first embodiment, the modification example of the first embodiment, the second embodiment, the modification example of the second embodiment, the third embodiment, the modification example of the third embodiment, the fourth embodiment, the modification example of the fourth embodiment, and the fifth embodiment, and the content which can be easily analogized from the first embodiment, the modification example of the first embodiment, the second embodiment, the modification example of the second embodiment, the third embodiment, the modification example of the third embodiment, the fourth embodiment, the modification example of the fourth embodiment, and the fifth embodiment will not be described again.

5-4-1. Summary of Sense Amplifier Unit

A configuration and an operation of the sense amplifier unit 140 related to the modification example of the fifth embodiment are the same as those of the sense amplifier unit 140 described in the modification example of the first embodiment.

5-4-2. Operation 5-4-2-1. Operation Flow of Write Operation

The above-described sense module based on the current sense method and program verification operation described in the modification example of the first embodiment are also applicable to the operation flow described with reference to FIGS. 67 to 77. For simplification, herein, a description will be made of the content of steps S5103 to S5105 in FIG. 68, steps S5403 to S5405 in FIG. 70, and steps S5703 to S5705 in FIG. 70, steps S5703 to S5705 in FIG. 72, steps S6003 to S6005 in FIG. 74, and steps S6303 to S6305 in FIG. 76 which are different from the content described in the fifth embodiment.

Step S5103

The sequencer 111 performs a program verification operation in order to determine whether or not a write target memory cell transistor MT is included in the first to third groups. In this case, the sequencer 111 performs the program verification operation by using the voltage V1.

Step S5104

The sequencer 111 determines whether or not all write target memory cell transistors MT have passed the program verification operation.

Step S5105

If any memory cell transistors MT have not passed the program verification operation (NO in step S5104) among the write target memory cell transistors MT, the sequencer 111 determines in which group of the first to third groups the write target memory cell transistor MT is included. The sequencer 111 resets various voltages on the basis of a determined group, and performs step S5102.

Step S5403

The sequencer 111 performs a program verification operation in order to determine whether or not a write target memory cell transistor MT is included in the first to third groups. In this case, the sequencer 111 performs the program verification operation by using the voltage V4.

Step S5404

The sequencer 111 determines whether or not all write target memory cell transistors MT have passed the program verification operation.

Step S5405

If any memory cell transistors MT have not passed the program verification operation (NO in step S5404) among the write target memory cell transistors MT, the sequencer 111 determines in which group of the first to third groups the write target memory cell transistor MT is included. The sequencer 111 resets various voltages on the basis of a determined group, and performs step S5402.

Step S5703

The sequencer 111 performs a program verification operation in order to determine whether or not a write target memory cell transistor MT is included in the first to third groups. In this case, the sequencer 111 performs the program verification operation by using the voltage V7.

Step S5704

The sequencer 111 determines whether or not all write target memory cell transistors MT have passed the program verification operation.

Step S5705

If any memory cell transistors MT have not passed the program verification operation (NO in step S5704) among the write target memory cell transistors MT, the sequencer 111 determines in which group of the first to third groups the write target memory cell transistor MT is included. The sequencer 111 resets various voltages on the basis of a determined group, and performs step S5702.

Step S6003

The sequencer 111 performs a program verification operation in order to determine whether or not a write target memory cell transistor MT is included in the first to third groups. In this case, the sequencer 111 performs the program verification operation by using the voltage VA.

Step S6004

The sequencer 111 determines whether or not all write target memory cell transistors MT have passed the program verification operation.

Step S6005

If any memory cell transistors MT have not passed the program verification operation (NO in step S6004) among the write target memory cell transistors MT, the sequencer 111 determines in which group of the first to third groups the write target memory cell transistor MT is included. The sequencer 111 resets various voltages on the basis of a determined group, and performs step S6002.

Step S6303

The sequencer 111 performs a program verification operation in order to determine whether or not a write target memory cell transistor MT is included in the first to third groups. In this case, the sequencer 111 performs the program verification operation by using the voltage VD.

Step S6304

The sequencer 111 determines whether or not all write target memory cell transistors MT have passed the program verification operation.

Step S6305

If any memory cell transistors MT have not passed the program verification operation (NO in step S6304) among the write target memory cell transistors MT, the sequencer 111 determines in which group of the first to third groups the write target memory cell transistor MT is included. The sequencer 111 resets various voltages on the basis of a determined group, and performs step S6302.

Specific pulses in a write operation of the semiconductor memory device according to the modification example of the fifth embodiment are the same as those in FIGS. 62 to 66 except for voltages for skipped bit lines, and thus a description thereof will be omitted.

5-4-3. Effects

As mentioned above, the current sense method described in the modification example of the first embodiment is applicable to the write method described in the fifth embodiment. Consequently, the semiconductor memory device 100 employing the current sense method can also achieve the same effects described in the fifth embodiment.

6. Others

According to the embodiments, the three-dimensional stacked NAND type flash memory has been described as the memory cell array 130 as an example, but this is only an example. For example, a configuration of the memory cell array 130 is disclosed in, for example, U.S. patent application Ser. No. 12/397,711, filed on Mar. 3, 2009, entitled "SEMICONDUCTOR MEMORY DEVICE HAVING PLURALITY OF TYPES OF MEMORIES INTEGRATED ON ONE CHIP," U.S. patent application Ser. No. 13/451,185, filed on Apr. 19, 2012, entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE," U.S. patent application Ser. No. 12/405,626, filed on Mar. 17, 2009, entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT," and U.S. patent application Ser. No. 09/956,986, filed on Sep. 21, 2001, entitled "NONVOLATILE SEMICONDUCTOR MEMORY DEVICE HAVING ELEMENT ISOLATING REGION OF TRENCH TYPE AND METHOD OF MANUFACTURING THE SAME." The entire contents of these patent applications are incorporated by reference in the present application.

According to the above-described respective embodiments, the sequencer 111 receives all page data and then writes data. However, this is only an example, and, for example, each of the above-described embodiments is applicable to a memory system performing writing whenever page data is received.

In the above-described respective embodiments, a description has been made of a case where the memory cell transistor MT stores 4 to 16-level data, but, this is only an example, the embodiments are applicable to a case where the memory cell transistor MT stores 32 or higher-level data.

In the above-described respective embodiments, (1) a voltage applied to a word line which is selected in a read operation in the A level is within a range, for example, from 0 V to 0.55 V. However, the voltage is not limited to this voltage, and may be within anyone of ranges, for example, from 0.1 V to 0.24 V, from 0.21 V to 0.31 V, from 0.31 V to 0.4 V, from 0.4 V to 0.5 V, and from 0.5 V to 0.55 V.

A voltage applied to a word line which is selected in a read operation in the B level is within a range, for example, from 1.5 V to 2.3 V. However, the voltage is not limited to this voltage, and may be within anyone of ranges, for example, from 1.65 V to 1.8 V, from 1.8 V to 1.95 V, from 1.95 V to 2.1 V, and from 2.1 V to 2.3 V.

A voltage applied to a word line which is selected in a read operation in the C level is within a range, for example, from 3.0 V to 4.0 V. However, the voltage is not limited to this voltage, and may be within anyone of ranges, for example, from 3.0 V to 3.2 V, from 3.2 V to 3.4 V, from 3.4 V to 3.5 V, from 3.5 V to 3.6 V, and from 3.6 V to 4.0 V.

The period (tR) of the read operation may be any one of periods, for example, from 25 μs to 38 μs, from 38 μs to 70 μs, and from 70 μs to 80 μs.

(2) The write operation includes the program operation and the verification operation as described above. In the write operation, a voltage which is initially applied to a word line selected during the program operation is within a range, for example, 13.7 V to 14.3 V. The voltage is not limited to this voltage, and may be within anyone of ranges, for example, 13.7 V to 14.0 V, and from 14.0 V to 14.6 V.

A voltage which is initially applied to a selected word line during a write operation on odd-numbered word lines may be changed to a voltage which is initially applied to a selected word line during a write operation on even-numbered word lines.

If the program operation is of an incremental step pulse program (ISPP) type, a step-up voltage is, for example, about 0.5 V.

A voltage applied to a non-selected word line has a voltage in a range of, for example, from 6.0 V to 7.3 V. However, the voltage is not limited to this voltage, and may be a voltage in a range, for example, from 7.3 V to 8.4 V, and may be a voltage of 6.0 V or lower. An applied pass voltage may be changed depending on whether a non-selected word line is an odd-numbered word line or an even-numbered word line. The period (tProg) of the write operation may be any one of periods, for example, from 1700 μs to 1800 μs, from 1800 μs to 1900 μs, and from 1900 μs to 2000 μs. (3) In the erasure operation, a voltage which is initially applied to the well which is formed in the upper portion of the semiconductor substrate and over which the memory cells are disposed is a voltage in a range, for example, from 12 V to 13.6 V. The voltage is not limited to this voltage, and may have a voltage in any one of ranges, for example, from 13.6 V to 14.8 V, from 14.8 V to 19.0 V, from 19.0 V to 19.8 V, and from 19.8 V to 21 V. The period (tErase) of the erasure operation may be any one of periods, for example, from 3000 μs to 4000 μs, from 4000 μs to 5000 μs, and from 4000 μs to 9000 μs. (4) The memory cell transistor structure includes the charge storage layer which is disposed on the semiconductor substrate (a silicon substrate) via a tunnel insulating film with a film thickness of 4 nm to 10 nm. The charge storage layer may have a stacked structure of an insulating film such as SiN or SiON with a film thickness of 2 nm to 3 nm and polysilicon with a film thickness of 3 nm to 8 nm. A metal such as Ru may be added to polysilicon. An insulating film is provided on the charge storage layer. This insulating film has, for example, a silicon oxide film with a film thickness of 4 nm to 10 nm, interposed between a lower-layer high-k film with a thickness of 3 nm to 10 nm and an upper-layer high-k film with a thickness of 3 nm to 10 nm. The high-k film may be HfO, or the like. A thickness of the silicon oxide film may be larger than a film thickness of the high-k film. A control electrode with a film thickness of 30 nm to 70 nm is formed on the insulating film via a work function adjusting material with a film thickness of 3 nm to 10 nm. The work function adjusting material is a metal oxide film such as TaO, or a metal nitride film such as TaN. Tungsten (W) or the like may be used for the control electrode.

An air gap may be formed between the memory cells transistors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cell transistors;
   a word line that is connected to the plurality of memory cell transistors;
   a plurality of bit lines that are respectively connected to the plurality of memory cell transistors; and
   a control circuit configured to carry out a write operation on the memory cell transistors connected to the word line by performing, in sequence, a first loop of operations, including a first program operation followed by at least one verification operation, that are carried out until all memory cell transistors targeted by the first program operation have passed the at least one verification operation, a second loop of operations, including a second program operation and no verification operation, that are carried out for a fixed number of loops and a third loop of operations, including a third program operation and no verification operation, that are carried out for a fixed number of loops.

2. The device according to claim 1, wherein the at least one verification operation is a single verification operation that is performed using a current sensing method.

3. The device according to claim 1, wherein the at least one verification operation includes a first verification operation during which a first voltage is applied to the word line and a second verification operation during which a second voltage that is higher than the first voltage is applied to the word line.

4. The device according to claim 3, wherein
during a program operation when the first loop of operations is repeated, a first bit line voltage is applied to a first bit line that is connected to a targeted memory cell transistor that failed the first verification operation, a second bit line voltage higher than the first bit line voltage is applied to a second bit line that is connected to a targeted memory cell transistor that failed the second verification operation, and a third bit line voltage higher than the second bit line voltage is applied to a third bit line that is connected to a targeted memory cell transistor that passed the first and second verification operations.

5. The device according to claim 1, wherein the control circuit is configured to program the memory cell transistors to one of four levels, and a target level for the first program operation is the second lowest of the four levels.

6. The device according to claim 1, wherein the control circuit is configured to program the memory cell transistors to one of eight levels, and a target level for the first program operation is the fifth lowest of the eight levels.

7. The device according to claim 6, wherein a memory cell transistor having a target level that is the fifth lowest of the eight levels or higher is programmed to the first through the fourth lowest levels before being programmed to the fifth lowest level.

8. The device according to claim 6, wherein a memory cell transistor having a target level that is the fifth lowest of the eight levels or higher is programmed to the fifth lowest level without first being programmed to the first through the fourth lowest levels.

9. The device according to claim 8, wherein none of the memory cells transistors connected to the word line has a target level that is either the second lowest level or the third lowest level.

10. The device according to claim 1, wherein the control circuit is configured to program the memory cell transistors to one of sixteen levels, and a target level for the first program operation is the tenth lowest of the sixteen levels.

11. The device according to claim 9, wherein a memory cell transistor having a target level that is the tenth lowest of the sixteen levels or higher is programmed to the first through the ninth lowest levels before being programmed to the tenth lowest level.

12. The device according to claim 9, wherein a memory cell transistor having a target level that is the tenth lowest of the sixteen levels or higher is programmed to the tenth lowest level without first being programmed to the first through the ninth lowest levels.

13. The device according to claim 12, wherein none of the memory cells transistors connected to the word line has a target level that is any one of the second lowest to the ninth lowest level.

14. A method of carrying out a write operation in a semiconductor memory device including a plurality of memory cell transistors, a word line that is connected to the plurality of memory cell transistors, and a plurality of bit lines that are respectively connected to the plurality of memory cell transistors, said method comprising:
performing, in sequence, a first loop of operations, including a first program operation followed by at least one verification operation, that are carried out until all memory cell transistors targeted by the first program operation have passed the at least one verification operation, a second loop of operations, including a second program operation and no verification operation, that are carried out for a fixed number of loops and a third loop of operations, including a third program operation and no verification operation, that are carried out for a fixed number of loops.

15. The method according to claim 14, wherein the at least one verification operation is a single verification operation that is performed using a current sensing method.

16. The method according to claim 14, wherein the at least one verification operation includes a first verification operation during which a first voltage is applied to the word line and a second verification operation during which a second voltage that is higher than the first voltage is applied to the word line.

17. The method according to claim 16, wherein
during a program operation when the first loop of operations is repeated, a first bit line voltage is applied to a first bit line that is connected to a targeted memory cell transistor that failed the first verification operation, a second bit line voltage higher than the first bit line voltage is applied to a second bit line that is connected to a targeted memory cell transistor that failed the second verification operation, and a third bit line voltage higher than the second bit line voltage is applied to a third bit line that is connected to a targeted memory cell transistor that passed the first and second verification operations.

18. The method according to claim 14, wherein a control circuit of the semiconductor memory device is configured to program the memory cell transistors to one of four levels, and a target level for the first program operation is the second lowest of four levels.

19. The method according to claim 14, wherein a control circuit of the semiconductor memory device is configured to program the memory cell transistors to one of eight levels, and a target level for the first program operation is the fifth lowest of four levels.

20. The method according to claim 14, wherein a control circuit of the semiconductor memory device is configured to program the memory cell transistors to one of sixteen levels, and a target level for the first program operation is the tenth lowest of four levels.

* * * * *